(12) United States Patent
Iguchi

(10) Patent No.: US 9,219,145 B2
(45) Date of Patent: Dec. 22, 2015

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventor: Souichirou Iguchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 154 days.

(21) Appl. No.: 13/783,331

(22) Filed: Mar. 3, 2013

(65) Prior Publication Data

US 2013/0256791 A1 Oct. 3, 2013

(30) Foreign Application Priority Data

Mar. 27, 2012 (JP) ................................ 2012-071527

(51) Int. Cl.
*H01L 29/78* (2006.01)
*H01L 29/66* (2006.01)
*H01L 27/092* (2006.01)
*H01L 21/8234* (2006.01)

(52) U.S. Cl.
CPC ........ *H01L 29/7813* (2013.01); *H01L 27/0922* (2013.01); *H01L 29/66734* (2013.01); *H01L 29/7834* (2013.01); *H01L 21/823418* (2013.01); *H01L 21/823456* (2013.01)

(58) Field of Classification Search
CPC .................... H01L 29/7813; H01L 29/66734
USPC .......................................... 257/331; 438/270
See application file for complete search history.

(56) References Cited

U.S. PATENT DOCUMENTS

| | | | |
|---|---|---|---|
| 5,783,491 A | 7/1998 | Nakamura et al. | |
| 6,118,149 A | 9/2000 | Nakagawa et al. | |
| 6,469,349 B2 | 10/2002 | Murakami | |
| 6,989,597 B2 | 1/2006 | Fujino et al. | |
| 7,671,408 B2 * | 3/2010 | Denison | 257/330 |
| 8,053,820 B2 | 11/2011 | Hashitani | |

(Continued)

FOREIGN PATENT DOCUMENTS

| | | |
|---|---|---|
| JP | 07-263692 A | 10/1995 |
| JP | 11-103058 A | 4/1999 |

(Continued)

OTHER PUBLICATIONS

Office Action for related Japanese Application No. 2012-071527, mailed Dec. 2, 2014 (citing Foreign Patent Documents 1-6).

*Primary Examiner* — Matthew W Such
*Assistant Examiner* — Warren H Kilpatrick
(74) *Attorney, Agent, or Firm* — Miles & Stockbridge P.C.

(57) ABSTRACT

To satisfy both suppression of rise in contact resistance and improvement of breakdown voltage near the end part of a trench part. The trench part GT is provided between a source offset region and a drain offset region at least in plan view in a semiconductor layer, and is provided in a source-drain direction from the source offset region toward the drain offset region in plan view. A gate insulating film GI covers the side surface and the bottom surface of the trench part GT. A gate electrode is provided in the trench part at least in plan view, and contacts the gate insulating film GI. A contact GC contacts the gate electrode GE. The contact GC is disposed, shifted in a first direction perpendicular to the source-drain direction relative to the centerline in the trench part GT extending in the source-drain direction in plan view, and is provided in the trench part GT in plan view.

19 Claims, 45 Drawing Sheets

(56) References Cited

U.S. PATENT DOCUMENTS

| | | | |
|---|---|---|---|
| 8,476,701 B2 | 7/2013 | Ueda et al. | |
| 2005/0001265 A1 | 1/2005 | Shiraki et al. | |
| 2009/0065856 A1* | 3/2009 | Oyu et al. | 257/329 |
| 2011/0284951 A1* | 11/2011 | Ueda et al. | 257/330 |
| 2012/0037984 A1* | 2/2012 | Yu | 257/335 |

FOREIGN PATENT DOCUMENTS

| | | |
|---|---|---|
| JP | 2002-026311 A | 1/2002 |
| JP | 2004-158846 A | 6/2004 |
| JP | 2005-026664 A | 1/2005 |
| JP | 2005-332978 A | 12/2005 |
| JP | 2009-206144 A | 9/2009 |
| JP | 2009-252924 A | 10/2009 |
| JP | 2012-004541 A | 1/2012 |

* cited by examiner

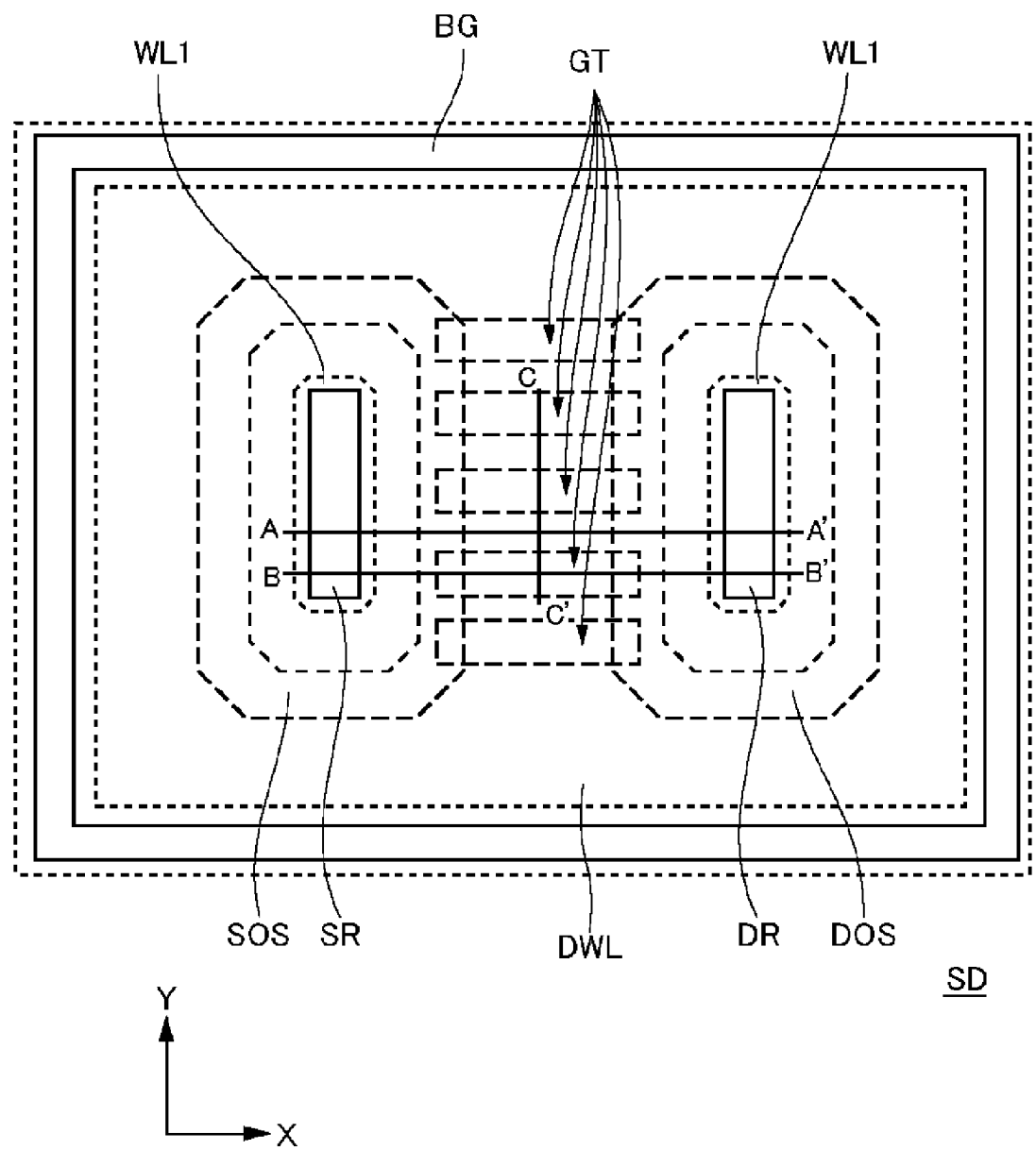

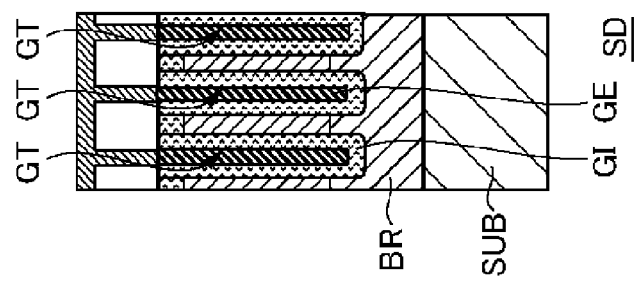
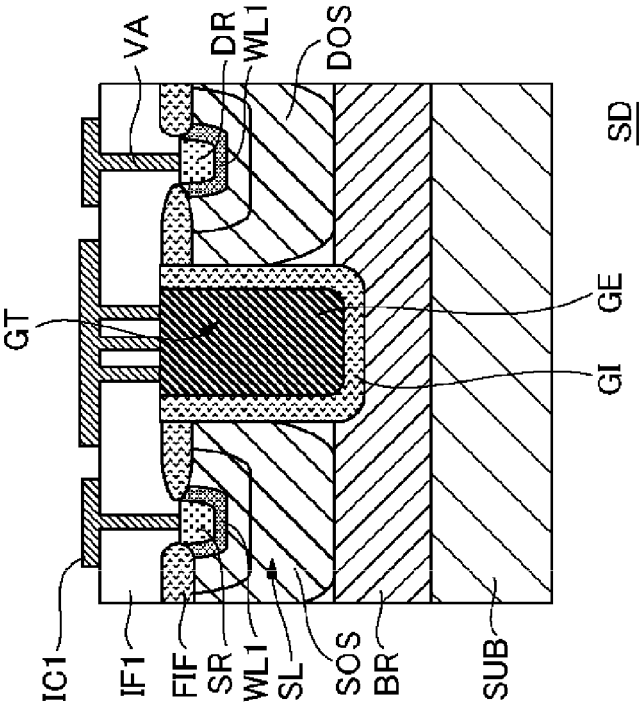
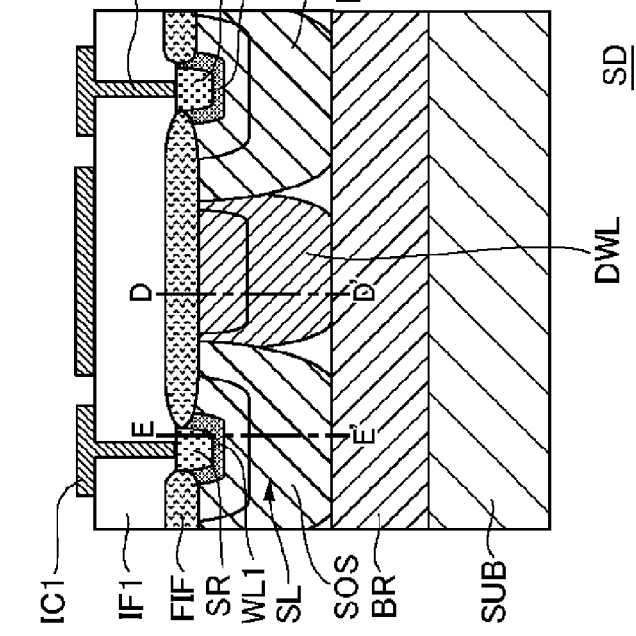

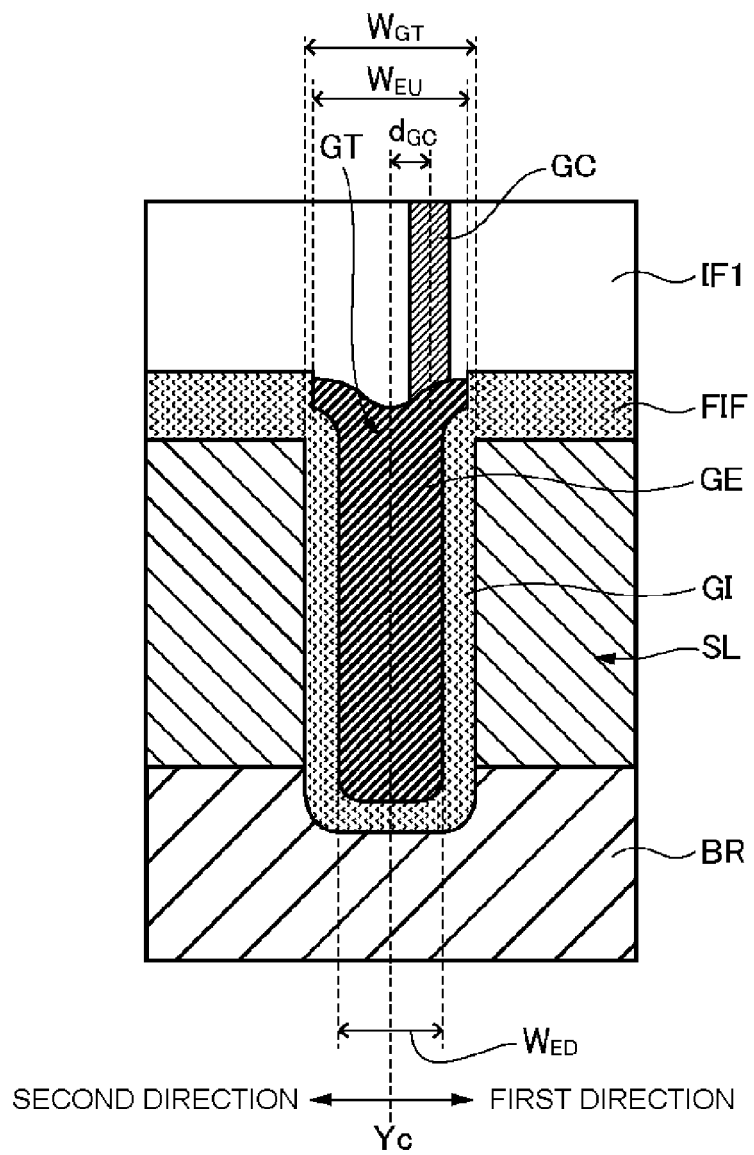

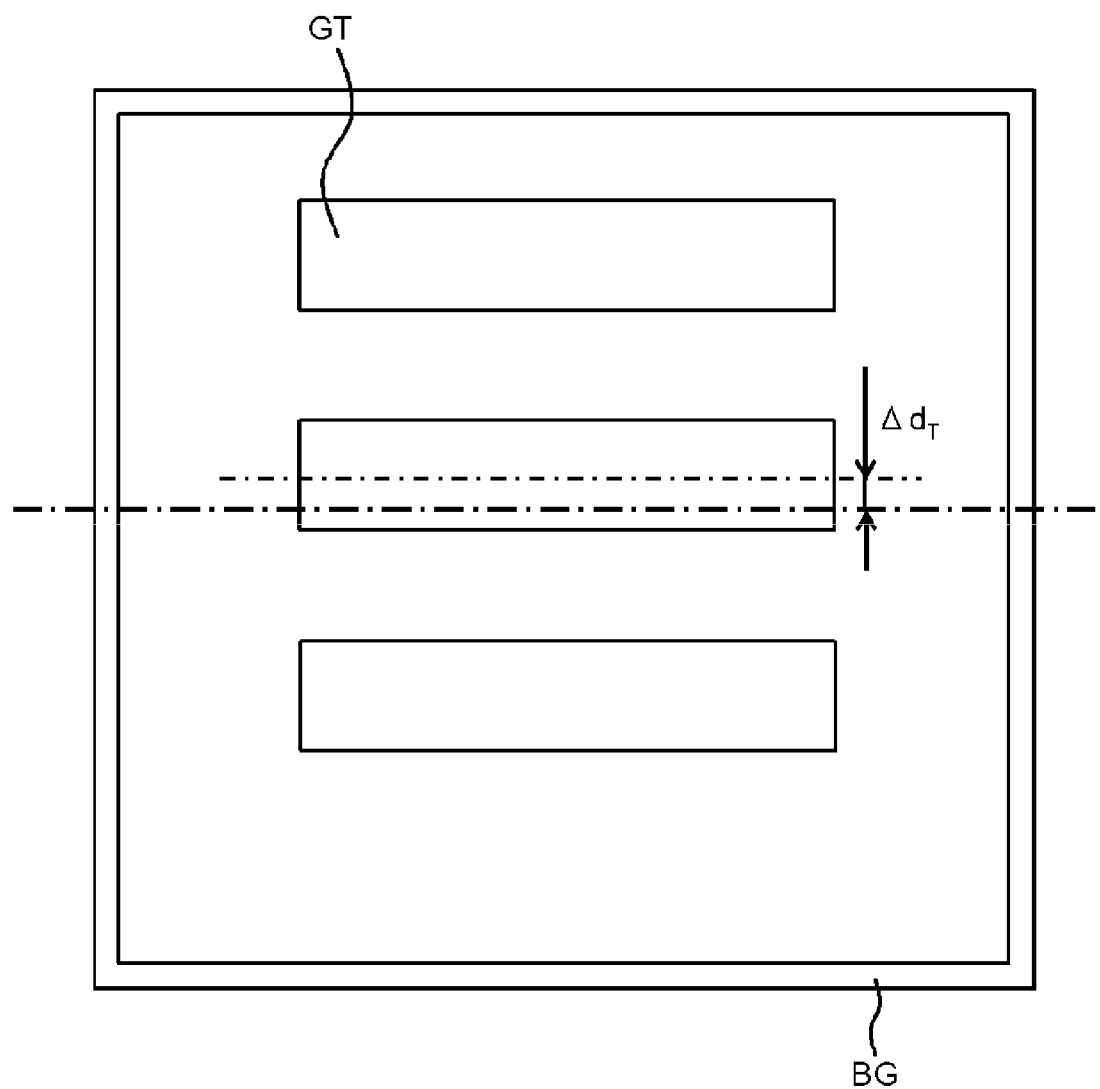

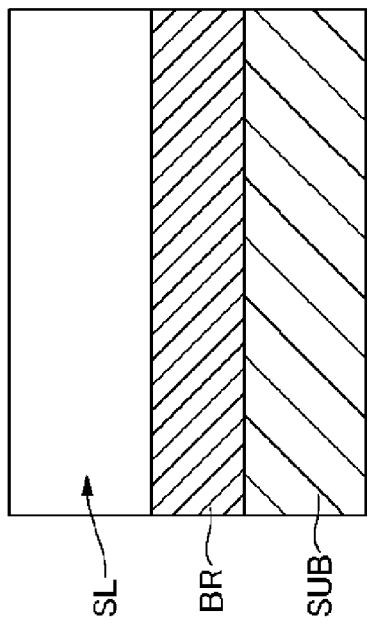
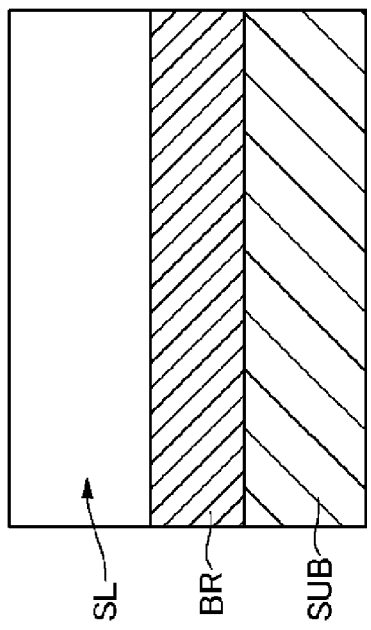
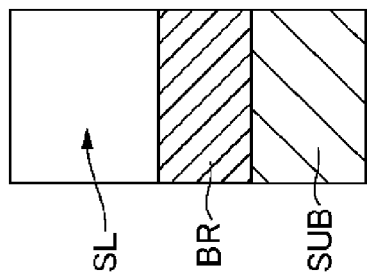

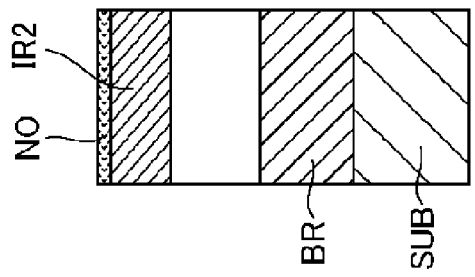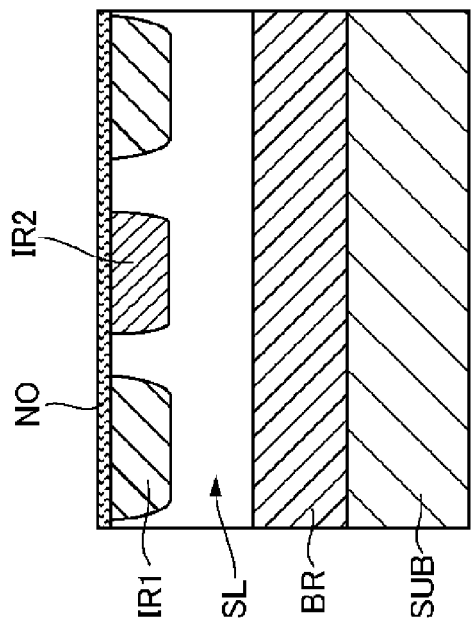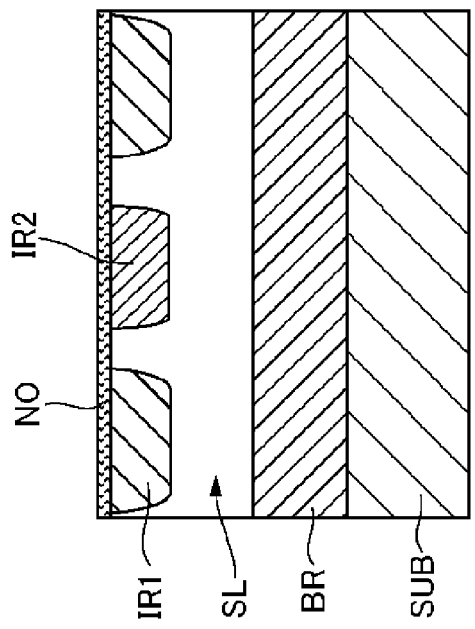

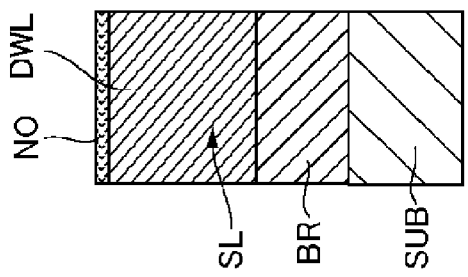
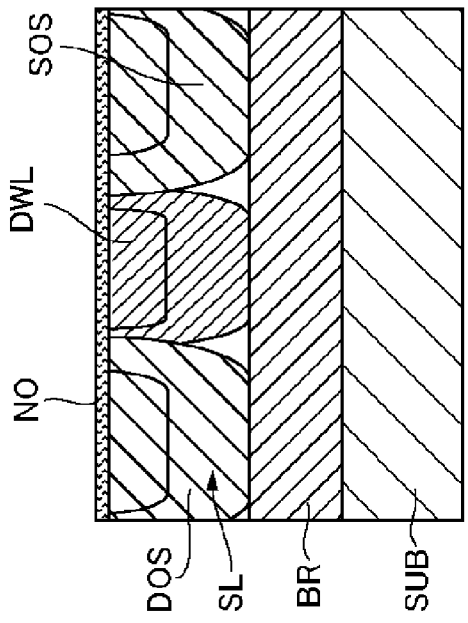
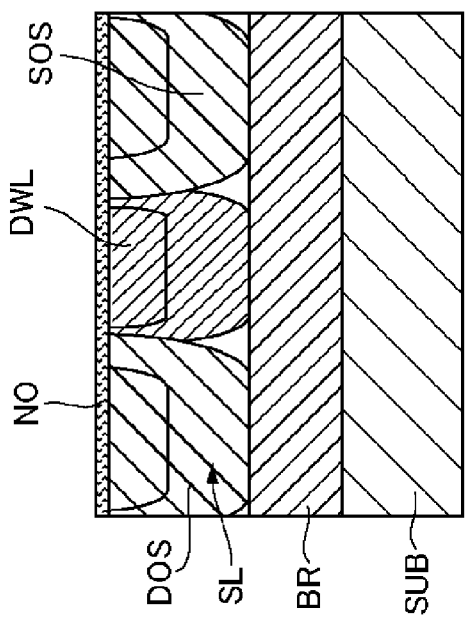

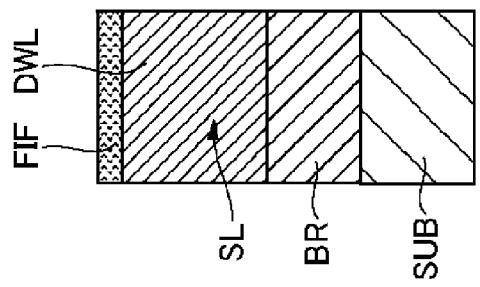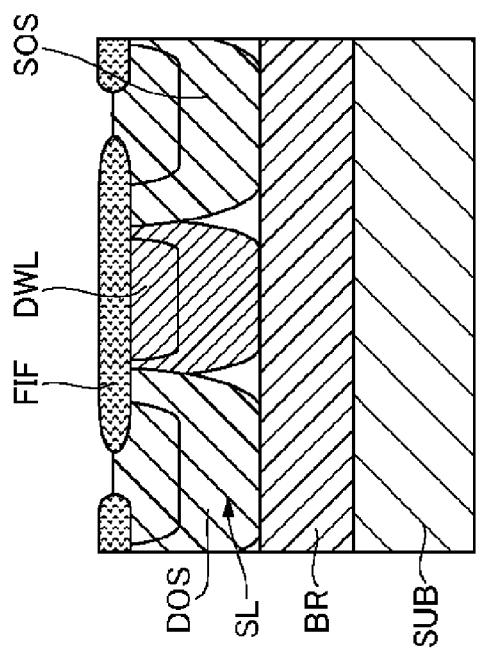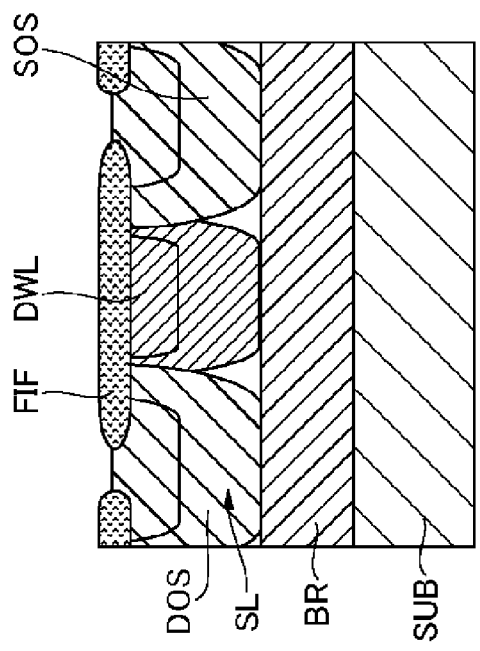

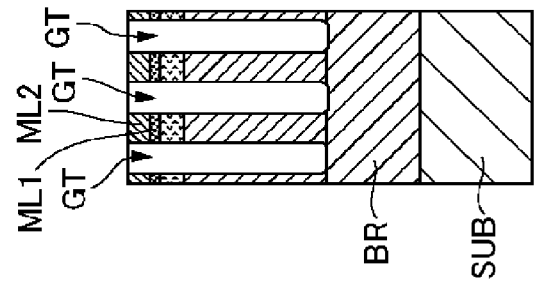
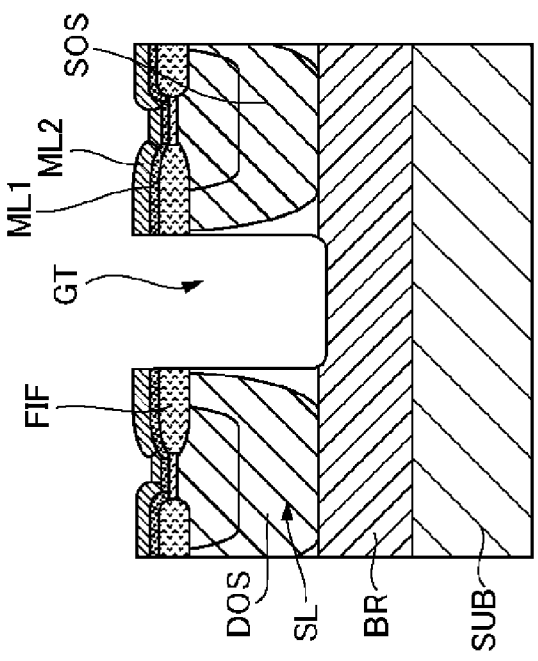
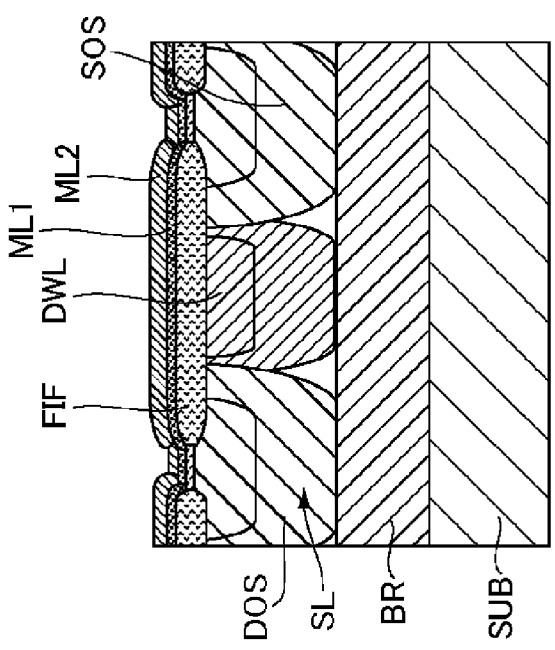

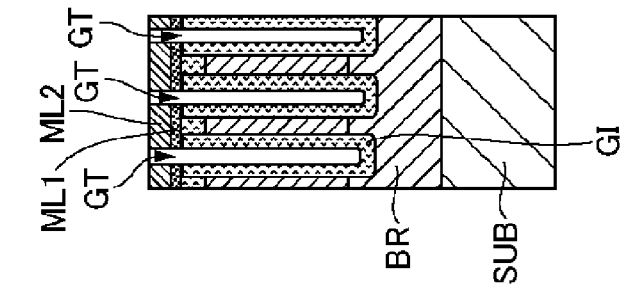
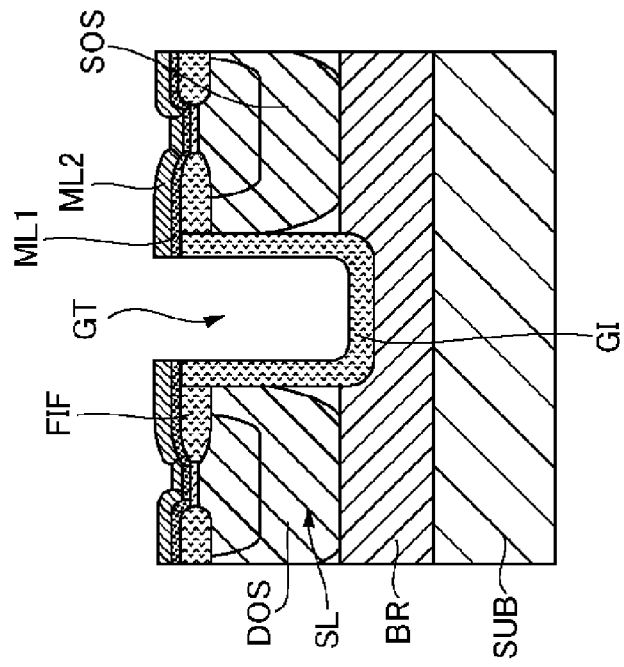
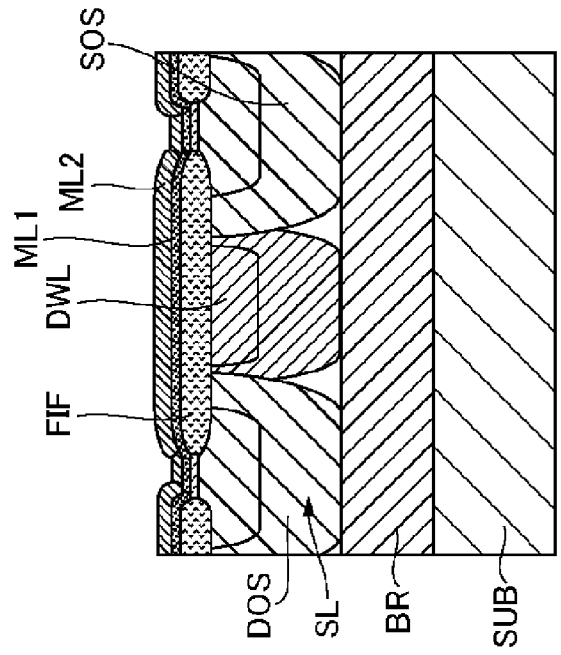

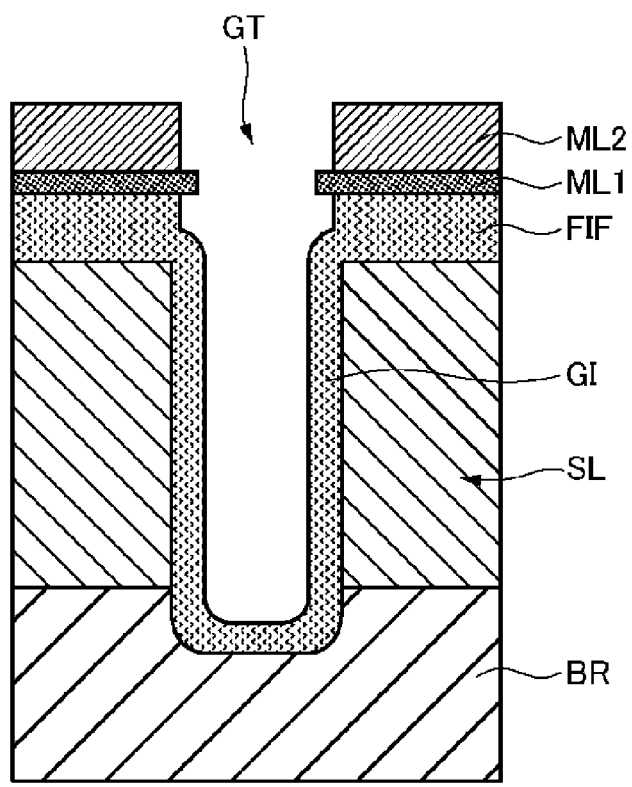

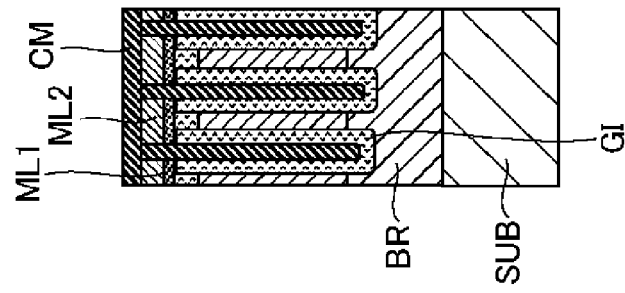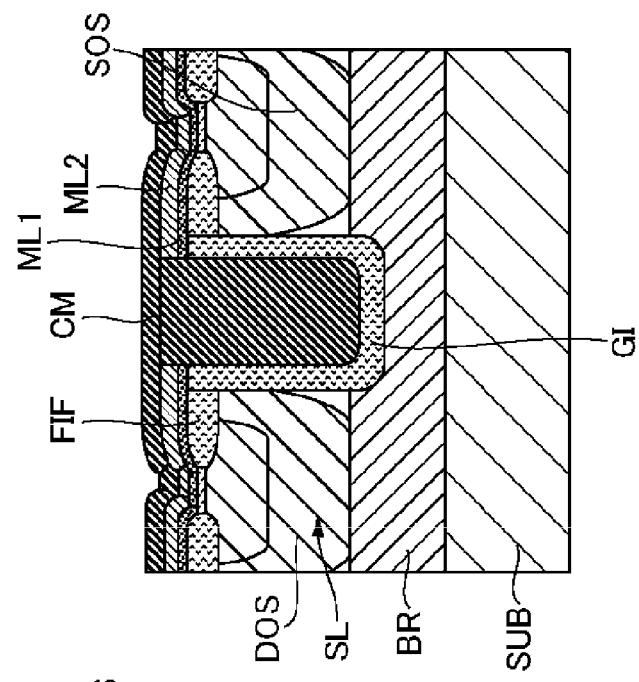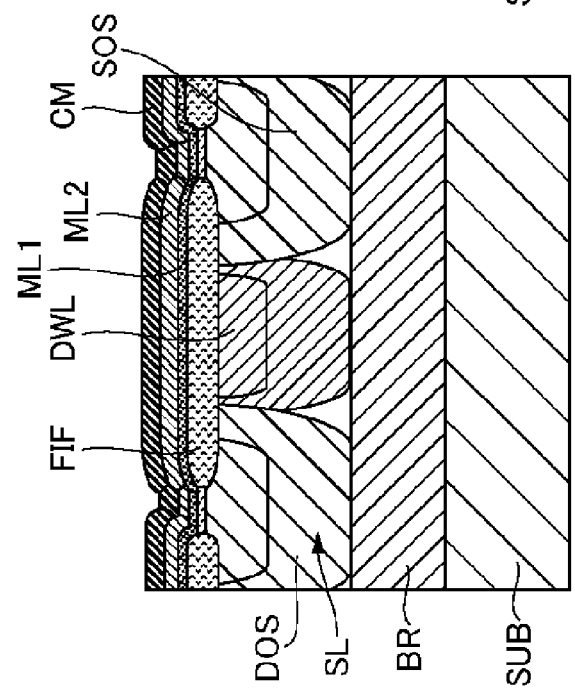

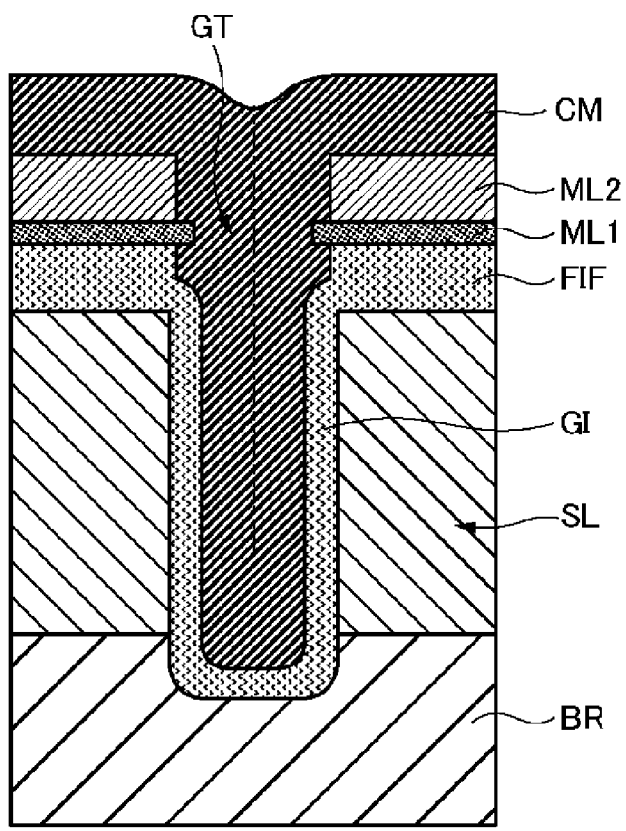

SEMICONDUCTOR DEVICE AND METHOD OF MANUFACTURING THE SAME

CROSS-REFERENCE TO RELATED APPLICATION

The disclosure of Japanese Patent Application No. 2012-071527 filed on Mar. 27, 2012 including the specification, drawings and abstract is incorporated herein by reference in its entirety.

BACKGROUND

The invention relates to a semiconductor device and a method of manufacturing a semiconductor device.

In recent years, along with high integration of semiconductor devices, various structures of semiconductor devices have been proposed in order to reduce the area of a semiconductor device. For example, transistors provided with a gate electrode in a trench part are disclosed, as documents below.

In Patent document 1 (Japanese Patent Laid-Open No. 1999-103058), there is described a following semiconductor device. In a surface of an N-type high resistive layer, a trench (a trench part) is formed. In the trench, a gate electrode is buried via a gate insulating film. It is described that, since this makes it possible to broaden the area of a channel while keeping an element area to be unchanged, ON resistance can be reduced.

Furthermore, as in following documents, a structure of stacking a plurality of contacts, that is, "a stacked contact structure" is disclosed.

In Patent Document 2 (Japanese Patent. Laid-Open No. 2009-252924), there is described a semiconductor device having a following stacked contact structure. Over a first contact, second and third contacts are provided. The second contact is disposed, shifted to the left side relative to the center position of the first contact. On the other hand, the third contact is disposed, shifted to the right side relative to the center position of the first contact. It is described that, even when a concave part (what is called a seam) is generated in an upper part of the first contact, consequently, a contact resistivity anomaly or a contact failure can be avoided.

In Patent Document 3 (Japanese Patent Laid-Open No. 2005-332978), there is described a semiconductor device having a following stacked contact structure. A first contact passes vertically through a first interlayer insulating film and has a ring-like cross-sectional shape at the upper end part. A second contact passes vertically through a second interlayer insulating film provided over the first interlayer insulating film. The center part of the lower surface of the second contact is in contact with the upper surface formed into a ring-like shape in the first contact. It is described that, consequently, electric connection between stacked contacts can be realized definitely.

SUMMARY

The inventor found a following new problem to be solved. Even in the structure in which a gate electrode is provided inside a trench part, as described in Patent document 1, there is such a case that a concave part is generated in the gate electrode on the upper end side of the trench part. In this case, when a contact to be coupled to the gate electrode is disposed over the concave part, the contact resistance may rise owing to the reduction of the contact area of the contact relative to the gate electrode, etc. In contrast, when a contact is disposed, detached from the concave part and protruding outside the gate electrode, an electric field may concentrate at the lower end of the protruding contact. The inventor found, as described above, such a new problem that it is difficult to satisfy both suppression of rise in the contact resistance and improvement of a breakdown voltage near the end part of the trench part. The other problems and the new feature of the invention will become clear from the description of the present specification and the accompanying drawings.

According to an embodiment, the semiconductor device includes a semiconductor layer, a source region, a drain region, a source offset region, a drain offset region, a trench part, a gate insulating film, a gate electrode and a buried region. The source region and the drain region of a first conductivity-type are provided separated from each other in the semiconductor layer. The first conductivity-type source offset region is formed in contact with the source region in the semiconductor layer and in a concentration lower than those in the source region and the drain region. The first conductivity-type drain offset region is disposed in contact with the drain region in the semiconductor layer, being separated from the source offset region, and is formed in a concentration lower than those in the source region and the drain region. The trench part is provided between the source offset region and the drain offset region in the semiconductor layer at least in plan view, and is provided in a source-drain direction from the source offset region toward the drain offset region in plan view. The gate insulating film covers the side surface and the bottom surface of the trench part. The gate electrode is provided at least in the trench part and is in contact with the gate insulating film. The contact is in contact with the gate electrode. The contact is disposed, shifted in a first direction perpendicular to the source-drain direction relative to the centerline in the trench part extending in the source-drain direction in plan view, and is provided in the trench part in plan view.

According to an embodiment, the method of manufacturing a semiconductor device includes the following steps. A first conductivity-type impurity is introduced into positions separated from each other in a semiconductor layer to form a source offset region and a drain offset region (a step of forming an offset region). Next, a trench part is formed in a position between the source offset region and the drain offset region at least in plan view in the semiconductor layer, in a direction from the source offset region toward the drain offset region in plan view (a step of forming a trench part). Next, on a side surface and a bottom surface of the trench part, a gate insulating film is formed (a step of forming a gate insulating film). Next, a conductive material is formed over the semiconductor layer so as to be in contact with the gate insulating film in the inside of the trench part and the surface layer of the conductive material is removed, to form a gate electrode at least in the inside of the trench part (a step of forming a gate electrode). Next, a first conductivity-type impurity is introduced into a position that is in contact with the source offset region, and into a position that is in contact with the drain offset region and separated from the source offset region in the semiconductor layer in a concentration higher than those in the source offset region and the drain offset region, to form the source region and the drain region, respectively (a step of forming source/drain regions). Next, an interlayer insulating film is formed over the semiconductor layer and the gate electrode. Next, a contact in contact with the gate electrode is formed in a position shifted in a first direction perpendicular to a source-drain direction relative to the centerline in the trench part extending in the source-drain direction in plan view in the interlayer insulating film so as to be arranged in the trench part in plan view (a step of forming a contact).

According to an embodiment described above, it is possible to satisfy both suppression of rise in the contact resistance and improvement of the breakdown voltage near the end part of the trench part.

BRIEF DESCRIPTION OF THE DRAWINGS

FIG. 2 is a plan view showing the configuration of the semiconductor device according to the first embodiment;

FIGS. 3A to 3C are cross-sectional views showing the configuration of the semiconductor device according to the first embodiment;

FIG. 4 is an expanded schematic cross-sectional view of FIG. 3C;

FIG. 7 is a plan view showing the arrangement of trench parts when misalignment is generated;

FIGS. 8A to 8C are cross-sectional views for explaining a method of manufacturing the semiconductor device according to the first embodiment;

FIGS. 9A to 9C are cross-sectional views for explaining the method of manufacturing the semiconductor device according to the first embodiment;

FIGS. 10A to 10C are cross-sectional views for explaining the method of manufacturing the semiconductor device according to the first embodiment;

FIGS. 11A to 11C are cross-sectional views for explaining the method of manufacturing the semiconductor device according to the first embodiment;

FIGS. 12A to 12C are cross-sectional views for explaining the method of manufacturing the semiconductor device according to the first embodiment;

FIGS. 15A to 15C are cross-sectional views for explaining the method of manufacturing the semiconductor device according to the first embodiment;

FIG. 16 is a cross-sectional view for explaining the method of manufacturing the semiconductor device according to the first embodiment;

FIGS. 17A to 17C are cross-sectional views for explaining the method of manufacturing the semiconductor device according to the first embodiment;

FIG. 18 is a cross-sectional view for explaining the method of manufacturing the semiconductor device according to the first embodiment;

DETAILED DESCRIPTION

Hereinafter, embodiments of the invention will be explained using accompanying drawings. In all the drawings, the same numeral is given to the same component and the explanation thereof is omitted appropriately.

First Embodiment

Next, using FIGS. 1 to 4, a semiconductor device SD according to a first embodiment will be explained. The semiconductor device SD of the first embodiment includes a semiconductor layer SL, a source region SR, a drain region DR, a source offset region SOS, a drain offset region DOS, a trench part GT, a gate insulating film GI, a gate electrode GE and a buried region BR. The source region SR and the drain region DR of a first conductivity-type are provided, separated from each other in the semiconductor layer SL. The first conductivity-type source offset region SOS is formed in contact with the source region SR in the semiconductor layer SL in a concentration lower than those in the source region SR and the drain region DR. The first conductivity-type drain offset region DOS is disposed in contact with the drain region DR, being separated from the source offset region SOS in the semiconductor layer SL, and is formed in a concentration lower than those in the source region SR and the drain region DR. The trench part GT is provided between the source offset region SOS and the drain offset region DOS at least in plan view in the semiconductor layer SL, and is provided in the source-drain direction from the source offset region SOS toward the drain offset region DOS in plan view. The gate insulating film GI covers the side surface and the bottom surface of the trench part GT. The gate electrode GE is provided at least in the trench part GT and is in contact with the gate insulating film GI. The contact GC is in contact with the gate electrode GE. Moreover, the contact GC is disposed, shifted in the first direction perpendicular to the source-drain direction relative to the centerline in the trench part GT extending in the source-drain direction in plan view, and is provided in the trench part GT in plan view. Hereinafter, details will be explained.

In the following, a case where "the first conductivity-type" is a P-type and "the second conductivity-type" is an N-type will be explained. The first embodiment is not limited to this case, but "the first conductivity-type" may be an N-type and "the second conductivity-type" may be a P-type.

Figure 1:
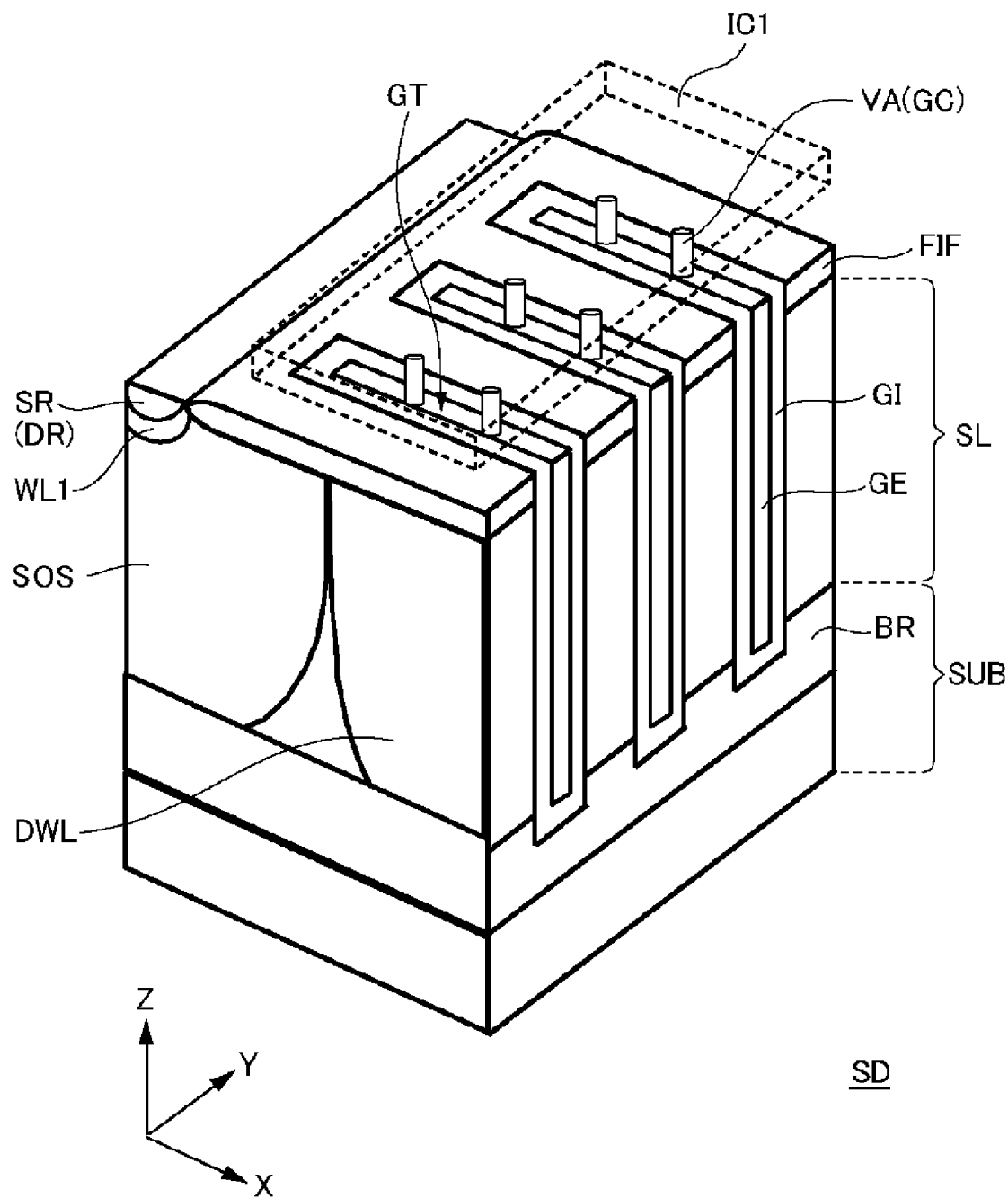
FIG. 1 is a perspective view showing the configuration of a semiconductor device according to a first embodiment.

First, using FIG. 1, the outline of the semiconductor device SD according to the first embodiment will be explained. FIG. 1 is a perspective view showing the configuration of the semiconductor device SD according to the first embodiment. As in FIG. 1, over a semiconductor substrate SUB, the semiconductor layer SL is provided. The semiconductor substrate SUB is, for example, a P-type silicon substrate.

In the semiconductor substrate SUB, an N-type buried region BR is provided. The buried region BR is formed at least in a position deep from the upper surface of the semiconductor substrate SUB. Here, the buried region BR is formed on the upper layer side of the semiconductor substrate SUB.

The semiconductor layer SL is formed over the semiconductor substrate SUB by epitaxial growth. The semiconductor layer SL is, for example, an epitaxially grown P-type silicon layer. By forming the semiconductor layer SL by epitaxial growth, as described above, it is possible to form the N-type buried region BR in such a deep position that ion implantation from the upper surface of the semiconductor layer SL cannot form the region BR.

As shown in FIG. 1, in the semiconductor layer SL, there are provided the source region SR, a P-type well region WL1 and the source offset region SOS into which a P-type impurity has been implanted, and an N-type well region (N-type deep well region DWL) into which an N-type impurity has been implanted. In regions not shown, there are provided the drain region DR, the P-type well region WL1 and the drain offset region DOS into which a P-type impurity has been implanted, in symmetrical positions with the N-type deep well region DWL sandwiched therebetween.

Among positions near the surface layer of the semiconductor layer SL, between the source region SR and the drain region DR in plan view, a field insulating film FIF is provided. The field insulating film FIF is formed, for example, by a LOCOS (Local Oxidation of Silicon) method. Consequently, the field insulating film FIF can be formed with an inexpensive apparatus easily. Incidentally, the field insulating film FIF may be formed by an STI (Shallow Trench Isolation) method.

The trench part GT is provided in the inside of the field insulating film FIF in plan view. As will be described later, the provision of the field insulating film FIF, in addition to the source offset region SOS and the drain offset region DOS, can improve the breakdown voltage of the semiconductor device SD.

The trench part GT is provided, for example, in the normal direction of the semiconductor substrate SUB (the Z axis direction). The trench part GT is provided in plural number at regular intervals in the direction in which the source region SR (or the drain region DR) extends (the Y direction in FIG. 2). The gate electrode GE is provided at least in the trench part GT. Here, for example, the gate electrode GE is provided only in the trench part GT in plan view. Consequently, the concentration of the electric field near the upper end of the trench part GT can be suppressed. On the side surface and the bottom surface of the trench part GT, a gate insulating film GI is provided. In the trench part GT, the gate electrode GE is buried, in contact with the gate insulating film GI. Accordingly, the trench part GT configures a gate electrode structure.

In a position overlapping the gate electrode GE in plan view, a via VA is provided. Here, among "vias VA" in contact with the semiconductor layer SL etc., one that is in contact with the gate electrode GE is called "a contact GC." An interconnection IC1 is connected to the gate electrode GE via the contact GC.

In the first embodiment, the contact GC is disposed as follows so as to be coupled stably to the gate electrode GE provided only in the trench part GT. Here, the contact GC is in contact with the gate electrode GE and is provided in the trench part GT in plan view. Moreover, as in FIG. 4 to be described later, the contact GC is disposed, shifted in the first direction perpendicular to the source-drain direction relative to the centerline in the trench part GT extending in the source-drain direction in plan view. Consequently, it is possible to suppress the rise in the contact resistance, and to improve the breakdown voltage near the end part of the trench part GT. Details of the arrangement of the contact GC, etc. will be described later.

Here, for example, the interconnection IC1 coupled to the gate electrode GE is provided, extending in the X direction in the drawing. Incidentally, the source region SR and the drain region DR are coupled to the interconnection IC1 through the via VA provided in a region not shown. Moreover, although not shown, among vias VA, one in contact with a back gate region BG is distinguished as "a back gate contact BGC"

FIG. 2 is a plan view showing the configuration of the semiconductor device SD according to the first embodiment. FIGS. 3A to 3C are cross-sectional views showing the configuration of the semiconductor device according to the first embodiment. FIG. 3A is a cross-sectional view along the A-A' line in FIG. 2, FIG. 3B is a cross-sectional view along the B-B' line in FIG. 2, and FIG. 3C is a cross-sectional view along the C-C' line in FIG. 2. As in FIG. 2, the P-type source region SR and the drain region DR are provided, separated from each other in the X direction in plan view in the semiconductor layer SL. The gate electrodes GE formed in the trench parts GT, respectively, are provided in parallel to each other. A P-type impurity implanted in the source region SR and the drain region DR is, for example, B (boron).

The P-type well region WL1 may be provided so as to overlap each of the source region SR and the drain region DR in plan view. Each of the source region SR and the drain region DR is provided so as to be surrounded by the P-type well region WL1 in the semiconductor substrate SUB, and is provided in the P-type well region WL1 in plan view. Into the P-type well region WL1, for example, the same impurity as that in the source region SR and the drain region DR has been implanted.

The P-type source offset region SOS is in contact with the source region SR in the semiconductor layer SL. Here, the source region SR is provided so as to be surrounded by the source offset region SOS in the semiconductor substrate, and is provided in the source offset region SOS in plan view. Moreover, the source offset region SOS is in contact with the source region SR through the P-type well region WL1 in the semiconductor substrate. The source offset region SOS is formed in a concentration lower than those in the source region SR and the drain region DR.

The P-type drain offset region DOS is in contact with the drain region DR in the semiconductor layer SL. Here, the drain region DR is provided so as to be surrounded by the drain offset region DOS in the semiconductor substrate, and is provided in the drain offset region DOS in plan view. The drain offset region DOS is in contact with the drain region DR through the P-type well region WL1 in the semiconductor substrate. The drain offset region DOS is provided, separated from the source offset region SOS. The drain offset region DOS is formed in a concentration lower than those in the source region SR and the drain region DR. The P-type impurity implanted in the source offset region SOS and the drain offset region DOS is, for example, B (boron).

Between the source offset region SOS and the drain offset region DOS (in the X direction) in plan view, there is provided the N-type deep well region DWL into which an N-type impurity has been implanted. A region adjacent to the gate insulating film GI in the N-type deep well region DWL in the depth direction (the downward direction in the Z direction in FIG. 1) of the trench part GT is what is called a channel region. A region adjacent in the Y direction to the gate insulating film GI formed on the side surface of the trench part GT in the N-type deep well region DWL between the source offset region SOS and the drain offset region DOS acts as what is called a channel region.

The trench part GT is provided between the source offset region SOS and the drain offset region DOS at least in plan view, in the semiconductor layer SL. In the trench part GT, the gate insulating film GI and the gate electrode GE are provided to configure a gate electrode structure.

The trench part GT may intrude in a source offset region SOS side or a drain offset region DOS side in plan view. As will be described later, the channel region of the N-type deep well region DWL is formed, extending in the depth direction of the trench part GT between the source offset region SOS and the drain offset region DOS. Incidentally, in order to obtain a high breakdown voltage, the trench part GT is preferably not in contact with the source region SR and the drain region DR.

As in FIG. 2, the trench part GT is provided in the source-drain direction from the source offset region SOS toward the drain offset region DOS in plan view. Incidentally, "a source-drain direction from the source offset region SOS toward the drain offset region DOS" is the direction along the A-A' line (the X direction) in the drawing. Moreover, the trench part GT is provided between the source region SR and the drain region DR in plan view. In other words, the side surface of the trench part GT is, preferably, in parallel to the direction along which an electric field is to be applied.

The trench part GT is provided in plural number, separated from each other in the direction (the Y direction) perpendicular to the source-drain direction. Here, for example, a plurality of trench parts GT is provided at regular intervals. By the provision of a plurality of trench parts GT, the area of the channel region can be increased without broadening the planar area of the element.

For example, the source region SR and the drain region DR are arranged in symmetrical positions with the trench part GT sandwiched therebetween. Incidentally, the trench part GT may be provided in close vicinity of either of impurity regions.

The interval between the trench parts GT is, for example, not less than 0.5 µm and not more than 5 µm. The interval between trench parts GT is, more preferably, not less than 0.8 µm and not more than 2.0 µm.

The trench part GT is, for example, rectangular in plan view. In the trench part GT, the end part in plan view may be of a curved surface. That is, the trench part GT may be ellipsoidal in plan view. Incidentally, the side surface of the trench part GT is preferably linear in plan view.

As described above, the source region SR, the source offset region SOS, the drain region DR, the drain offset region DOS, the gate insulating film GI and the gate electrode GE form an FET (Field Effect Transistor). The FET may be provided in plural number, and may be arranged alternately in symmetrical positions. In this case, the second gate electrode GE is provided in a symmetrical position relative to the first gate electrode GE with the first drain region DR sandwiched therebetween in plan view. The second source region SR is provided in the symmetrical position relative to the first drain region DR with the second gate electrode GE sandwiched therebetween in plan view.

As in FIG. 2, the N-type back gate region BG is provided so as to surround the trench part GT (including the gate electrode GE and the gate insulating film GI), the source offset region SOS, the drain offset region DOS, the source region SR and the drain region DR in plan view. The N-type back gate region BG is provided, for example, separated from the source region SR and the drain region DR. The back gate region BG is provided in an opening (the numeral thereof is not shown) of the field insulating film FIF. The trench parts GT are arranged axisymmetrically, according to the design, relative to the centerline of a region surrounded by the back gate region BG in plan view.

The N-type back gate region BG has a fixed voltage, for example, of a power supply voltage in order to stabilize the potential of the channel region. When a plurality of FETs is provided as described above, it is provided so as to surround the outside of a region in which a logic circuit including the FETs is formed. Incidentally, an N-type well region (WL2) may additionally be provided, in contact with a lower side of a position overlapping the N-type back gate region BG in plan view.

FIGS. 3A to 3C are cross-sectional views showing the configuration of the semiconductor device according to the first embodiment. FIG. 3A is a cross-sectional view along the A-A' line in FIG. 2.

As in FIG. 3A, as described above, on the upper layer side of the semiconductor substrate SUB, the N-type buried region BR is provided. The N-type buried region BR is provided in a position deeper than the source region SR and the drain region DR. The N-type impurity introduced in the N-type buried region BR is, for example, Sb (antimony). The N-type buried region BR is provided so as to surround an FET-forming region in plan view, and is electrically coupled, for example, with the N-type back gate region BG.

For example, the N-type buried region BR is formed in a concentration higher than that in the N-type deep well region DWL. Moreover, the P-type impurity concentration in the N-type buried region BR is preferably higher at least than the P-type impurity concentration in the semiconductor substrate SUB.

Over the semiconductor substrate SUB, the semiconductor layer SL is provided. Accordingly, between the semiconductor substrate SUB and the semiconductor layer SL, an interface is formed. The thickness of the semiconductor layer SL is, for example, not less than 1 μm and not more than 20 μm. Further, the thickness of the semiconductor layer SL is, for example, preferably not less than 5 μm and not more than 10 μm.

As described above, in the semiconductor layer SL, the P-type source region SR, the P-type well region WL1, the P-type source offset region SOS, the N-type deep well region DWL, the P-type drain region DR, the P-type well region WL1 and the P-type drain offset region DOS are provided.

The P-type source offset region SOS and the P-type drain offset region DOS are, for example, in contact with the N-type buried region BR. The N-type deep well region DWL is, for example, in contact with the N-type buried region BR. In the N-type deep well region DWL, for example, P (phosphorous) has been introduced as an N-type impurity.

The N-type deep well region DWL is provided between the source offset region SOS and the drain offset region DOS at least in plan view in the semiconductor layer SL. Furthermore, the N-type deep well region DWL is provided so as to overlap the trench part GT in cross-sectional view in the semiconductor layer SL. As described above, the N-type buried region BR is formed in a concentration higher than that in the N-type deep well region DWL. Consequently, it is possible to suppress stably concentration of electric field in a part where the trench part GT intrudes in the N-type buried region BR.

As in FIG. 3A, the field insulating film FIF is provided between the source region SR and the drain region DR in plan view in the semiconductor layer SL. The field insulating film FIF is provided in a position that overlaps the channel region in plan view in the semiconductor layer SL. The field insulating film FIF is provided over the source offset region SOS, the N-type deep well region DWL and the drain offset region DOS. In an opening part (the numeral thereof is not shown) of the field insulating film FIF, the source region SR and the drain region DR are formed.

In addition, as in FIG. 3A, over the field insulating film FIF and the semiconductor layer SL, an interlayer insulating film IF1 is provided. The interlayer insulating film IF1 includes, for example, $SiO_2$, SiON, SiOC, SiOCH, SiCOH, SiOF or the like.

The thickness of the field insulating film FIF is, for example, not less than 0.2 μm and not more than 1 μm.

In the interlayer insulating film IF1, in a position that overlaps the source region SR or the drain region DR in plan view, a via VA is provided. The via VA is in contact with the source region SR or the drain region DR.

Over the interlayer insulating film IF1, a plurality of interconnections IC1 is provided. Each of interconnections IC1 is coupled to the source region SR or the drain region DR through the via VA.

Here, the via VA and the interconnection IC1 are formed individually. The via VA and the interconnection IC1 contain, for example, Al. Incidentally, the via VA and the interconnection IC1 may be formed from different materials. The via VA or the interconnection IC1 may include, for example, Cu or W. Further, on the side surface and the bottom surface of the via VA, and on the bottom surface and the upper surface of the interconnection IC1, a barrier metal layer (not shown) may be provided.

FIG. 3B is a B-B' line cross-sectional view in FIG. 2. As in FIG. 3B, the trench part GT is provided between the source offset region SOS and the drain offset region DOS in plan view. The trench part GT is provided, passing through the field insulating film FIF provided between the source region SR and the drain region DR.

On the side surface and the bottom surface of the trench part GT, a gate insulating film GI is provided. The gate insulating film GI includes, for example, a thermally-oxidized film of silicon. By forming the gate insulating film GI by thermal oxidation, it is possible to suppress pinhole formation in the side surface and the bottom surface of the trench part GT. Incidentally, the gate insulating film GI may be formed by a plurality of layers.

The thickness of the gate insulating film GI is, for example, not less than 100 nm and not more than 1 μm. Preferably, the thickness of the gate insulating film GI is, for example, not less than 300 nm and not more than 500 nm. The bottom surface of the trench part GT is formed, for example, up to a depth not less than twice the thickness of the gate insulating film GI from the upper surface of the semiconductor substrate SUB.

The gate electrode GE is in contact with the gate insulating film GI. Here, the inside of the trench part GT is buried with the gate electrode GE. Further, the gate electrode GE is provided only in the trench part GT in plan view. The gate electrode GE does not protrude to the outside of the trench part GT in plan view. In other words, the gate electrode GE is not formed in an integrated manner from the inside of the trench part GT in positions outside the trench part GT in plan view. In plan view, the vicinity of the upper end part of the gate electrode GE is configured so as not to extend over the surface of the semiconductor layer SL. In plan view, in the vicinity of the surface of the semiconductor layer SL, the vicinity of the upper end part of the gate electrode GE is provided in a position inside the upper end part of the trench, so as not to extend over positions overlapping the source offset region SOS, the drain offset region DOS and the N-type deep well region DWL. Consequently, it is possible to suppress the concentration of an electric field near the upper end of the trench part GT.

The gate electrode GE is, for example, made of polysilicon. The gate electrode GE of the polysilicon is formed by a CVD (Chemical. Vapor Deposition) method. Consequently, it is possible to bury stably the gate electrode GE in the trench part GT.

The trench part GT is provided inside the field insulating film FIF in plan view. In other words, an opening part (the numeral, thereof is not shown) of the field insulating film FIF is provided in a position separated from the trench part GT.

That is, the source region SR and the drain region DR are formed in positions separated from the gate electrode GE. Consequently, the FET can be made to have a high breakdown voltage. Incidentally, only the drain region DR may be formed in a position separated from the gate electrode GE.

The bottom surface of the trench part GT intrudes in the N-type buried region BR. Here, the bottom surface of the trench part GT is formed in a position deeper than the upper surface of the N-type buried region BR. Consequently, the part where the bottom surface of the trench part GT intrudes in the buried region BR does not function as a P-type channel region. Accordingly, in the part where the bottom surface of the trench part GT intrudes in the buried region BR, the concentration of an electric field can be suppressed.

The corner part on the lower end side of the trench part GT may be in an R-shape. Here, for example, by forming the gate insulating film GT by thermal oxidation, the corner part on the lower end side of the trench part GT is formed in an R-shape. Incidentally, the corner part may be rectangular.

As in FIG. 3B, over the semiconductor layer SL, the field insulating film FIF and the gate electrode GE, the interlayer insulating film IF1 is provided. In the interlayer insulating film IF1, in a position overlapping the gate electrode GE in plan view, the contact GC (the via VA) is provided. The contact GC is in contact with the gate electrode GE. For example, with the gate electrode GE provided for one trench part GT, a plurality of contacts GC is in contact. In over the interlayer insulating film IF1, in a position overlapping the gate electrode GE in plan view, the interconnection IC1 is provided. The interconnection IC1 is coupled to the gate electrode GE through the contact GC.

FIG. 3C is a C-C' line cross-sectional view in FIG. 2. As in FIG. 3C, in the first embodiment, in regions in contact with the side surface of the trench part GT, a region from the upper surface of the semiconductor layer SL to the upper surface of the buried region BR is a channel region. The trench part GT is provided in plural number in a direction perpendicular to the source-drain direction (the C-C' line direction). For example, a plurality of trench parts GT is arranged at regular intervals in the direction. Due to such structure, it is possible to increase the area of the channel region without expanding the planar area of the semiconductor device SD. That is, ON resistance of the semiconductor device SD can be lowered.

In regions not shown, over the interlayer insulating layer IF1 and the interconnection IC1, additionally, a plurality of interconnection layers may have been formed. That is, a multilayer interconnection structure may have been formed. On the uppermost layer of the multilayer interconnection structure, for example, a bump electrode (not shown) or a Cu pillar (not shown) may have been formed.

Next, using FIGS. 4 and 5, the arrangement and the shape of the trench part GT and the contact GC will be explained. FIG. 4 is an expanded schematic cross-sectional view of FIG. 3C. In FIG. 4, the direction (the Y direction) perpendicular to the source-drain direction (the X direction) is the lateral direction. Here, the Y direction from the centerline Yc in the Y direction of the trench part GT is defined as "a first direction" and the direction opposite to the first direction is defined as "a second direction."

As in FIG. 4, also in the first direction, the gate electrode GE does not protrude to the outside of the trench part GT in plan view. With the upper end of the gate electrode GE, the contact GC is in contact.

Here, for example, in the gate electrode GE, in the upper end part of the trench part GT in cross-sectional view, a concave part is formed. The concave part is one what we call "a seam." The concave part is often formed in the center part of the gate electrode GE. When the contact GC is disposed in such a concave part, a minute hollow may be formed between the concave part of the gate electrode GE and the contact GC. Consequently, the contact resistance may rise.

Therefore, in the first embodiment, the contact GC is arranged, for example, shifted in the first direction perpendicular to the source-drain direction relative to the centerline Yc in the gate electrode GE in cross-sectional view. The contact GC is connected so as to avoid the above-mentioned concave part of the gate electrode GE. Consequently, the rise in the contact resistance can be suppressed.

Further, the center of the contact GC is formed, shifted from the concave part of the gate electrode GE. Consequently, at least a region that overlaps the concave part of the gate electrode GE in the contact GC can be narrowed. In other words, a good contact area can be increased.

Incidentally, the shape of the concave part of the gate electrode GE may change depending on manufacturing conditions. A gate electrode GE not having the concave part may have been provided in a part or the whole of the semiconductor device SD. In other words, the concave part of the gate electrode GE is not necessarily formed. In the first embodiment, while supposing a case where a concave part is formed in the gate electrode GE, the contact GC is formed, shifted intentionally. Consequently, it is possible to suppress stably the rise in the contact resistance, not depending on the shape of the gate electrode GE. Details of the arrangement of the contact GC will be described later.

Further, the contact GC is provided in the trench part GT in plan view. In other words, the contact GC also does not protrude to the outside of the trench part GT. If the contact GC protrudes out of the trench part GT due to misalignment, an electric field may concentrate because the contact GC lies close to the end part of the trench part GT in the semiconductor layer SL. Accordingly, by providing the contact CC in the trench part GT in plan view, it is possible to suppress the concentration of an electric field near the end part of the trench part GT in the semiconductor layer SL.

In addition, in the gate electrode GE, an upper end width $W_{EU}$ in the first direction is wider than a lower end width $W_{ED}$. Consequently, even when a contact GC is disposed, shifted from the center of the gate electrode GE, it is possible to suppress protrusion of the contact GC outside the gate electrode GE. That is, the contact CC can stably be coupled to the gate electrode GE. Incidentally, the upper end width of the trench part GT may be not more than the lower end width of the trench part.

The gate electrode GE is formed in a position not exceeding the upper surface of the field insulating film FIF. The upper end of the gate electrode GE lies above the upper surface of the semiconductor layer SL.

Here, for example, the gate electrode GE extends in the first direction and the opposite second direction, above the upper surface of the semiconductor layer SL. The side surface of the gate electrode GE inclines in an arc shape with the center at the corner part of the upper end of the semiconductor layer SL that is in contact with the trench part GT. The upper end width $W_{EU}$ of the gate electrode GE is wider than the width at the position of the upper surface of the semiconductor layer SL in the gate electrode GE. The shape is formed by making the width of the opening formed in the position of the trench part GT in the field insulating film FIF wider than the width of the upper end of the trench part GT, in a manufacturing step to be described later.

Here, as the width of the gate electrode GE becomes larger, the concave part of the gate electrode GE tends to become deeper. Accordingly, by making only the upper part of the gate electrode GE be broadened, it is possible to widen the upper end width of the gate electrode GE without making the concave part of the gate electrode GE deep.

Specifically, the upper end width $W_{EU}$ of the gate electrode GE is wider than the lower end width $W_{ED}$ in a range of not less than 1.3 times and not more than 2.5 times. Because the upper end width $W_{EU}$ of the gate electrode GE is not less than the lower limit, it is possible to suppress protrusion of the contact GC outside the gate electrode GE. Furthermore, because the upper end width $W_{EU}$ of the gate electrode GE is not more than the upper limit, it is possible to suppress the concentration of an electric field near the upper end of the trench part GT.

Incidentally, as described above, because the gate electrode GE is provided only in the trench part GT in plan view, the upper end width $W_{EU}$ of the gate electrode GE is not more than a width $W_{GT}$ of the trench part GT. Specifically, the width $W_{GT}$ of the trench part GT is, for example, not less than 0.5 μm and not more than 5 μm. The width is, further preferably, not less than 0.6 μm and not more than 1.6 μm. Accordingly, also the upper end width $W_{EU}$ of the gate electrode GE is not less than 0.5 μm and not more than 5 μm, preferably not less than 0.6 μm and not more than 1.6 μm.

Moreover, in the gate electrode GE, the end part in the first direction or the second direction opposite to the first direction is separated by the thickness of the gate insulating film GI or more from the upper surface of the semiconductor layer SL. In other words, the upper end of the gate electrode GE lies in a position higher than the upper surface of the semiconductor layer SL by the thickness of the gate insulating film GI or more. When the boundary between the gate insulating film GI and the field insulating film FIF is unclear, "the thickness of the gate insulating film GI," which is the standard here, is defined by the interval between side surfaces of the gate insulating film GI when drawing lines parallel to the upper surface of the semiconductor layer SL. Consequently, the end part of the gate electrode GE never goes nearer to the semiconductor layer SL as compared with the part in the trench part GT in the gate electrode GE. Accordingly, it is possible to suppress the concentration of an electric field near the upper end of the trench part GT.

Other than that, the thickness of the field insulating film FIF is greater than, for example, the thickness of the gate insulating film GI.

Next, using FIGS. 5, 6 and 7, the arrangement of contacts GC will be explained in detail. FIG. 5 is a plan view showing the arrangement of contacts when no misalignment exists. FIG. 6 is a plan view showing the arrangement of contacts when misalignment occurs, FIG. 7 is a plan view showing the arrangement of trench parts when misalignment occurs.

Figure 5:
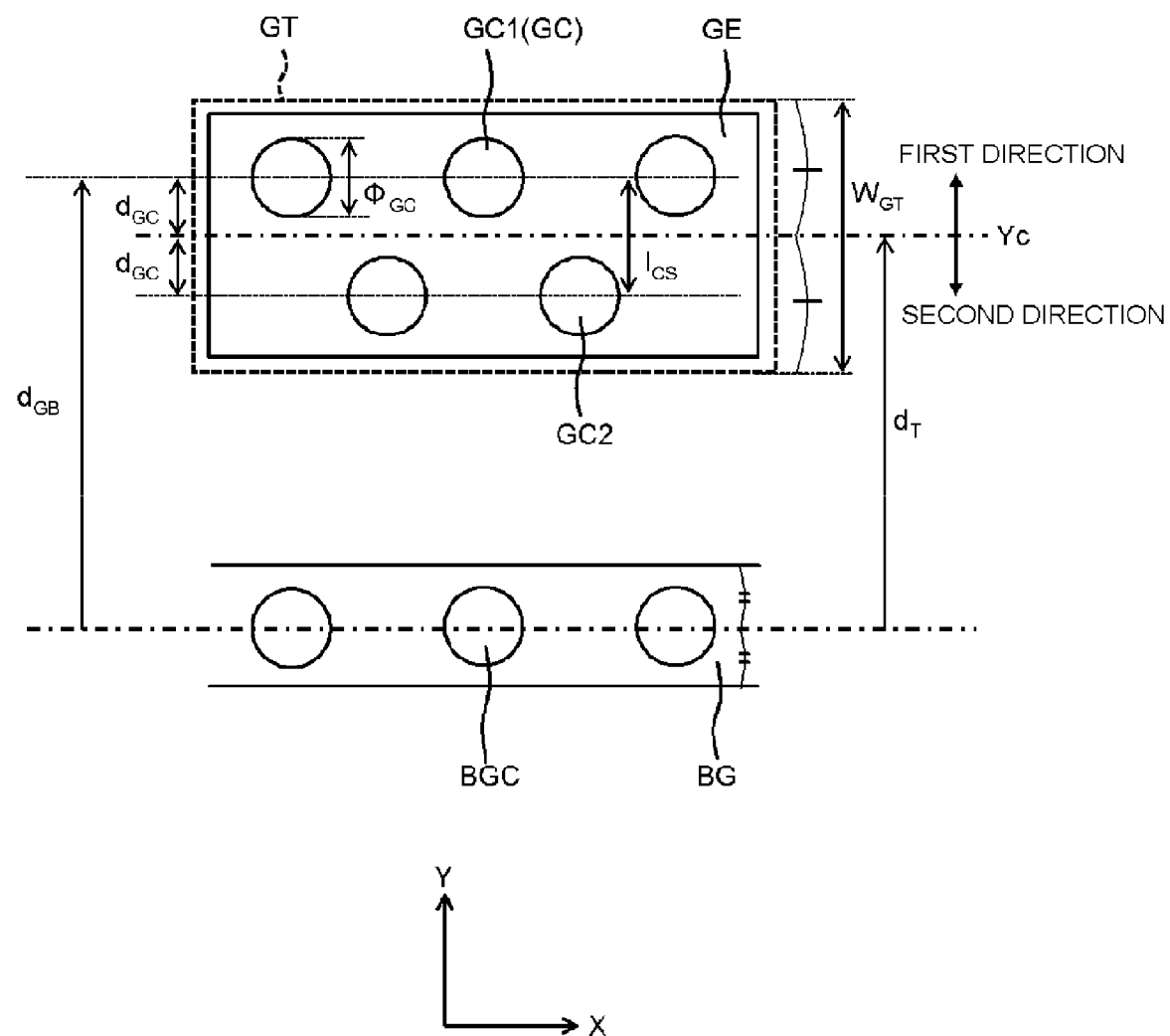
FIG. 5 is a plan view showing the arrangement of contacts when no misalignment is generated.
Figure 6:
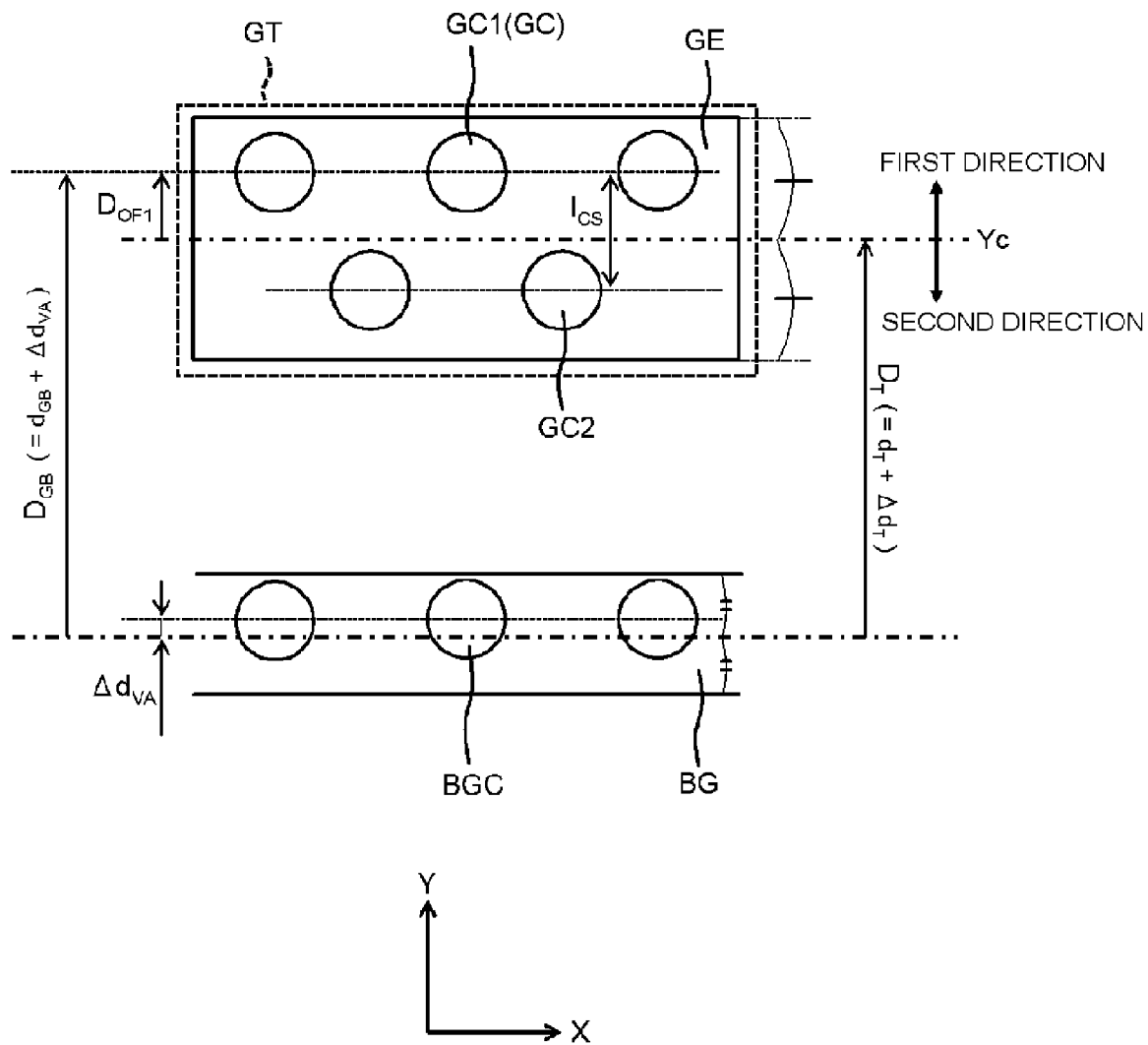
FIG. 6 is a plan view showing the arrangement of contacts when misalignment is generated.

Moreover, FIGS. 5 to 7 show schematically only the vicinity of the gate electrode GE, the trench part GT and the back gate BG. FIGS. 5 and 6 show an example of the arrangement of contacts GC in the first embodiment. The trench part GT shown in FIGS. 5 and 6 is a trench part GT, for example, lying at the center among trench parts GT provided in plural number.

Note that, in FIGS. 5 to 7, the upward direction is set as the first direction perpendicular to the source-drain direction. Various distances to be described later are values obtained by setting the first direction as positive.

As in FIG. 5, a plurality of contacts GC is provided for the same gate electrode GE. Among contacts GC, a first contact GC1 is disposed, shifted in the first direction perpendicular to the source-drain direction relative to the centerline in the trench part GT extending in the source-drain direction in plan view. On the other hand, a second contact GC2 is disposed, shifted in the second direction opposite to the first direction. As described above, for example, the first contact GC1 and the second contact GC2 are provided, separated from each other with the center of the gate electrode GE sandwiched therebetween. Consequently, in a step of forming a contact to be described later, the contact GC can stably be coupled to the gate electrode GE even when misalignment occurs in any direction.

Here, for example, the first contacts GC1 and the second contacts GC2 are arranged in a zigzag manner. The first contact GC1 and the second contact GC2 adjacent to each other are separated by a prescribed distance. Consequently, even when they are effectively arranged over a seam due to misalignment of contacts, any contact may have a sound resistance value to give a stable potential to the gate electrode.

As described above, FIG. 5 shows a case without misalignment, that is, a case where contacts are arranged just according to a design. On this occasion, for example, the first contact GC1 and the second contact GC2 are arranged symmetrically relative to the centerline Yc in the trench part GT. Incidentally, the centerline of the gate electrode GE is equal to the centerline Yc in the trench part GT.

As in FIG. 5, the center of the first contact GC1 is arranged, shifted by a prescribed distance $d_{GC}$ in the first direction. The center of the second contact GC2 is also arranged, shifted by $-d_{GC}$. Furthermore, a distance $d_{GC}$ between centers of the contact and the trench part, and a distance $l_{CS}$ between the center of the first contact GC1 and the center of the second contact GC2 satisfy Formula (3) below.

$$d_{GC}=l_{CS}/2 \tag{3}$$

Furthermore, a diameter $\Phi_{GC}$ of the contact GC is at least less than the width $W_{GT}$ of the trench part GT. Further, the diameter of the contact GC is preferably less than ½ times the width $W_{GT}$ of the trench part GT. Consequently, it is possible to suppress stably protrusion of the contact GC outside the trench part GT.

In addition, as in FIG. 5, the back gate region BG is provided in parallel to the trench part GT. In the back gate region BG, the back gate contact BGC is provided. The back gate contact BGC is in contact with the back gate region BG. The back gate contact BGC is provided in the same layer together with the via VA such as the contact GC in contact with the gate electrode GE. When no misalignment exists, for example, the center of the back gate contact BGC overlaps the centerline in the back gate region BG in plan view.

Incidentally, "the centerline in the back gate region BG," which works as the standard hereinafter, is the centerline in the back gate region BG extending in the source-drain direction in plan view. Furthermore, the back gate region BG is, as described above, a region in which no field insulating film FIF is formed. Accordingly, the centerline in the back gate region BG may be determined as the centerline of a region in which no field insulating film FIF is formed.

When no misalignment exists, the contact GC in contact with the gate electrode GE is disposed in a position, separated by a distance $d_{GB}$ from the centerline in the prescribed back gate region BG, which works as the standard. Furthermore, the centerline in the trench part GT is arranged, separated by a distance $d_T$ from the centerline in the prescribed back gate region BG, which works as the standard. Accordingly, the distance $d_{GC}$ between centers of the contact and the trench part, the distance $d_{GB}$ between the contact and the back gate region, and the distance $d_T$ between the trench part and the back gate region satisfy following Formula (4).

$$d_{GC}=d_{GB}-d_T \tag{4}$$

FIGS. 6 and 7 show cases where misalignment occurs in contacts GC, back gate contacts BGC and trench parts in FIGS. 6 and 7, for example, the contact GC, the back gate contact BGC and the trench part GT have shifted in the first direction as compared with the case shown in FIG. 5.

In FIG. 6, due to misalignment, the back gate contact BGC is disposed, shifted from the centerline in the back gate region BG in the first direction. Here, a shift amount of the center of the back gate contact BGC from the centerline in the back gate region BG in the first direction in plan view is defined as "a back gate shift amount $\Delta d_{VA}$." The back gate shift amount $\Delta d_{VA}$ may also be obtained based on the centerline of the region in which no field insulating film FIF is formed.

Moreover, in FIG. 6, for example, the trench part GT is also disposed in a position separated from the centerline in the prescribed back gate region BG, which works as the standard, in the first direction, due to misalignment, by a distance $D_T$ different from a design distance $d_T$. The distance $D_T$ between the trench part and the back gate region includes a trench part shift amount $\Delta d_T$ due to misalignment relative to the distance $d_T$ in design terms. That is, the distance $D_T$ can be shown as Formula (5) below.

$$D_T = d_T + \Delta d_T \quad (5)$$

Furthermore, trench parts GT are arranged, according to the design, axisymmetrically relative to the centerline of a region surrounded by the back gate region BG in plan view. Accordingly, the trench part shift amount $\Delta d_T$ due to misalignment of the trench part GT can be obtained by a method explained below.

As in FIG. 7, a plurality of trench parts GT is arranged, shifted in the first direction relative to the back gate region BG due to misalignment. The trench part shift amount $\Delta d_T$ can be obtained by a shift amount of the centerline of the region in which the trench part GT is disposed, shifted in the first direction in plan view from the centerline of a region surrounded by the back gate region BG. Incidentally, the region surrounded by the back gate region BG may be based on the part in which the field insulating film FIF is not formed, as described above.

"The centerline of a region in which the trench part GT is disposed" described here is, when a plurality of trench parts GT is provided, a centerline of a rectangular region including all the trench parts GT. When a plurality of trench parts GT is provided, "the centerline of a region surrounded by the back gate region BG" is, as a principle, different from above-described "the centerline in the back gate region BG." Incidentally, when one trench part GT is provided at the center of a region surrounded by the back gate region BG according to the design, "the centerline of a region in which the trench part GT is disposed" may be equal to the centerline in the trench part GT.

In FIG. 6, for example, the contact GC is disposed in a position separated from the centerline in the prescribed back gate region BG, which works as the standard, in the first direction by a distance $D_{GB}$ different from the design distance $d_{GB}$, due to misalignment. The distance $D_{GB}$ between the contact and the back gate region includes a shift amount due to misalignment, relative to the design distance $d_{GB}$. Here, a shift amount of the contact GC shifted relative to the back gate region BG due to misalignment is equal to the shift amount of the via VA provided in the same layer. That is, the shift amount of the contact GC shifted relative to the back gate region BG is equal to the above-described back gate shift amount $\Delta d_{VA}$. Accordingly, the distance $D_{GB}$ is shown as Formula (6) below.

$$D_{GB} = d_{GB} + \Delta d_{VA} \quad (6)$$

Moreover, when a shift amount of the center of the first contact GC1 shifted from the centerline in the trench part GT in the first direction in plan view is defined as a first offset amount $D_{OF1}$, the first offset amount $D_{OF1}$ is shown as Formula (7) below, using the distance $D_{GB}$ between the contact and the back gate region, and the distance $d_T$ between the trench part and the back gate region.

$$D_{OF1} = D_{GB} - D_T \quad (7)$$

From Formulae (4) to (7) above, the first offset amount $D_{OF1}$ satisfies Formula (8) below.

$$D_{OF1} = d_{GC} + \Delta d_{VA} - \Delta d_T \quad (8)$$

In the first embodiment, according to the design, the first contact GC1 is disposed, shifted intentionally in the first direction perpendicular to the source-drain direction in plan view relative to the centerline in the trench part GT. Regarding at least the design distance $d_{GC}$ between centers of the contact and the trench part, it satisfies $d_{GC}>0$. Accordingly, in the first embodiment, irrespective of presence or absence of misalignment, the first offset amount $D_{OF1}$ of the first contact GC1 at least satisfies Formula (1) below.

$$D_{OF1} > \Delta d_{VA} - \Delta d_T \quad (1)$$

By satisfying Formula (1) above, even when misalignment occurs in contacts GC or trench parts GT, it is possible to couple the contact GC to the gate electrode GE, avoiding the concave part of the gate electrode GE. Incidentally, by the shift of the contact GC and the trench part GT in directions opposite to each other, it is considered that the contact GC is disposed near the concave part of the gate electrode GE. However, even in the case, by satisfying Formula (1) above, at least a region in the contact GC overlapping the concave part of the gate electrode GE can be reduced. Accordingly, as compared with at least a case where the contact GC is disposed according to the design over the centerline in the trench part GT, the rise in contact resistance can be suppressed.

Furthermore, as described above, according to the design, when the first contact GC1 and the second contact GC2 are arranged symmetrically relative to the centerline in the trench part GT, Formula (3) is satisfied. Accordingly, from Formulae (3) and (7), the first offset amount $D_{OF1}$ of the first contact GC1 satisfies Formula (2) below.

$$D_{OF1} = l_{CS}/2 + \Delta d_{VA} - \Delta d_T \quad (2)$$

By satisfying Formula (2) above, even when misalignment occurs in contacts GC or trench parts GT, necessarily, either contact GC of the first contact GC1 and the second contact GC2 does not overlap the concave part of the gate electrode GE. Accordingly, the contact GC can be coupled stably to the gate electrode GE.

Above-mentioned first offset amount $D_{OF1}$ of the first contact GC1, back gate shift amount $\Delta d_{VA}$, trench part shift amount $\Delta d_T$, and distance $l_{CS}$ between the center of the first contact GC1 and the center of the second contact GC2 can be measured with a SEM (Scanning Electron Microscope) etc.

Next, using FIGS. 3, 4, and 8 to 22, a method of manufacturing the semiconductor device SD according to the first embodiment will be explained. FIGS. 8 to 22 are cross-sectional views for explaining the method of manufacturing the semiconductor device SD according to the first embodiment. The method of manufacturing the semiconductor device SD according to the first embodiment includes following steps. A P-type impurity is introduced into the semiconductor layer SL in positions separated from each other to form the source offset region SOS and the drain offset region DOS (a step of forming an offset region) Next, the trench part GT is formed in a position between the source offset region SOS and the drain offset region DOS at least in plan view in the semiconductor layer SL, in a direction from the source offset region SOS toward the drain offset region DOS in plan view (a step of forming a trench part). Next, the gate insulating film GI is formed on a side surface and a bottom surface of the trench part GT (a step of forming a gate insulating film). Next, a conductive material is formed over the semiconductor layer SL and in the trench part GT so as to be in contact with the gate insulating film GI and a surface layer of the conductive material is removed to form the gate electrode GE at least in the trench part GT (a step of forming a gate electrode). Next, a P-type impurity is introduced into a position in contact with the source offset region SOS and a position that is in contact with the drain offset region DOS but is separated from the source offset region SOS in the semiconductor layer SL in a concentration higher than those in the source offset region SOS and the drain offset region DOS to form, respectively, the source region SR and the drain region DR (a step of forming source/drain regions). Next, the interlayer insulating film IF1 is formed over the semiconductor layer SL and the gate electrode GE. Next, the contact GC in contact with the gate electrode GE is formed in a position shifted in the first direction perpendicular to the source-drain direction relative to the centerline in the trench part GT extending in the source-drain direction in plan view in the interlayer insulating film IF1 and so as to be arranged in the trench part GT in plan view (a step of forming a contact). Hereinafter, details will be explained.

First, as in FIGS. 8A, 8B and BC, prior to a step of forming an offset region to be described later, an N-type impurity is introduced into the semiconductor substrate SUB to form the N-type buried region BR (a step of forming a buried region). Incidentally, as described above, the semiconductor substrate SUB is, for example, a P-type silicon substrate. The N-type impurity is, for example, Sb (antimony).

After the step of forming a buried region, by a CVD method, the P-type semiconductor layer SL is grown epitaxially over the semiconductor substrate SUB. Regarding respective raw materials, for example, trichlorosilane (SiHCl$_3$) is used as a silicon raw material, and diborane (B$_2$H$_6$) is used as a P-type impurity raw material.

Next, as in FIGS. 9A, 9B and 9C, over the semiconductor layer SL, a photoresist layer (not shown) is formed. The photoresist layer is selectively removed by exposure and development. Next, using the photoresist layer as a mask, by ion implantation, a P-type impurity is implanted into an implantation region (IR1) to be the source offset region SOS and the drain, offset region DOS in the semiconductor layer SL. Moreover, an N-type impurity is implanted into an implantation region (IR2) to be the N-type deep well region DWL in the semiconductor layer SL. The P-type impurity is, for example, B (boron) The N-type impurity is, for example, P (phosphorous). Next, the photoresist layer is removed by ashing. On this occasion, a naturally oxidized film NO may be formed over the semiconductor layer SL.

Subsequently, as in FIGS. 10A, 10B and 10C, a heat treatment is performed to activate the P-type impurity and the N-type impurity. On this occasion, the impurities are diffused thermally in the semiconductor layer SL.

As described above, a P-type impurity is introduced into positions separated from each other in the semiconductor layer SL to form the source offset region SOS and the drain offset region DOS (the above, a step of forming an offset region). At this time, the well region DWL is also formed.

Next, as in FIGS. 11A, 11B and 11C, prior to a step of forming a trench part to be described later, the field insulating film FIF is formed at least in a position between the source region SR and the drain region DR in plan view in the semiconductor layer SL (a step of forming a field insulating film). For example, in a manner below, the field insulating film FIF is formed by a LOCOS method. Over the semiconductor layer SL, an SiN film (not shown) is formed. Next, by selectively removing the SiN film, only regions in which the source region SR and the drain region DR are to be formed in plan view are left in the SiN film. Next, thermal oxidation is performed. Next, the SiN film is removed. Consequently, the field insulating film FIF is formed so as to have an opening part (the numeral thereof is not shown) in regions in which the source region SR and the drain region DR are to be formed and to cover parts other than the opening part in plan view in the semiconductor layer SL.

Subsequently, as in FIGS. 12A, 12B and 12C, over the semiconductor layer SL and over the field insulating film FIF, a mask layer ML1 and a mask layer ML2 are formed. For the opening of the field insulating film FIF, an oxide film (the numeral thereof is not shown) may be formed. The mask layer ML1 and the mask layer ML2 are preferably formed of a material having an etching rate lower than that of the semiconductor layer SL under conditions for etching the semiconductor layer SL. Specifically, the mask layer ML1 is formed of SiN, and the mask layer ML2 is formed of SiO$_2$. By providing at least the mask layer ML1, in a step of forming a gate insulating film to be described later, the oxidation of the semiconductor layer SL1 can be suppressed.

Next, in FIGS. 12A, 12B and 12C again, by selectively removing the mask layer ML1 and the mask layer, ML2, an opening part (not shown) is formed in a region where the trench part GT is to be formed (a step of forming a trench part). The opening part is formed in a position between the source offset region SOS and the drain offset region DOS at least in plan view in the semiconductor layer SL. The shape of the opening part in plan view is a rectangle having the long side in the direction from the source offset region SOS toward the drain offset region DOS in plan view. Next, for example, by an RIE (Reactive Ion Etching) method, the trench part GT is formed using the mask layer ML1 and the mask layer ML2 as a mask.

In the step of forming the trench part, the trench part GT is formed inside the field insulating film FIF in plan view. Consequently, the breakdown voltage of the semiconductor device SD can be improved.

Figure 13:
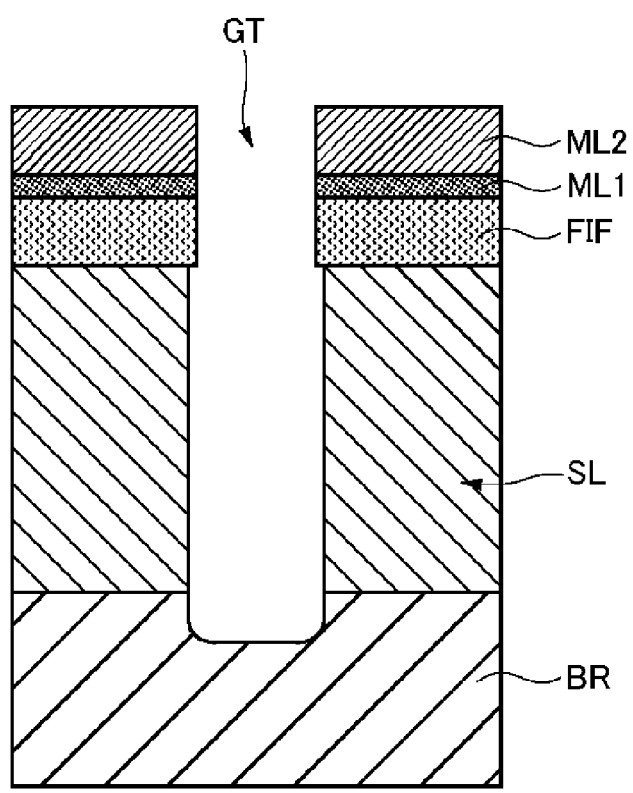
FIG. 13 is a cross-sectional view for explaining the method of manufacturing the semiconductor device according to the first embodiment.

Here, FIG. 13 is an expanded drawing of FIG. 12C. As in FIG. 13, in the step of forming the trench part, the side surface of the trench part GT may be etched more in the lateral direction than the end part of the mask layer ML1. Moreover, in the step of forming the trench part, the bottom surface of the trench part GT is made to extend into the buried region BR. Consequently, as described above, it is possible to suppress the concentration of an electric field in the part in which the bottom surface of the trench part GT has extended into the buried region BR.

As described above, in a position between the source offset region SOS and the drain offset region DOS at least in plan view in the semiconductor layer SL, the trench part GT is formed in the direction from the source offset region SOS toward the drain offset region DOS in plan view.

Figure 14:
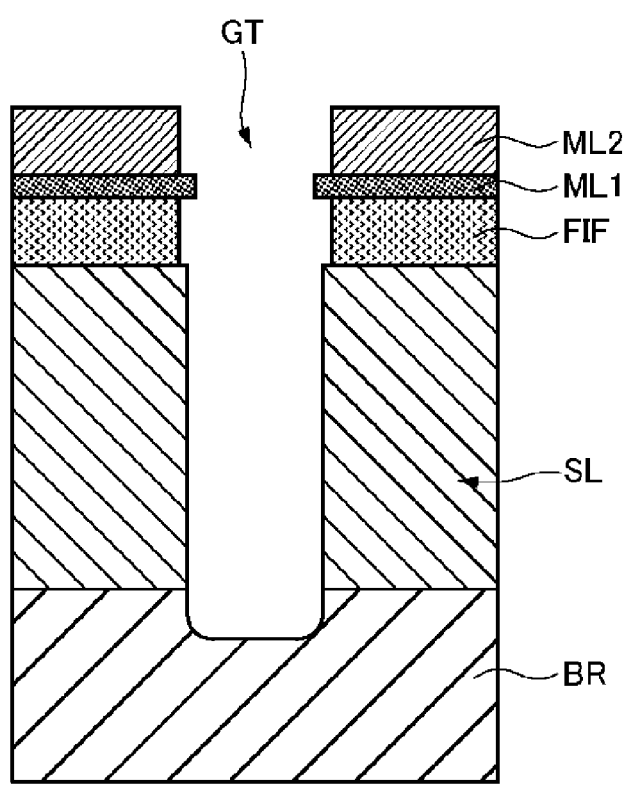
FIG. 14 is a cross-sectional view for explaining the method of manufacturing the semiconductor device according to the first embodiment.

Here, FIG. 14 is a drawing of a post-step of FIG. 13. As in FIG. 14, after the step of forming the trench part and before a step of forming a gate insulating film to be described later, a part of the field insulating film FIF is removed to widen the opening width of the field insulating film FIF in the trench part GT wider than the width of a part lying at the upper end of the semiconductor layer SL in the trench part GT. In other words, in the trench part GT, the opening width of the field insulating film FIF is widened wider than the opening width of the semiconductor layer SL. Consequently, as will be described later, the upper end width of the gate electrode GE can be made wider than the lower end width.

On this occasion, a part of the field insulating film FIF is removed selectively by, for example, wet etching. Incidentally, when the field insulating film FIF and the mask layer ML2 are formed of the same material, the mask layer ML2 is also etched.

Next, as in FIGS. 15A, 15B and 15C, on the side surface and the bottom surface of the trench part GT, a gate insulating film GI is formed (a step of forming a gate insulating film).

In the step of forming a gate insulating film, by subjecting the side surface and the bottom surface of the trench part GT to thermal oxidation, the gate insulating film GI is formed. Consequently, a pinhole-free gate insulating film GI can be formed stably.

Here, FIG. 16 is an expanded cross-sectional view of FIG. 15C. As in FIG. 16, by thermal oxidation, the gate insulating film GI is grown along the side surface and the bottom surface of the trench part GT. The gate insulating film GI is formed being inclined in an arc shape with the center at the corner part of the upper end of the semiconductor layer SL that is in contact with the trench part GT. Consequently, it is possible to form the gate electrode GE while extending it in the first direction and the opposite second direction above the upper surface of the semiconductor layer SL.

By adjusting the opening width of the field insulating film FIF in the step shown in FIG. 14 and the thickness of the gate insulating film GI in the step of forming the gate insulating film, the upper end width of the gate electrode GE to be described later is adjusted.

Next, as described below, at least in the trench part GT, the gate electrode GE is formed (a step of forming a gate electrode). As in FIGS. 17A, 17B and 17C, the conductive material CM is formed so as to be in contact with the gate insulating film GI over the semiconductor layer SL and in the trench part GT. Here, for example, by a CVD method, polysilicon is formed as a conductive material CM while doping a P-type impurity into it. Incidentally, the conductive material CM is preferably formed until all the inside of the trench part GT is buried with it.

Here, FIG. 18 is an expanded cross-sectional view of FIG. 17C. As in FIG. 18, the conductive material CM grows along the shape of the trench part GT. At the center of the trench part GT, conductive materials CM on both sides join gradually and the whole of the trench part GT is buried with the conductive material. On this occasion, at the center part of the upper end of the trench part GT, a concave part of the conductive material CM may be formed.

Figure 19:
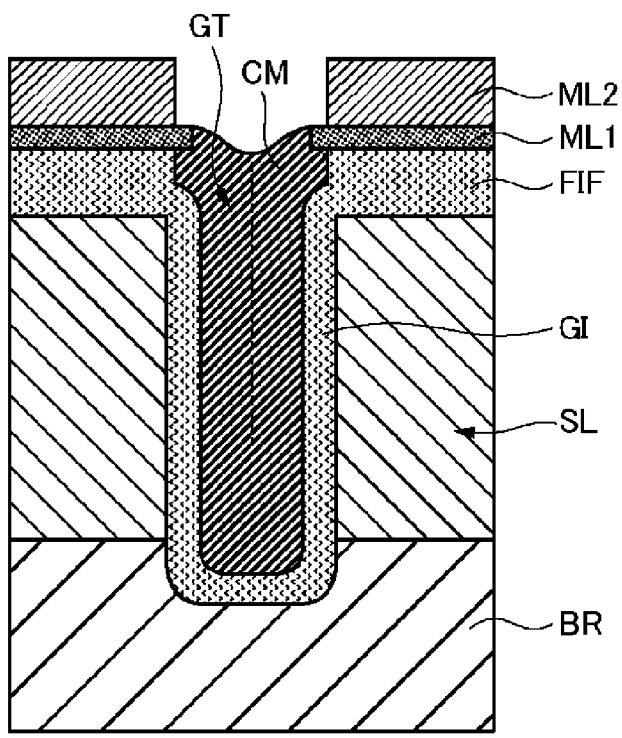
FIG. 19 is a cross-sectional view for explaining the method of manufacturing the semiconductor device according to the first embodiment.

FIG. 19 shows a post-step of FIG. 18. As in FIG. 19, in the step of forming the gate electrode, for example, by dry etching, the surface layer of the conductive material CM is removed. Moreover, by what is called etch-back, the conductive material CM is removed from the surface layer side to leave the conductive material CM only in the trench part GT. On this occasion, at the center part of the upper end of the trench part GT, a concave part of the conductive material CM is still left.

Here, as another method for removing the surface layer of the conductive material CM, a CMP (Chemical Mechanical Polishing) method is considered. According to the CMP method, the upper end of the trench part GT is flattened and thus the concave part at the upper end of the trench part GT is not formed. However, there are such problems that a CMP apparatus is expensive and also requires a high running cost.

In contrast, when dry etching is used, the concave part in the conductive material CM remains at the center part of the upper end of the trench part GT. However, a dry etching apparatus is inexpensive as compared with a CMP apparatus, and also requires a low running cost. Moreover, the dry etching apparatus can be linked to a CVD apparatus for forming the conductive material CM.

In the above step of forming a gate electrode, for example, the gate electrode GE is formed only in the trench part GT. Consequently, it is possible to suppress the concentration of an electric field at the upper end of the trench part GT.

Here, in the first embodiment, by disposing the contact GC in a prescribed position, it is possible to suppress the rise in the contact resistance irrespective of presence or absence of the concave part of the gate electrode GE. That is, in the first embodiment, there is no dependency on an apparatus for removing the surface layer of the conductive material CM. Accordingly, in the first embodiment, it is possible to use dry etching in the step of removing the surface layer of the conductive material CM. Consequently, semiconductor devices SD can be manufactured at a low cost.

Figure 20:
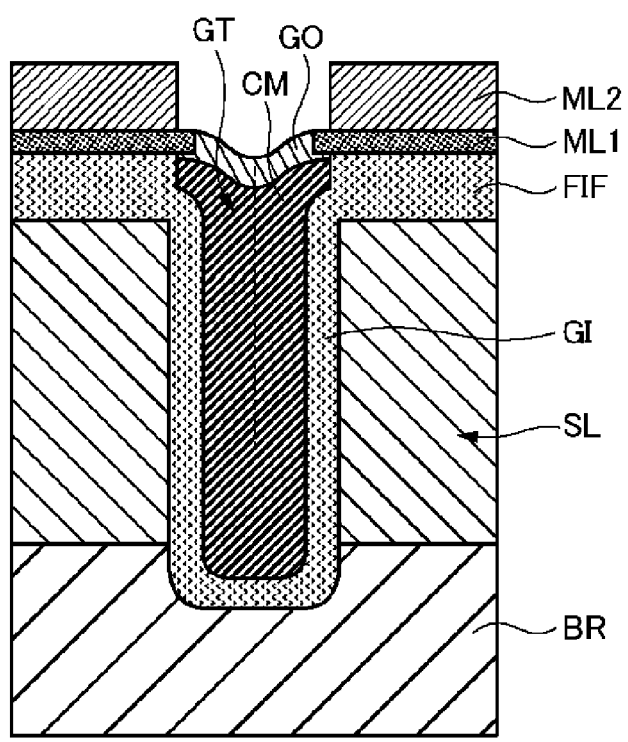
FIG. 20 is a cross-sectional view for explaining the method of manufacturing the semiconductor device according to the first embodiment.
Figure 21A:
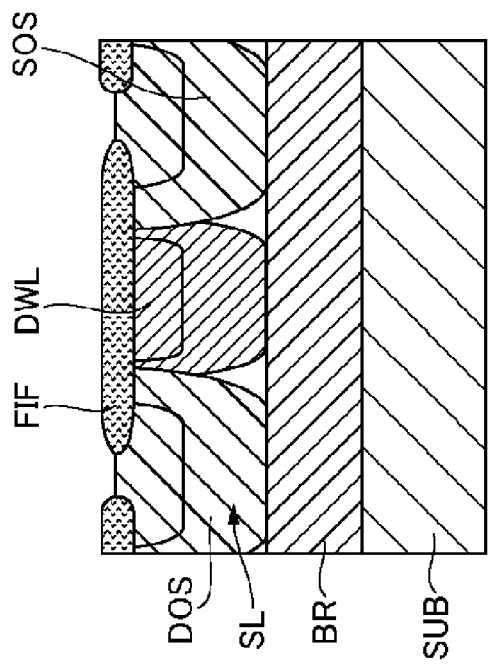
FIGS. 21A to 21C are cross-sectional views for explaining the method of manufacturing the semiconductor device according to the first embodiment.
Figure 21B:
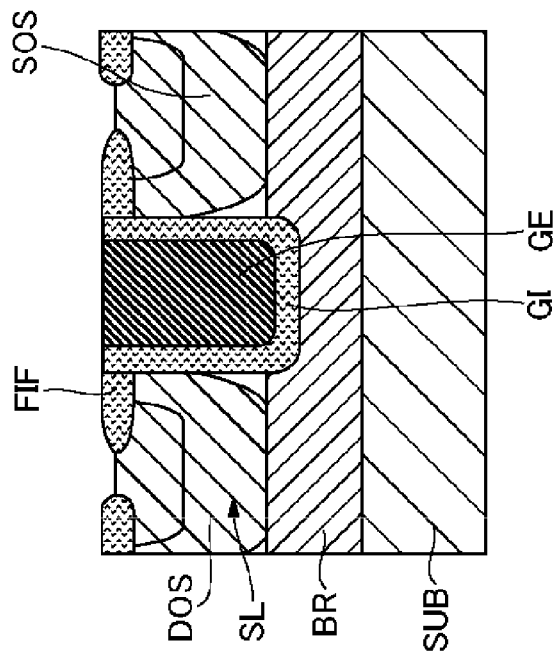
Figure 21C:
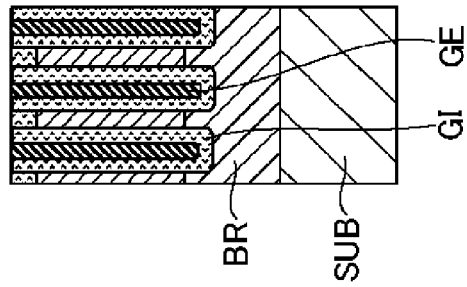
Figure 22:
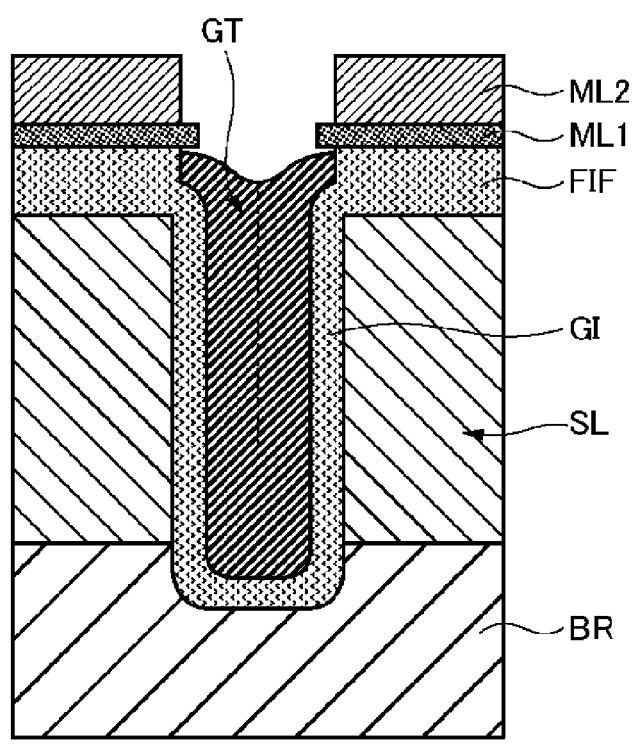
FIG. 22 is a cross-sectional view for explaining the method of manufacturing the semiconductor device according to the first embodiment.

Next, FIG. 20 shows a post-step of FIG. 19. As in FIG. 20, in the step of forming a gate electrode, only the surface layer of the conductive material CM is thermally oxidized. Consequently, a thermally oxidized layer GO is formed. On this occasion, by adjusting regions to be oxidized, the conductive material CM is left in a position between from the upper surface of semiconductor layer SL to the field insulating film FIF.

Subsequently, as in FIGS. 21A, 21B and 21C, and FIG. 22, by wet etching, the oxidized surface layer of the conductive material CM is removed. Next, for example, by wet etching, the mask layer ML2 and the mask layer ML1 are removed. As a result of the above, the gate electrode GE is formed only in the trench part GT in plan view (the above, a step of forming a gate electrode). On this occasion, the oxide layer on the surface of the gate electrode GE is removed and the surface is smoothed. Accordingly, the contact resistance between the gate electrode GE and the contact GC can be lowered.

Next, as in FIGS. 3A, 3B and 3C, using the field insulating film FIF, the gate insulating film GI and the gate electrode GE, or a photoresist layer as a mask, a P-type impurity is introduced to form the P-type well region WL1, source region SR and drain region DR. Moreover, using a photoresist layer as a mask, an N-type well region (WL2) and the back gate region BG are formed.

Further, as in FIGS. 3A, 3B and 3C, for example, by a CVD method, over the semiconductor layer SL, the field insulating film FIF and the gate electrode GE, the interlayer insulating film IF1 is formed.

Next, in the interlayer insulating film IF1, in positions overlapping the gate electrode GE, the back gate region BG, the source region SR or the drain region DR in plan view, a contact hole (not shown) is formed. On this occasion, in the interlayer insulating film IF1, a contact hole (not shown) to be coupled to the gate electrode GE is formed in a position shifted in the first direction relative to the centerline in the trench part GT extending in the source-drain direction in plan view.

Subsequently, over the interlayer insulating film IF1 and in the contact hole, a metal is formed. The metal contains, for example, Al. Next, by selectively removing the metal, the via VA (the contact GC) and the interconnection IC1 are formed integrally.

On this occasion, as in FIG. 4, the contact GC in contact with the gate electrode GE is formed in a position shifted in the first direction perpendicular to the source-drain direction relative to the centerline in the trench part GT extending in the source-drain direction in plan view in the interlayer insulating film IF1, and so as to be disposed within the trench part GT in plan view. Consequently, the contact GC is formed with its center shifted from the concave part of the gate electrode GE (the above, a step of forming a contact).

Incidentally, the step of forming a contact may be performed by a damascene method. The interconnection IC1 may also be formed by a damascene method.

Further, over the interlayer insulating layer IF1 and the interconnection IC1, a plurality of interconnection layers may be formed to form a multilayer interconnection structure. On the uppermost layer of the multilayer interconnection structure, for example, an electrode pad EP, a bump electrode (not shown) or a Cu pillar (not shown) may be formed.

As a result of the above, the semiconductor device SD according to the first embodiment can be formed.

Next, the effect of the first embodiment will be explained.

First, an explanation is given on problems in a transistor structure in which the gate electrode GE is provided in the trench part GT. As a first problem, when the contact GC is disposed over the concave part of the gate electrode GE, the contact resistance may rise due to two causes.

As a first cause, resistance near the concave part of the gate electrode GE may be high. When the contact GC is disposed in such a concave part, a minute cavity may be formed between the concave part of the gate electrode GE and the contact GC. The cavity occasionally does not allow a sound ohmic connection to be formed. Due to such first cause, the contact resistance may rise. Moreover, gas in the film forming may remain in the cavity to generate a fault after the manufacturing.

As a second cause, rise in the aspect ratio of the contact GC due to the concave part is considered.

Figure 23:
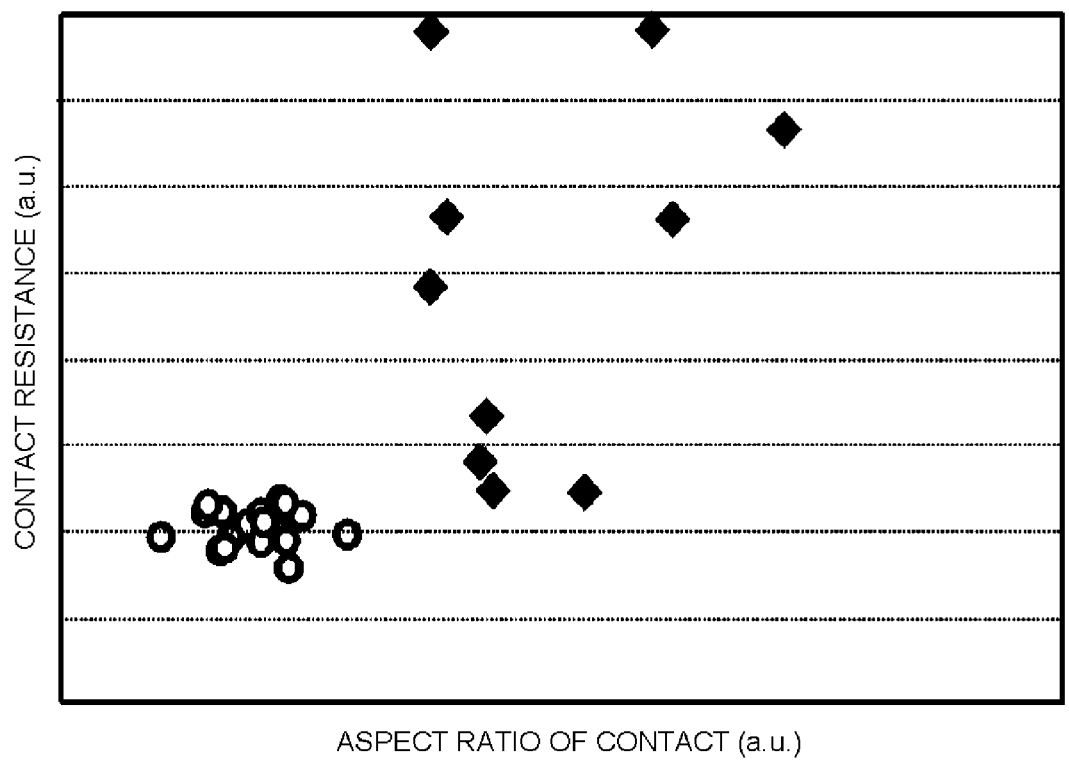
FIG. 23 is a drawing showing the relation between the aspect ratio of a contact and the contact resistance.

FIG. 23 is a drawing showing the relation between the aspect ratio of the contact GC and the contact resistance. In FIG. 23, the aspect ratio of the contact GC is a ratio of the height of the contact GC relative to the diameter of the contact GC (height/diameter) The height of the contact GC corresponds to the thickness of the interlayer insulating film IF1.

As in FIG. 23, the contact resistance tends to vary with the rise in the aspect ratio of the contact GC. When the aspect ratio of the contact GC is less than a prescribed value, the contact resistance takes a value within a prescribed range. On the other hand, when the aspect ratio of the contact GC is not less than a prescribed value, the contact resistance varies widely at high values.

When a concave part has been formed at the upper end of the gate electrode GE, it corresponds to that the interlayer insulating film IF1 over the concave part is to be formed thicker by the depth of the concave part. When the contact GC is disposed over the concave part, the aspect ratio of the contact GC substantially becomes high. On this occasion, as shown in FIG. 23, the contact resistance may vary at high values.

Due to the above-mentioned two causes, the contact resistance may rise when the contact GC is disposed over the concave part of the gate electrode GE.

Further, as a second problem, when the contact GC protrudes out of the trench part GT due to misalignment, the contact GC lies near the end part of the trench part GT in the semiconductor layer SL, which may result in the concentration of an electric field. In this case, the breakdown voltage of the semiconductor device SD is lowered.

In contrast, according to the first embodiment, the contact GC coupled to the gate electrode GE is disposed, shifted in the first direction perpendicular to the source-drain direction relative to the centerline in the trench part GT extending in the source-drain direction in plan view. That is, so as to avoid the concave part of the gate electrode GE, the contact GC has been coupled. Consequently, the rise in the contact resistance can be suppressed.

Further, the contact GC is disposed, shifted in the first direction, and is provided in the trench part GT in plan view. In other words, the contact GC also does not protrude to the outside of the trench part GT. Accordingly, it is possible to suppress the concentration of an electric field near the end part of the trench part GT in the semiconductor layer SL.

As described above, according to the first embodiment, it is possible to satisfy both the suppression of the rise in the contact resistance and the improvement of the breakdown voltage near the end part of the trench part GT.

Figure 24A:
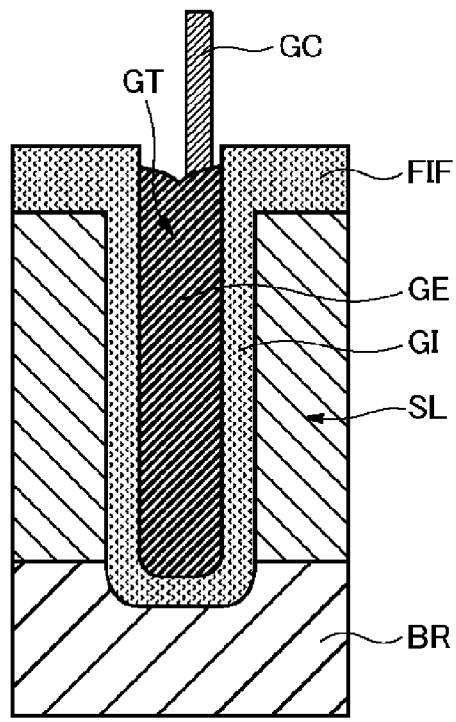
FIGS. 24A to 24D are cross-sectional views for explaining preferable modes of the first embodiment.
Figure 24B:
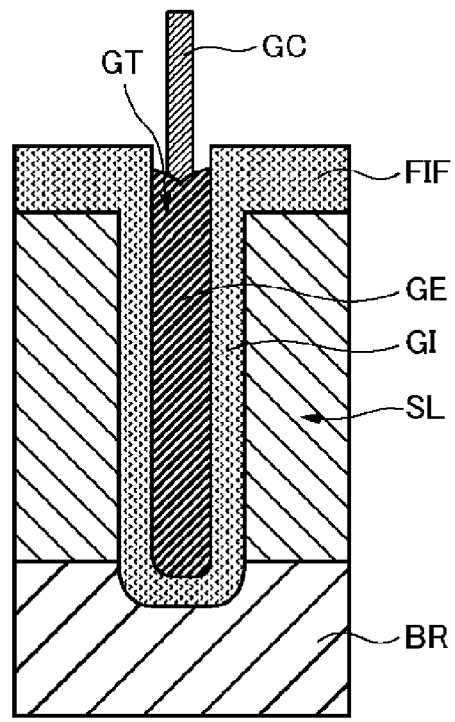
Figure 24C:
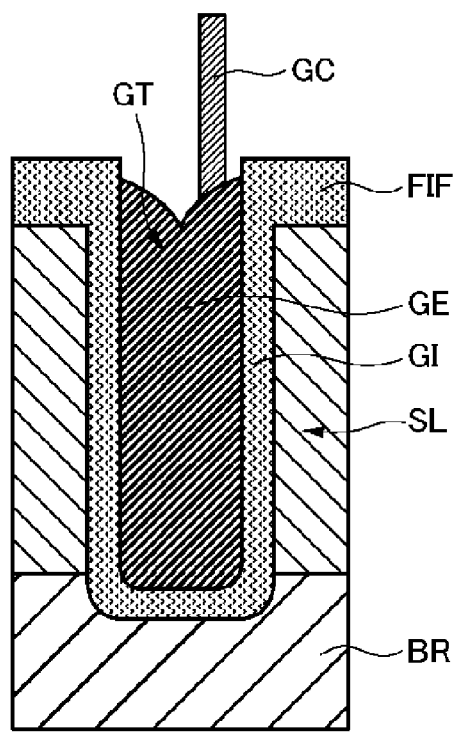
Figure 24D:
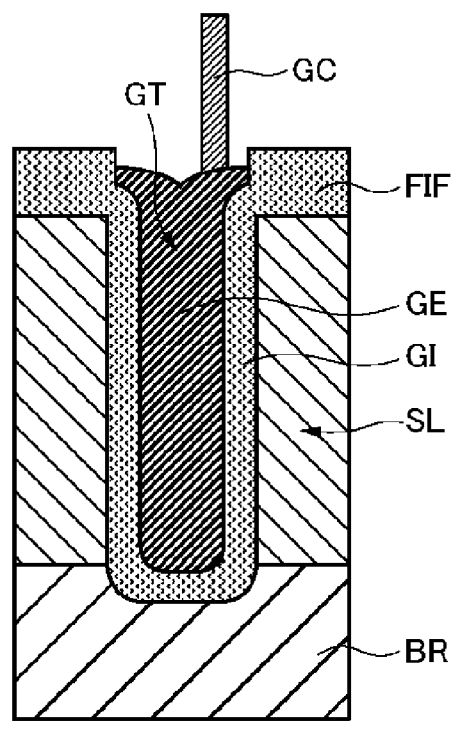

Next, using FIGS. 24A to 24D, a preferable mode of the first embodiment will be explained, with the comparison with Comparative examples. FIGS. 24A to 24D are cross-sectional views for explaining a preferable mode of the first embodiment. Each of FIGS. 24A to 24D is an expanded cross-sectional view of corresponding part in FIG. 3C. FIG. 24A shows a mode in Comparative example 1, FIG. 24B shows a mode in Comparative example 2, FIG. 24C shows a mode in Comparative example 3, and FIG. 24D shows a preferable mode in the first embodiment.

Here, the shape of the concave part formed at the upper end of the gate electrode GE depends on the width of the trench part GT. With the increase in the width of the trench part GT, the concave part of the gate electrode GE tends to become deeper.

In Comparative example 1 in FIG. 24A, the trench part GT is formed in an intended width (for example, a constant width) from the upper end to the lower end. On the other hand, the contact GC is disposed, shifted from the centerline in the trench part GT. In Comparative example 1, the contact GC may protrude to the outside of the trench part GT due to misalignment. In this case, as described above, because the contact GC lies near the end part of the trench part GT in the semiconductor layer SL, an electric field may be concentrated.

In Comparative example 2 in FIG. 24B, so that the concave part of the gate electrode GE becomes shallow, the trench part GT is formed in an intended narrow width from the upper end to the lower end. The contact GC is disposed over the centerline in the trench part GT. In the case of Comparative example 2, too, as in Comparative example 1, the contact GC may protrude to the outside of the trench part GT. Moreover, in Comparative example 2, since there is such a case that the concave part of the gate electrode GE remains, the contact resistance may rise.

In Comparative example 3 in FIG. 24C, so that the contact GC does not protrude to the outside of the trench part GT even when misalignment occurs, the trench part GT is formed in an intended wide width (for example, a constant width) from the upper end to the lower end. FIG. 24C shows a case where misalignment has occurred. In Comparative example 3, since the width of the trench part GT is wide, the concave part of the gate electrode GE may be formed deeply. In this case, the aspect ratio of the contact GC substantially becomes high. Accordingly, as shown in FIG. 23, in Comparative example 3, the contact resistance may vary at high values.

FIG. 24D shows a preferable mode of the first embodiment. In this case, the upper end width in the first direction is wider than the lower end width in the gate electrode GE. Consequently, in the first embodiment, it is possible to suppress the contact GC from protruding to the outside of the gate electrode GE even when the contact GC is disposed, shifted from the centerline of the trench part GT. Accordingly, in the preferable mode of the first embodiment, the contact GC can be coupled stably to the gate electrode GE.

Second Embodiment

Figure 25:
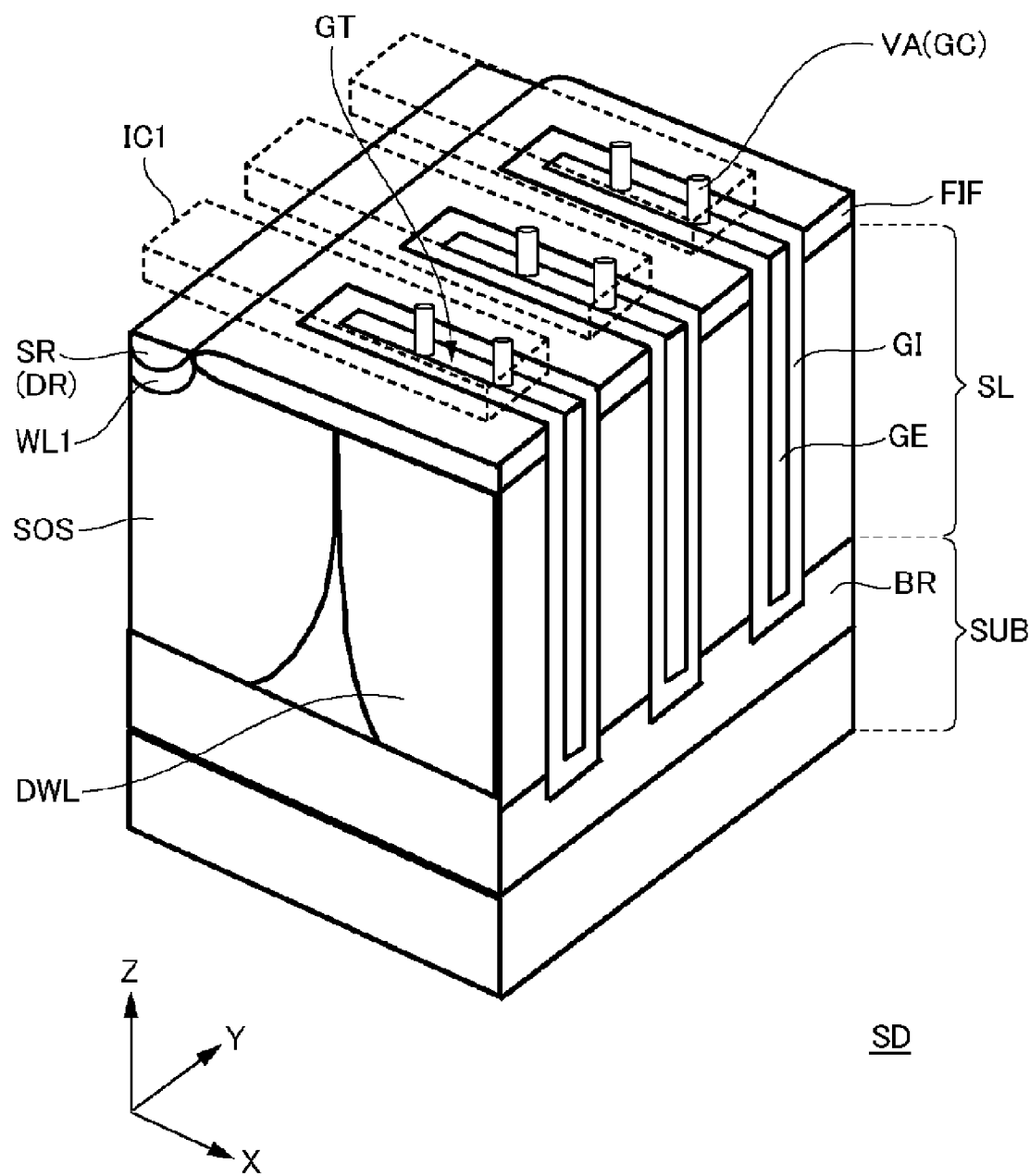
FIG. 25 is a perspective view showing the configuration of a semiconductor device according to a second embodiment.

FIG. 25 is a perspective view showing the configuration of the semiconductor device SD according to a second embodiment. The second embodiment is the same as the first embodiment, except that the arrangement of the interconnection IC1 connected with the gate electrode GE is different. Hereinafter, details will be explained.

As in FIG. 25, the interconnection IC1 connected with the gate electrode GE may be provided toward the source-drain direction (the Y direction) from the source region SR toward the drain region DR. In other wards, the interconnection IC1 is provided, extending in the direction parallel to the long side direction of the trench part GT.

Moreover, the interconnection IC1 connected with the gate electrode GE is separated in a position overlapping the channel region in plan view. In the second embodiment, the area overlapping the channel region in plan view in the interconnection IC1 is smaller than that in the first embodiment.

Incidentally, in the second embodiment, the source region SR and the drain region DR are connected with an interconnection (not shown) lying above the interconnection IC1 through a via (not shown) provided in a region not shown.

According to the second embodiment, the same effect as that in the first embodiment can be obtained.

Here, when the interconnection IC1 connected with the gate electrode GE is provided over a position overlapping the channel region in plan view, an electric field in the channel region may be influenced. For example, the electric field may concentrate near the upper end of the trench part GT, as in the case where the gate electrode GE covers a position between the trench parts GT.

In contrast, according to the second embodiment, the interconnection IC1 connected with the gate electrode GE is provided, extending in the direction parallel to the long side direction of the trench part GT. Consequently, it is possible to suppress the electric field of the channel region from being influenced by the potential of the interconnection IC1.

Third Embodiment

Figure 26:
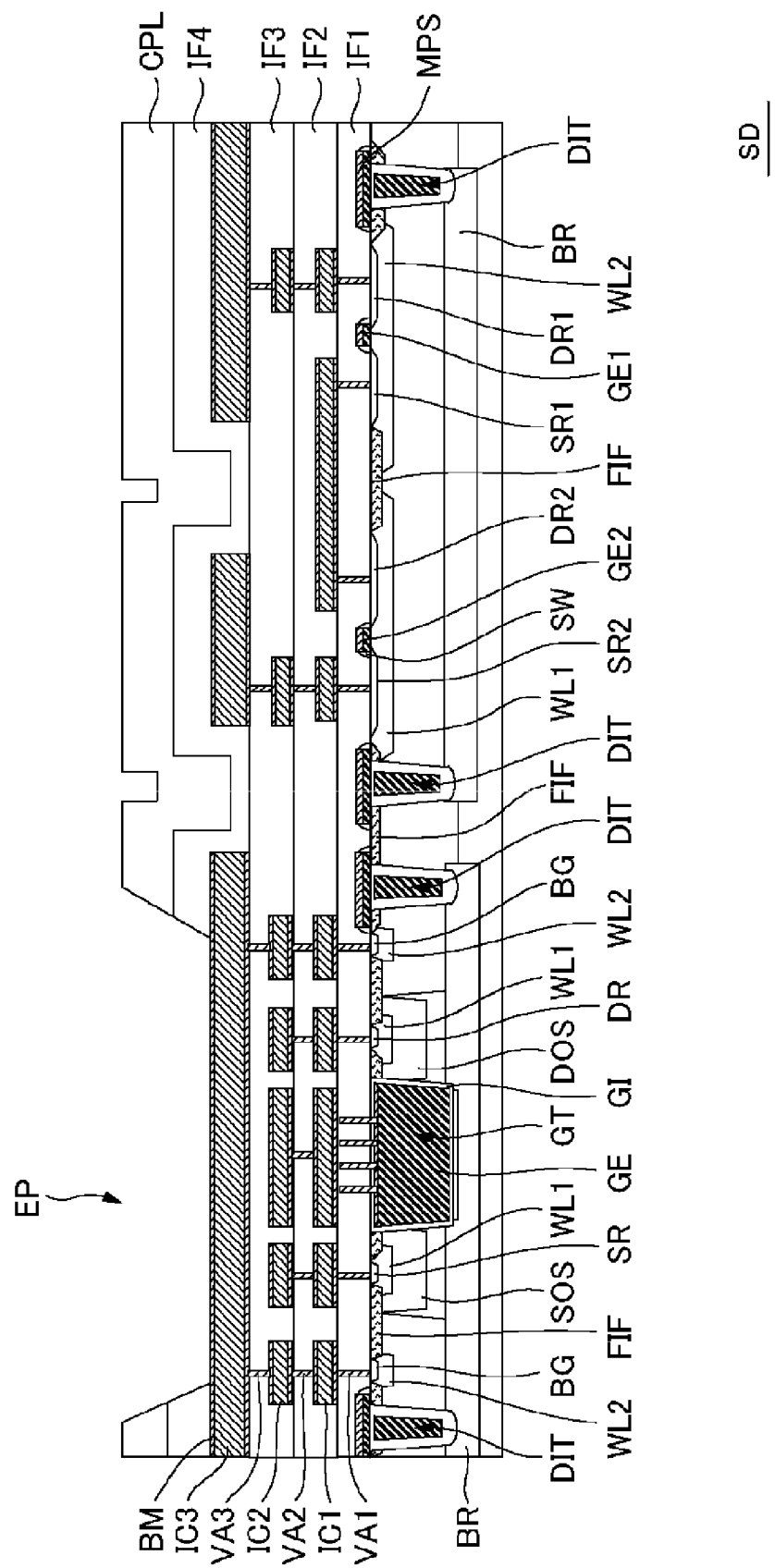
FIG. 26 is a cross-sectional view showing the configuration of a semiconductor device according to a third embodiment.

FIG. 26 is a cross-sectional view showing the configuration of the semiconductor device SD according to a third embodiment. The third embodiment is the same as the first embodiment except that an ordinary FET, in which no trench part GT is provided, is formed in the same semiconductor layer SL. Hereinafter, details will be explained.

FIG. 26 is a drawing showing the cross-section in FIG. 3B, with other regions added. In FIG. 26, a transistor on the left side is a first transistor same as in the first embodiment. The first transistor includes, as in the first embodiment, the P-type first source region SR, the first drain region DR, the P-type source offset region SOS and the drain offset region DOS, and the first gate insulating film GI and the first gate electrode GE provided for the trench part GT.

On the outside of the first transistor, the N-type back gate region BG is provided. On the lower side of the N-type back gate region BG, the N-type deep well region DWL is provided.

In FIG. 26, a second transistor is provided in the same semiconductor layer SL together with the first transistor, and the second transistor is provided in a position different from that of the first transistor in plan view. The second transistor has, for example, an ordinary MISFET (Metal Insulator Semiconductor FET) structure in which no trench part GT is formed.

The second transistor of an ordinary FET may be provided in plural number. Here, as the second transistor, for example, an N channel-type FET and a P channel-type FET are provided. For example, adjacent to the first transistor, the second transistor of an N channel-type FET is provided. Further, adjacent to the N channel-type FET, the second transistor of a P channel-type FET is provided.

The second transistor of a P channel-type FET lying on the right side in the drawing includes a P-type second source region SR1 and a second drain region DR1, a second gate insulating film (the numeral thereof is not shown), and a second gate electrode GE1. The P-type second source region SR1 and second drain region DR1 are provided separately from each other in the semiconductor layer SL. Adjacent to the P-type second source region SR1 and second drain region DR1, an extension region (not shown) may be provided.

The second gate insulating film is provided over a position sandwiched between the P-type second source region SR1 and second drain region DR1. The second gate electrode GE1 is provided over the second gate insulating film. On the side wall of the second gate electrode GE1, a side wall insulating film SW is provided.

Here, in the second source region SR1 and the second drain region DR1 of the second transistor, the same impurity as that in the first source region SR and the second drain region DR of the first transistor has been introduced. The P-type impurity is, for example, B (boron). Consequently, the manufacturing step can be simplified.

The second transistor of an N channel-type FET includes an N-type second source region SR2 and a second drain region DR2, a second gate insulating film (the numeral thereof is not shown), and a second gate electrode GE2, in the same manner as the P channel-type FET.

In addition, as in FIG. 26, a following configuration is provided as an element isolation region.

A trench part DIT for element isolation is provided between the first transistor and the second transistor. The trench part DIT for element isolation is formed in the same depth as that of the trench part GT provided for the first transistor. Incidentally, between the P-channel type FET and the N-channel type FET in the second transistor, the trench part DIT for element isolation may not be provided.

A trench insulating film (the numeral thereof is not shown) covers the side surface and the bottom surface of the trench part DIT for element isolation. The trench insulating film (the numeral thereof is not shown) is formed of the same material as that of the gate insulating film GI. Here, for example, the trench insulating film is a thermally-oxidized film of silicon.

A trench embedding film (the numeral thereof is not shown) is provided only in the trench part DIT for element isolation in plan view. The trench embedding film is in contact with the trench insulating film, and is formed of the same conductive material as that of the gate electrode GE.

As described above, the element isolation region can be formed by the same configuration as that of the trench part GT, the gate insulating film GI and the gate electrode GE.

Incidentally, over the trench part DIT for element isolation, a mask layer MPS may be provided by the same material as that of the second gate insulating film and the second gate electrode GE1 in the second transistor. In this case, on the side wall of the mask layer MPS, the same side wall insulating film as that of the second transistor is preferably formed.

Moreover, as in FIG. 26, over the semiconductor layer SL, for example, a multilayer interconnection layer is formed.

Over the semiconductor layer SL, the interlayer insulating film IF1 is provided. In the interlayer insulating film IF1, vias VA1 coupled to the first transistor and the second transistor are provided. Incidentally, the contact GC coupled to the gate electrode GE of vias VA1 is disposed, shifted in the first direction from the centerline in the trench part GT, as in the first embodiment. Over the interlayer insulating film IF1, the interconnection IC1 is provided.

Further, over the interlayer insulating film IF1, a plurality of interlayer insulating films (IF2, IF3 and IF4) is provided. For each of the interlayer insulating films, a via VA2, an interconnection IC2, a via VA3 and an interconnection IC3 are provided. On the side surface and the bottom surface of the via, and on the bottom surface and the upper surface of the interconnection, the barrier metal layer BM may be provided.

In addition, over the interlayer insulating film IF4, a protective layer CPL is provided. The protective layer CPL is formed, for example, of SiON.

In the interlayer insulating film IF4 and the protective layer CPL, an opening is formed. In the opening, the interconnection IC3 is exposed. Consequently, for a part of the interconnection IC3, the electrode pad EP is formed. Incidentally, over the electrode pad EP, an under bump metal film (not shown) and a bump electrode (not shown) may additionally be provided.

Figure 27:
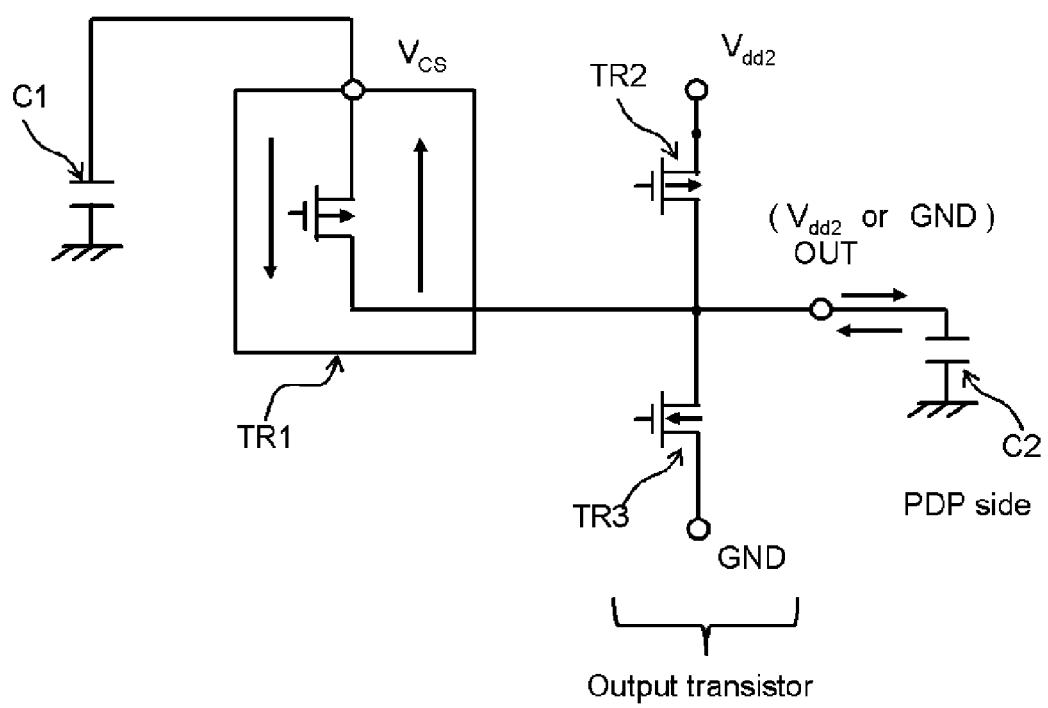
FIG. 27 is a circuit diagram showing an example of the semiconductor device according to the third embodiment.

Next, using FIG. 27, a circuit in the semiconductor device SD according to the third embodiment will be explained. FIG. 27 is a circuit diagram showing an example of the semiconductor device SD according to the third embodiment.

The semiconductor device SD according to the third embodiment is, for example, a data driver IC of a PDP (Plasma Display Panel). The data driver IC of a PDP has a function of outputting a data pulse corresponding to data displayed on the PDP. Specifically, the semiconductor device SD includes, for example, at least a transistor TR1 for charge collection in the data driver IC of the PDP.

As in FIG. 27, the semiconductor device SD includes, for example, a capacitor C1 for charge collection, the transistor TR1 for charge collection, transistors TR2 and TR3 for output, and a display cell C2.

Here, the transistor TR1 is the first transistor having the trench part GT in FIG. 26. As described above, since the transistor TR1 has the above-mentioned FET structure, it is possible to improve a current capacity and to improve a breakdown voltage.

One end of the capacitor C1 is grounded, and the other end is coupled to the transistor TR1. The other end of the transistor TR1 is coupled to a position between the transistor TR2 and the transistor TR3.

As described above, the transistor TR1 of a high breakdown voltage is the first transistor, while the transistor TR2 or the transistor TR3, or another transistor (not shown) in a logic circuit is the second transistor in which, for example, no trench part GT is formed.

Incidentally, the transistor TR2 or TR3, or another transistor in a logic circuit may have an LDD (Lightly Doped Drain) structure corresponding to a voltage to be applied.

Transistors TR2 and TR3 are provided in the same semiconductor layer SL together with the transistor TR1, and are provided in positions different from that of the transistor TR1 in plan view. As described above, by providing together the transistor TR1 having the trench part GT and ordinary transistors used for a logic circuit within the same substrate, a circuit area can be reduced.

Moreover, as in FIG. 27, the transistor TR2 and the transistor TR3 are connected in series. One end of the transistor TR2 is connected to a power supply voltage $V_{dd2}$, and the other end is coupled to the transistor TR3. The other end of the transistor TR3 is grounded. Between the transistor TR2 and the transistor TR3, an output terminal (OUT) is provided and is coupled to the display cell C2.

The transistor TR1 functions as a bidirectional switch that collects charges of the display cell C2. By controlling ON/OFF of the transistor TR1, electric charges charged in the display cell C2 of the PDP are collected in the capacitor C1. Consequently, it is possible to collect electric charges accumulated in the display cell C2 during no-light-emission time and to reuse the charges in subsequent emission.

Moreover, in order to perform stable writing for display pixels of the PDP, a high voltage $V_{dd2}$ is required. The $V_{dd2}$ is, for example, not less than 10 V and not more than 60 V. Accordingly, it is particularly effective that the transistor TR1 is the first transistor having the trench part GT.

When the semiconductor device SD according to the third embodiment is, as described above, a data driver IC of the PDP, the semiconductor device SD may additionally have a configuration below. The semiconductor substrate SUB is divided into a plurality of semiconductor chips. The semiconductor chips are mounted over a flexible interconnection substrate (not shown) in a tape-like shape. The bump electrode of the semiconductor chip is connected to the interconnection of the flexible substrate. The semiconductor chip is sealed with a sealing resin. The semiconductor device SD may be, as described above, in what is called a TCP (Tape Carrier Package). Further, an interconnection provided over a glass substrate of the PDP may be connected with an interconnection of a printed board via an anisotropically conductive film.

Next, using FIGS. 28 to 42, a method of manufacturing the semiconductor device SD according to the third embodiment will be explained. FIGS. 28 to 42 are cross-sectional views for explaining the method of manufacturing the semiconductor device SD according to the third embodiment. The method of manufacturing the semiconductor device SD according to the third embodiment is the same as that in the first embodiment except for following points.

Figure 28:
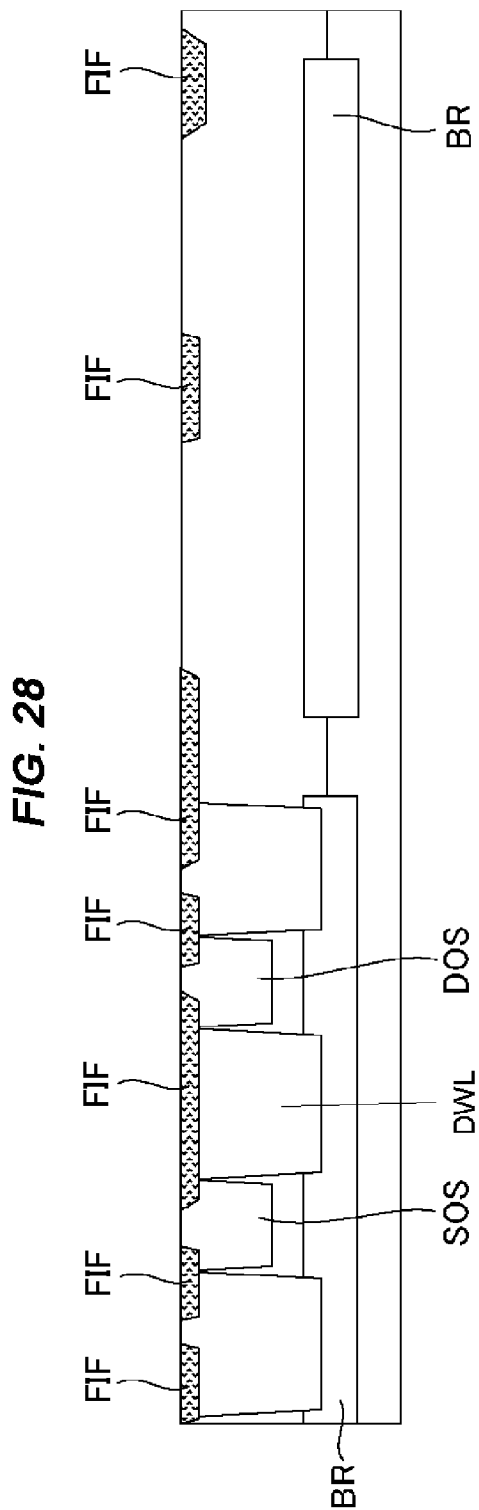
FIG. 28 is a cross-sectional view for explaining the method of manufacturing the semiconductor device according to the third embodiment.

First, in FIG. 28, as in the first embodiment, an N-type impurity is selectively introduced into the semiconductor substrate SUB to form the N-type buried region BR. On this occasion, the buried region BR may not be formed for regions that do not require the buried region BR, such as an element isolation region.

Next, as in FIG. 28, over the semiconductor substrate SUB, the semiconductor layer SL is epitaxially grown. Next, a P-type impurity is implanted into the region of the first transistor in the semiconductor layer SL to form the source offset region SOS and the drain offset region DOS. Next, an N-type impurity is implanted into a region surrounding the first transistor in the semiconductor layer SL to form the deep well region DWL. Next, as in FIG. 28, over the semiconductor substrate, the field insulating film FIF is formed.

Figure 29:
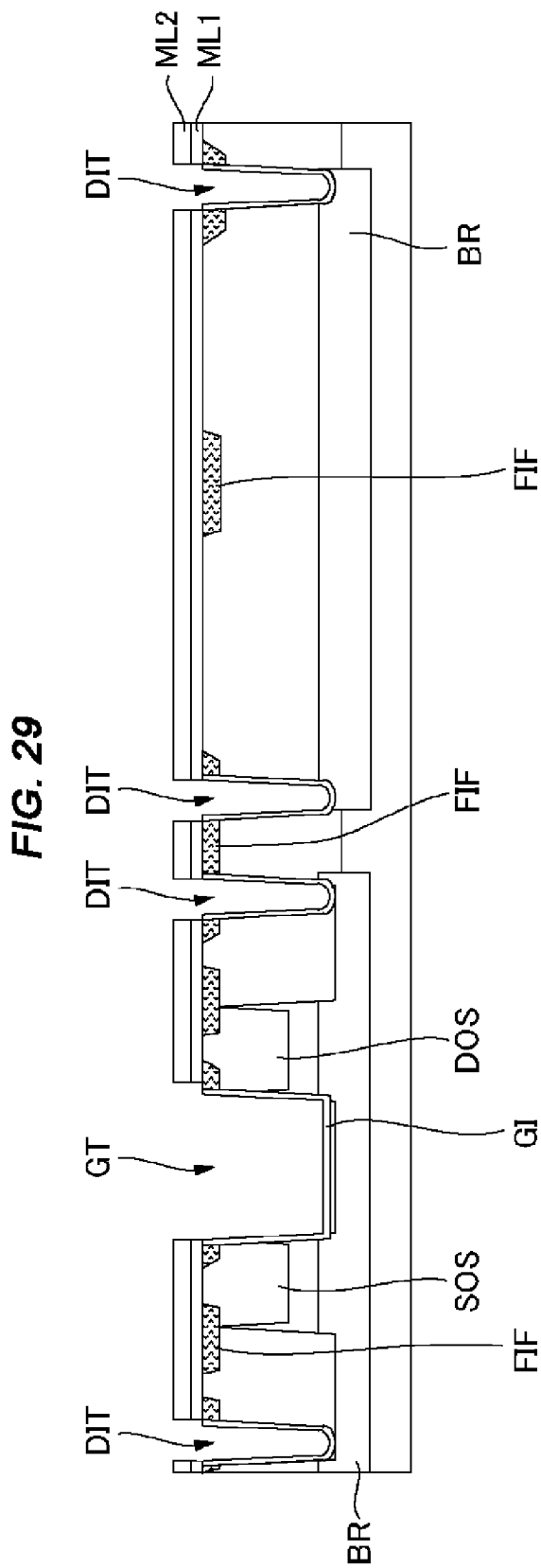
FIG. 29 is a cross-sectional view for explaining the method of manufacturing the semiconductor device according to the third embodiment.

Subsequently, as in FIG. 29, over the semiconductor layer SL and over the field insulating film FIF, the mask layer ML1 and the mask layer ML2 having an opening are formed. Next, using the mask layer ML1 and the mask layer ML2 as a mask, the trench part GT is formed by, for example, an RIE method.

In the step of forming a trench part, the trench part DIT for element isolation having the same depth as that of the trench part GT is formed between the first transistor and the second transistor.

Next, as in the first embodiment, the opening width of the field insulating film FIF in the trench part GT is widened wider than the upper end width of the semiconductor layer SL in the trench part GT. Next, on the side surface and the bottom surface of the trench part GT, the gate insulating film GI is formed.

On this occasion, on the side surface and the bottom surface of the trench part DIT for element isolation, a trench insulating film (the numeral thereof is not shown) is formed of the same material as that of the gate insulating film GI.

Next, the mask layer ML2 and the mask layer ML1 are removed.

Figure 30:
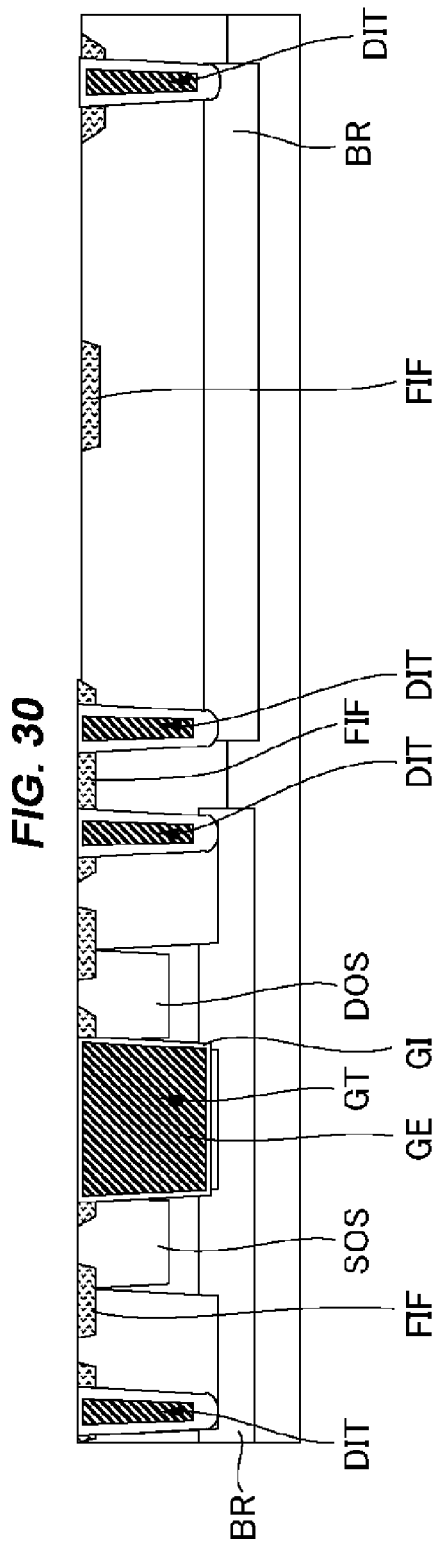
FIG. 30 is a cross-sectional view for explaining the method of manufacturing the semiconductor device according to the third embodiment.

Next, as in FIG. 30, a conductive material (CM) is formed over the semiconductor layer SL and in the trench part GT so as to be in contact with the gate insulating film GI. Next, for example, by dry etching, the surface layer of the conductive material (CM) is removed. Consequently, the gate electrode GE is formed only in the trench part GT.

On this occasion, also in the trench part DIT for element isolation in plan view, a trench embedding film is formed of the same conductive material (CM) as that of the gate electrode GE so as to be in contact with the trench insulating film.

Figure 31:
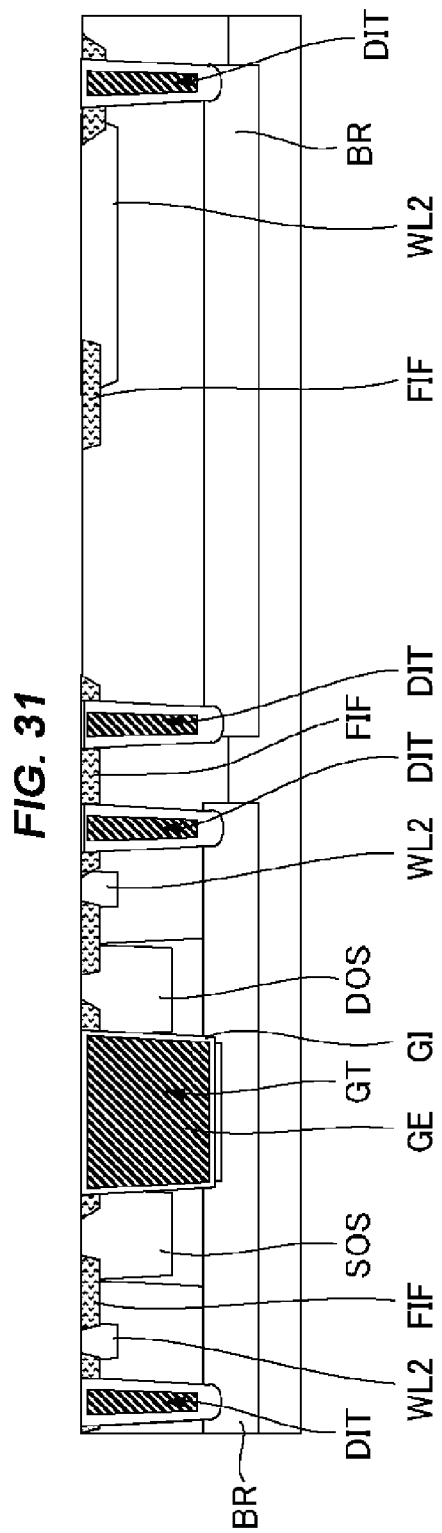
FIG. 31 is a cross-sectional view for explaining the method of manufacturing the semiconductor device according to the third embodiment.

Next, as in FIG. 31, into each of a region to be the back gate region BG in the semiconductor layer SL and a region of a P channel-type FET in the second transistor, an N-type impurity is implanted to form an N-type well region WL2. Incidentally, the depth of the N-type well region WL2 is shallower than the depth of the deep well region DWL. Moreover, the N-type impurity concentration in the N-type well region WL2 is higher than that in the deep well region DWL.

Figure 32:
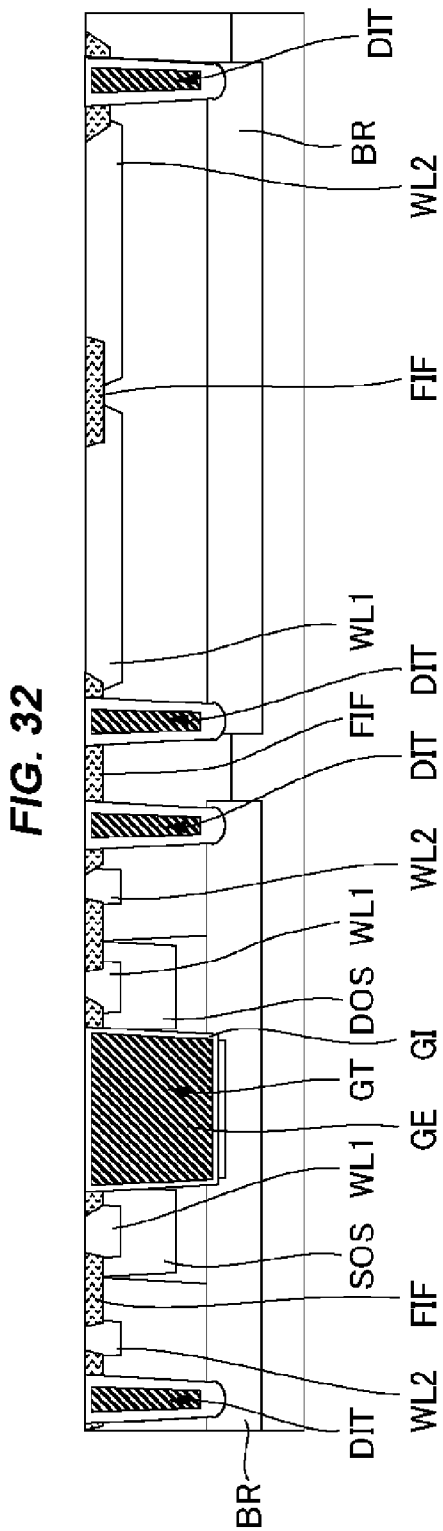
FIG. 32 is a cross-sectional view for explaining the method of manufacturing the semiconductor device according to the third embodiment.

Subsequently, as in FIG. 32, into each of a region overlapping the source offset region SOS and the drain offset region DOS in the semiconductor layer SL, and a region of an N channel-type FET in the second transistor, a P-type impurity is implanted to form the P-type well region WL1. Incidentally, the depth of the P-type well region WL1 is shallower than depths of the source offset region SOS and the drain offset region DOS. The P-type impurity concentration in the P-type well region WL1 is higher than those in the source offset region SOS and the drain offset region DOS. In the same manner as for the P-type well region WL1, the N-type well region WL2 is formed.

Figure 33:
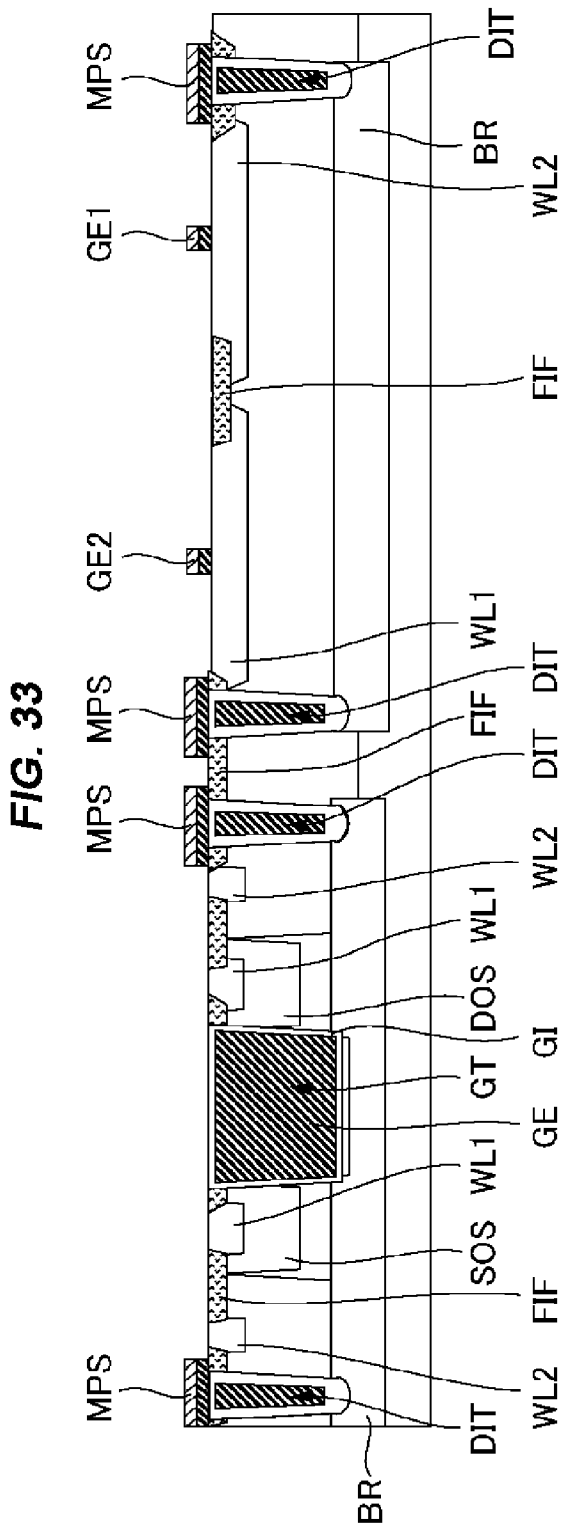
FIG. 33 is a cross-sectional view for explaining the method of manufacturing the semiconductor device according to the third embodiment.

Next, as in FIG. 33, after the step of forming the gate electrode, a second gate insulating film (the numeral thereof is not shown) of the second transistor is formed in a region different from the trench part GT in plan view in over the semiconductor layer SL. Next, over the second gate insulating film, second gate electrodes (GE1 and GE2) are formed.

On this occasion, also over the trench part DIT for element isolation, the mask layer MPS is formed of the same material as that of the second gate insulating film and the second gate electrode.

Figure 34:
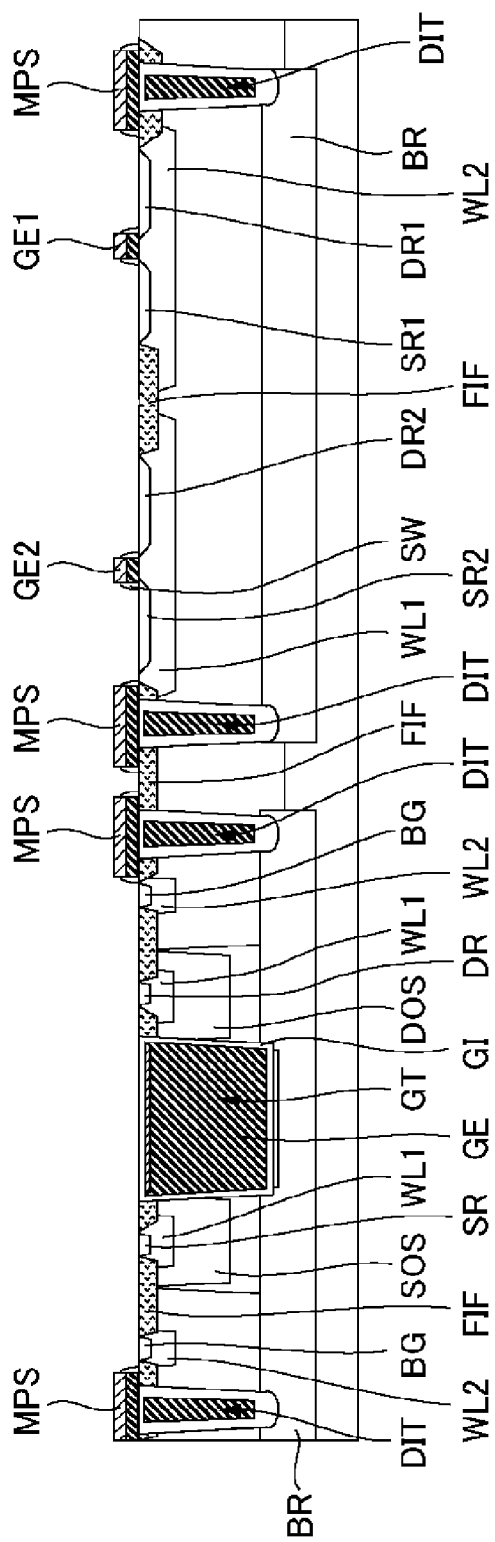
FIG. 34 is a cross-sectional view for explaining the method of manufacturing the semiconductor device according to the third embodiment.

Next, as in FIG. 34, on sidewalls of the second gate insulating film and second gate electrodes (GE1 and GE2), a side wall insulating film (the numeral thereof is not shown) is formed. On this occasion, also on the side wall of the mask layer MPS, the side wall insulating film is formed.

Further, as in FIG. 34, an N-type impurity is implanted into the N-type well region WL2 surrounding the first transistor and the region of an N channel-type FET in the second transistor to form the N-type back gate region BG, and the second source region SR2 and the second drain region DR2. Incidentally, depths of these regions are shallower than the depth of the N-type well region WL2. Moreover, P-type impurity concentrations in these regions are higher than that in the N-type well region WL2.

Next, into regions of P channel-type FETs in the first transistor and the second transistor, a P-type impurity is implanted to form the P-type first source region SR and the first drain region DR, and the second source region SR1 and the second drain region DR1. Incidentally, depths of these regions are shallower than that of the P-type well region WL1. Moreover, P-type impurity concentrations in these regions are higher than that in the P-type well region WL1.

As described above, by forming the first source region SR and the first drain region DR and, at the same time, introducing the same impurity using the second gate insulating film and the second gate electrode GE as a mask, the second source region SR1 and the second drain region DR2 are formed.

Figure 35:
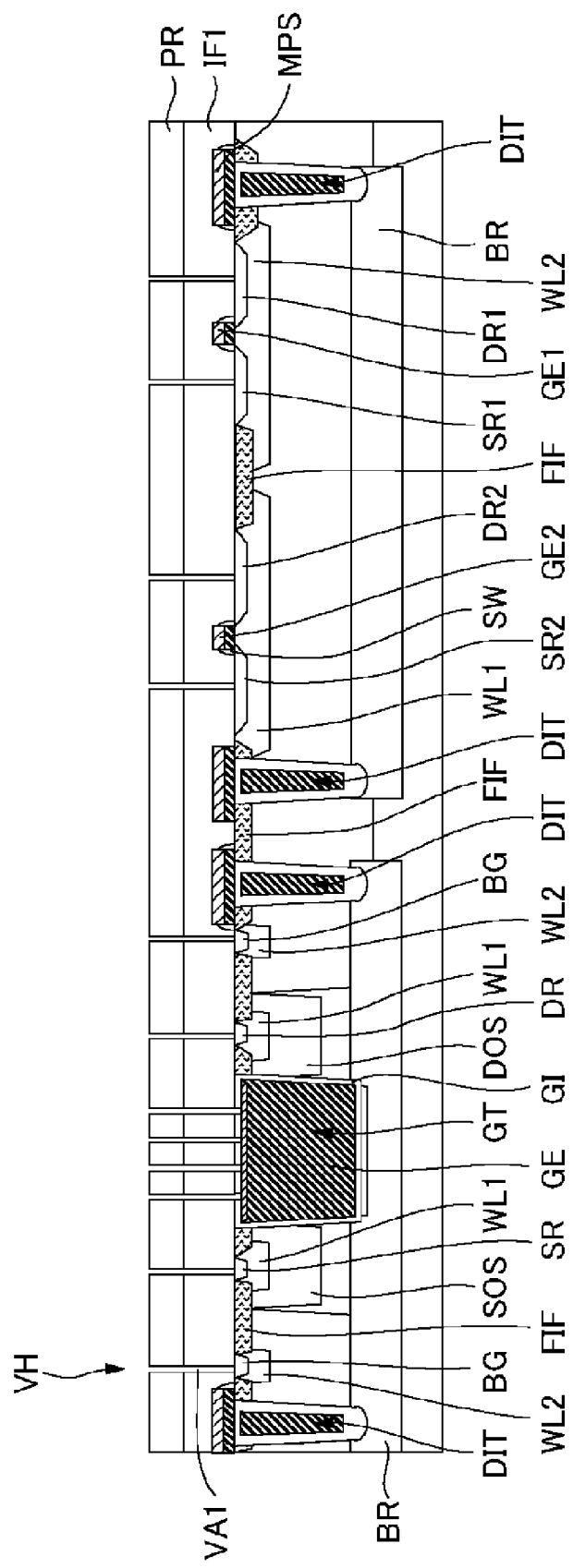
FIG. 35 is a cross-sectional view for explaining the method of manufacturing the semiconductor device according to the third embodiment.

Next, as in FIG. 35, over the semiconductor layer SL, the interlayer insulating film IF1 is formed. Next, over the interlayer insulating film IF1, a photoresist layer PR is formed. Next, by exposure and development, the photoresist layer PR is removed selectively. Next, using the photoresist layer PR as a mask, a via hole VH is formed in the interlayer insulating film IF1. Next, the photoresist layer PR is subjected to ashing.

Subsequently, as in FIG. 36, over the interlayer insulating film IF1 and in the via hole VH, the metal film CM is formed. Next, over the metal film CM, the photoresist layer PR is formed. Next, the photoresist layer PR is removed selectively.

Next, the photoresist layer PR is removed to form the interconnection IC1 and the via VA.

Figure 36:
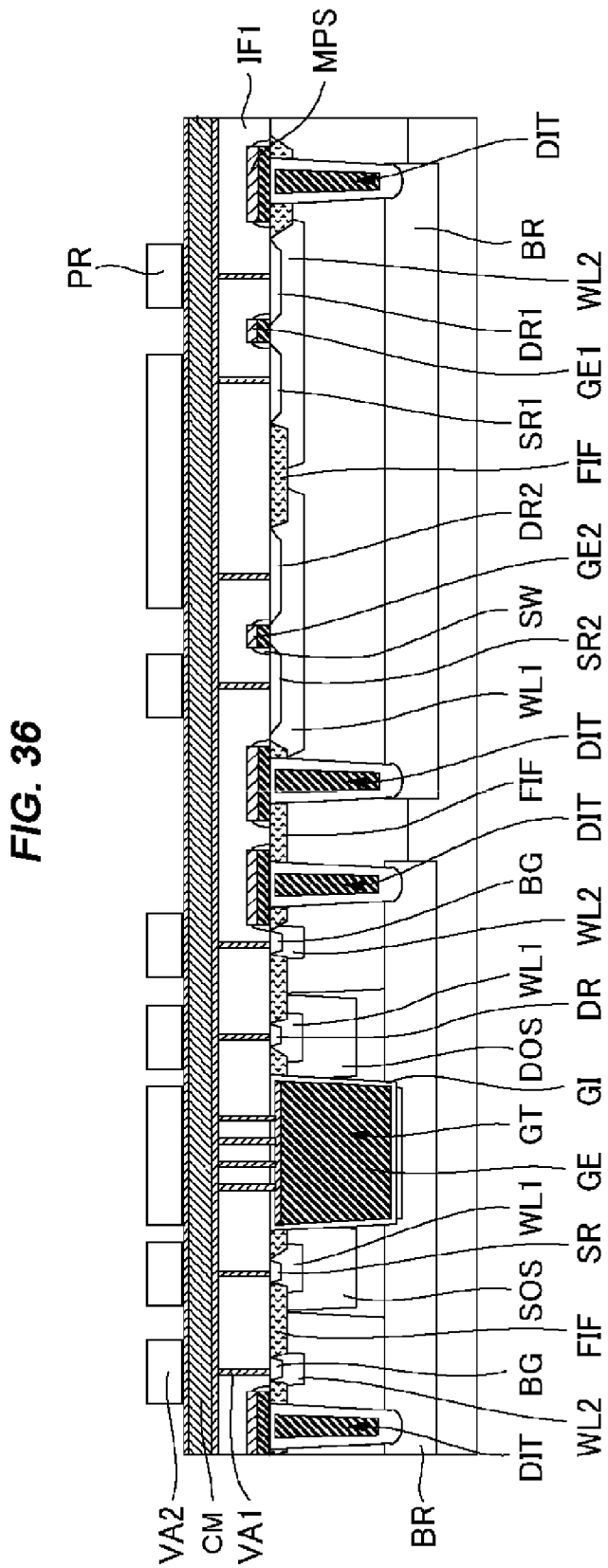
FIG. 36 is a cross-sectional view for explaining the method of manufacturing the semiconductor device according to the third embodiment.
Figure 37:
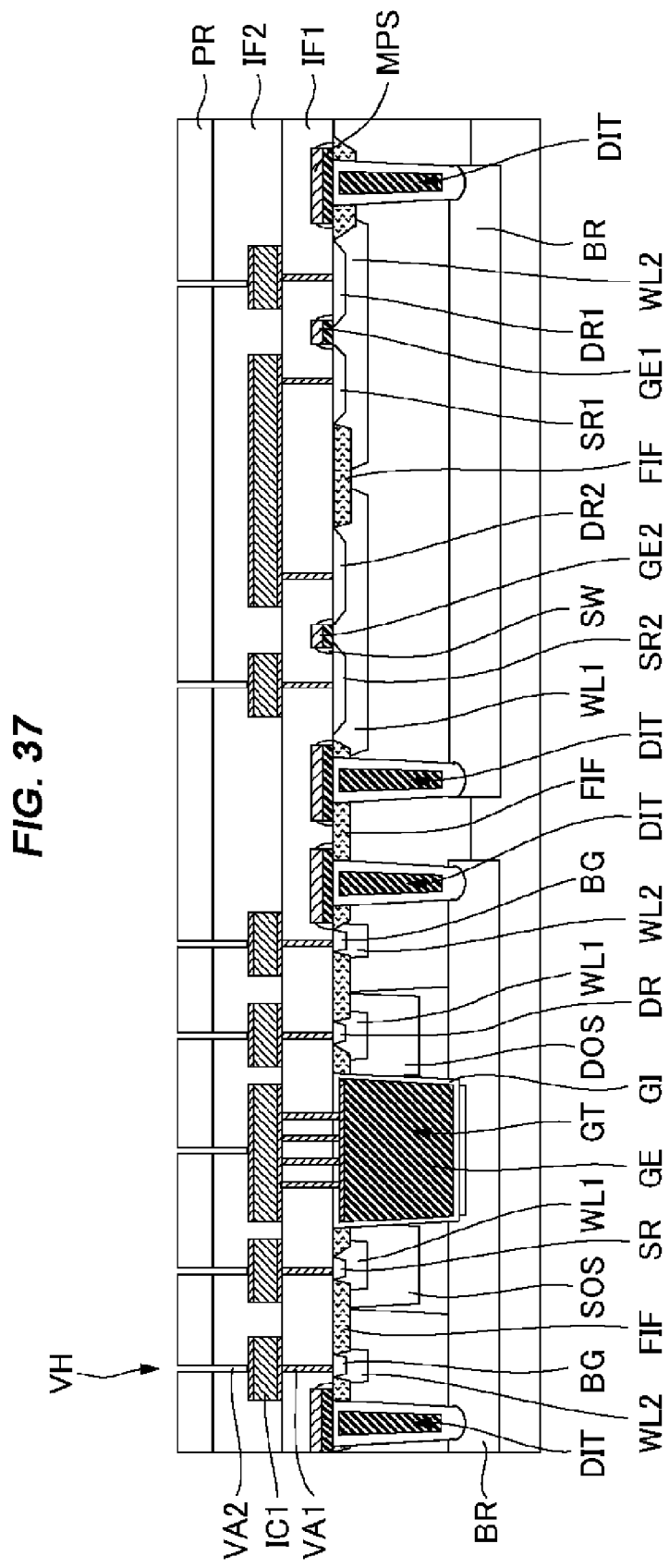
FIG. 37 is a cross-sectional view for explaining the method of manufacturing the semiconductor device according to the third embodiment.
Figure 38:
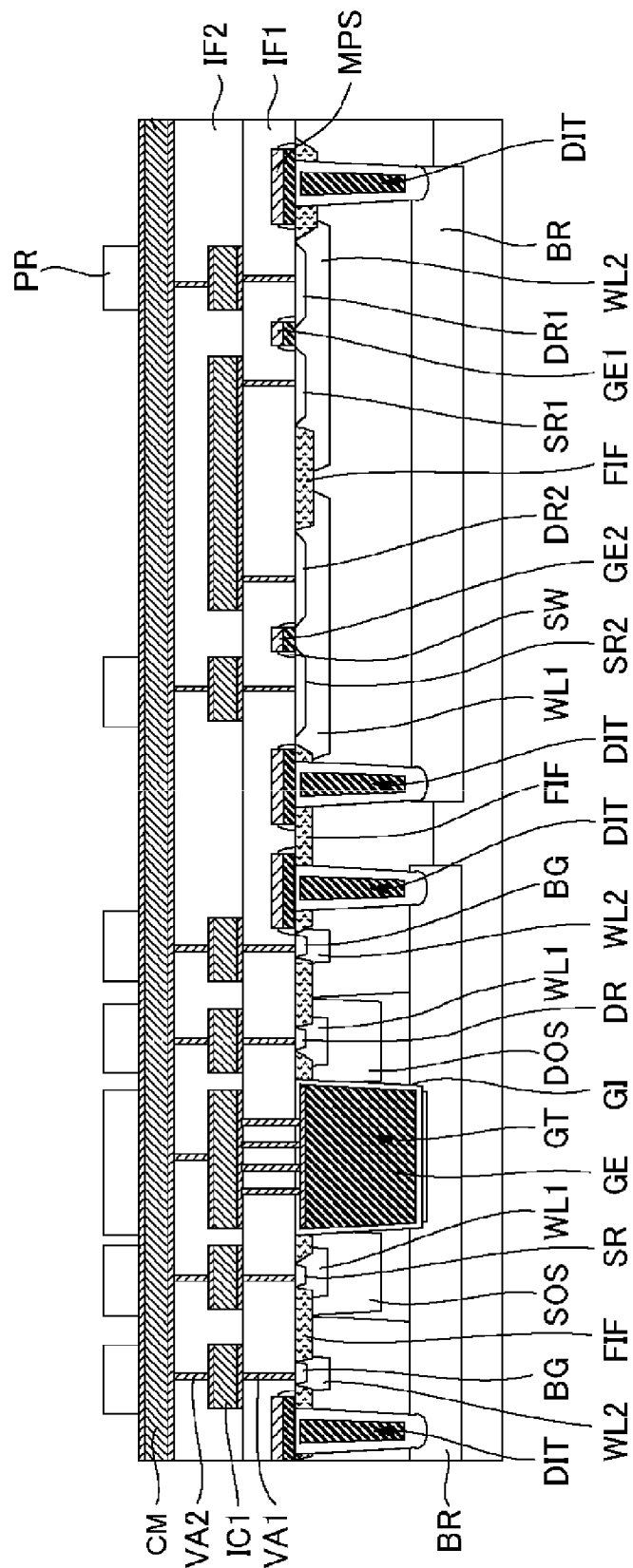
FIG. 38 is a cross-sectional view for explaining the method of manufacturing the semiconductor device according to the third embodiment.
Figure 39:
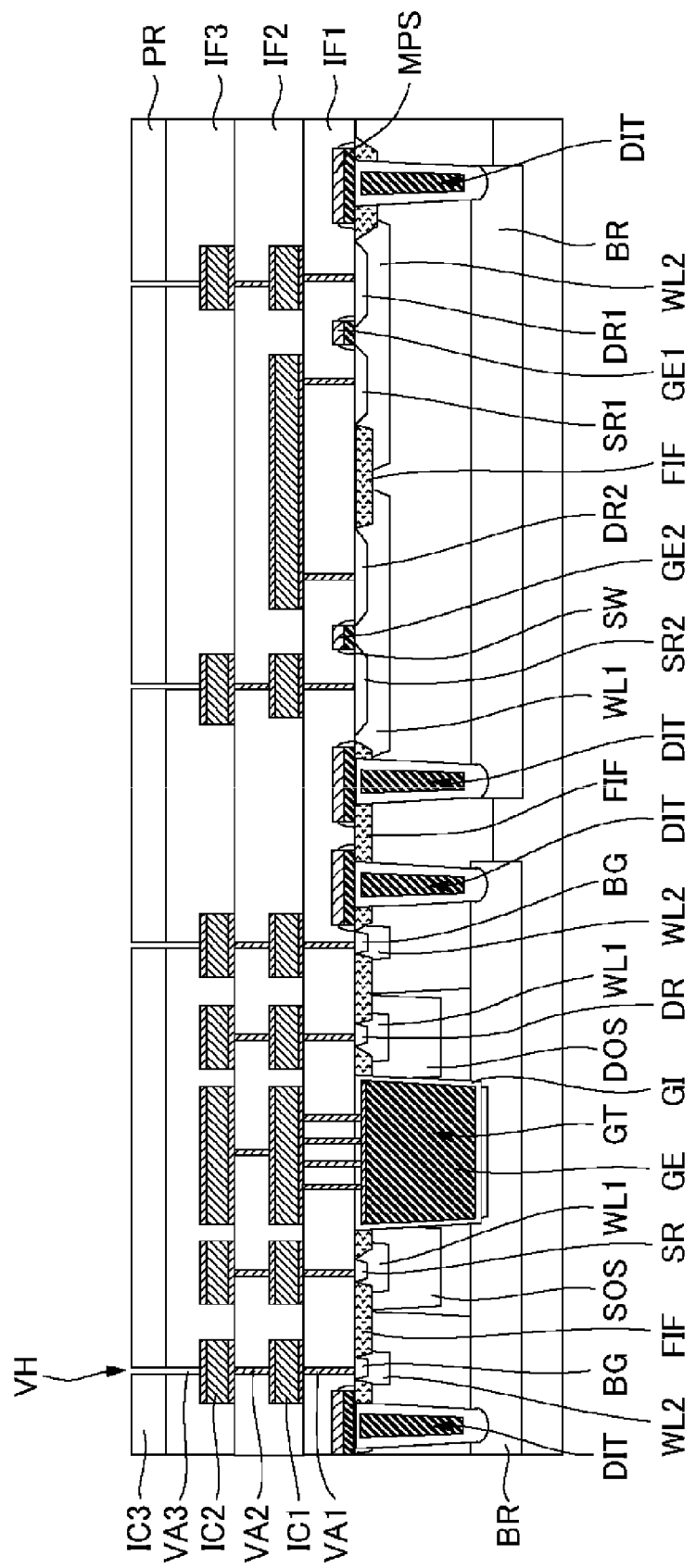
FIG. 39 is a cross-sectional view for explaining the method of manufacturing the semiconductor device according to the third embodiment.
Figure 40:
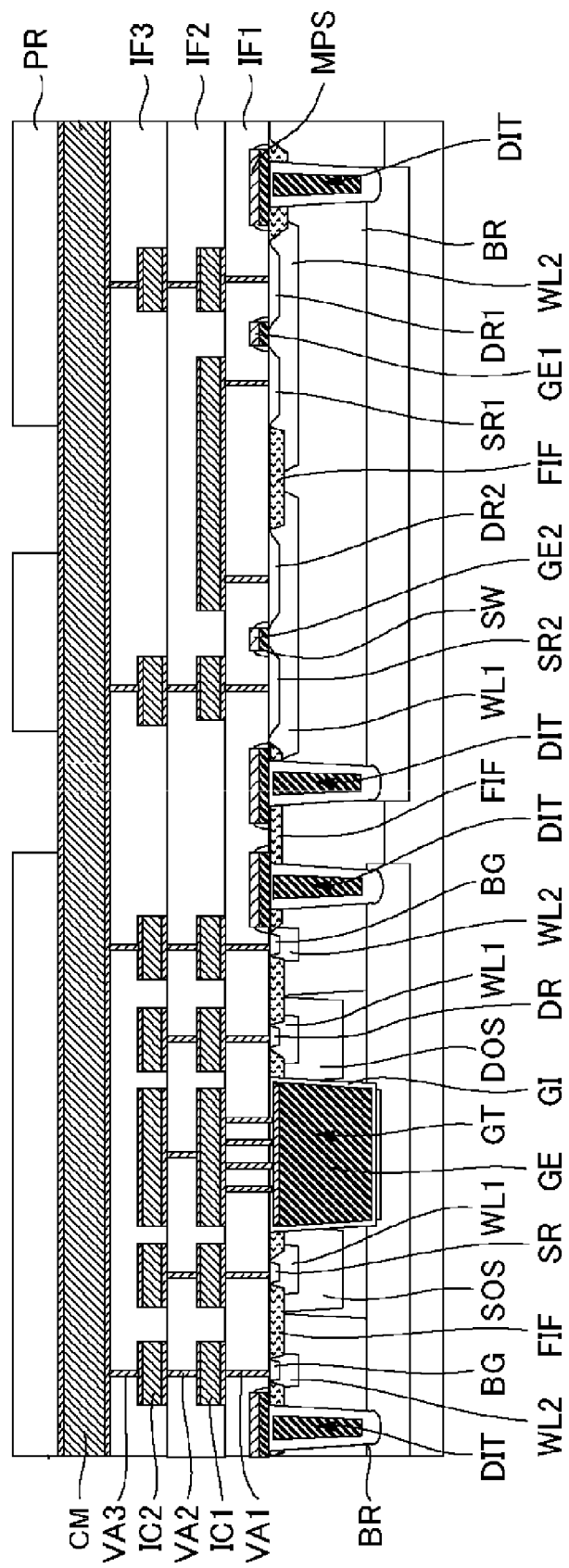
FIG. 40 is a cross-sectional view for explaining the method of manufacturing the semiconductor device according to the third embodiment.

Subsequently, in FIGS. 37 to 40, the same steps as in FIGS. 35 and 36 are repeated. Consequently, a multilayer interconnection layer is formed.

Figure 41:
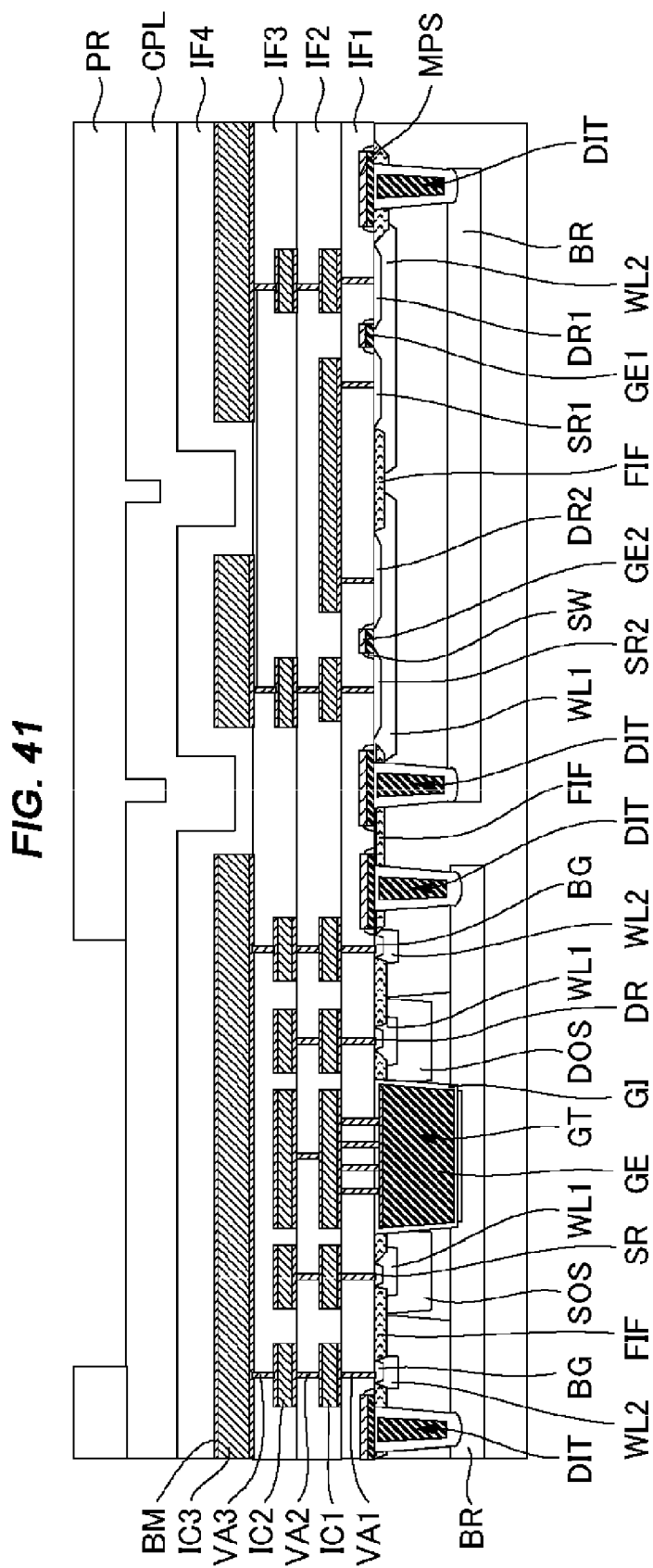
FIG. 41 is a cross-sectional view for explaining the method of manufacturing the semiconductor device according to the third embodiment.

Next, as in FIG. 41, over the interlayer insulating film IF3 and the interconnection IC3, the interlayer insulating film IF4 and the protective layer CPL are formed. Next, over the protective layer CPL, the photoresist layer PR is formed. Next, the photoresist layer PR is removed selectively.

Figure 42:
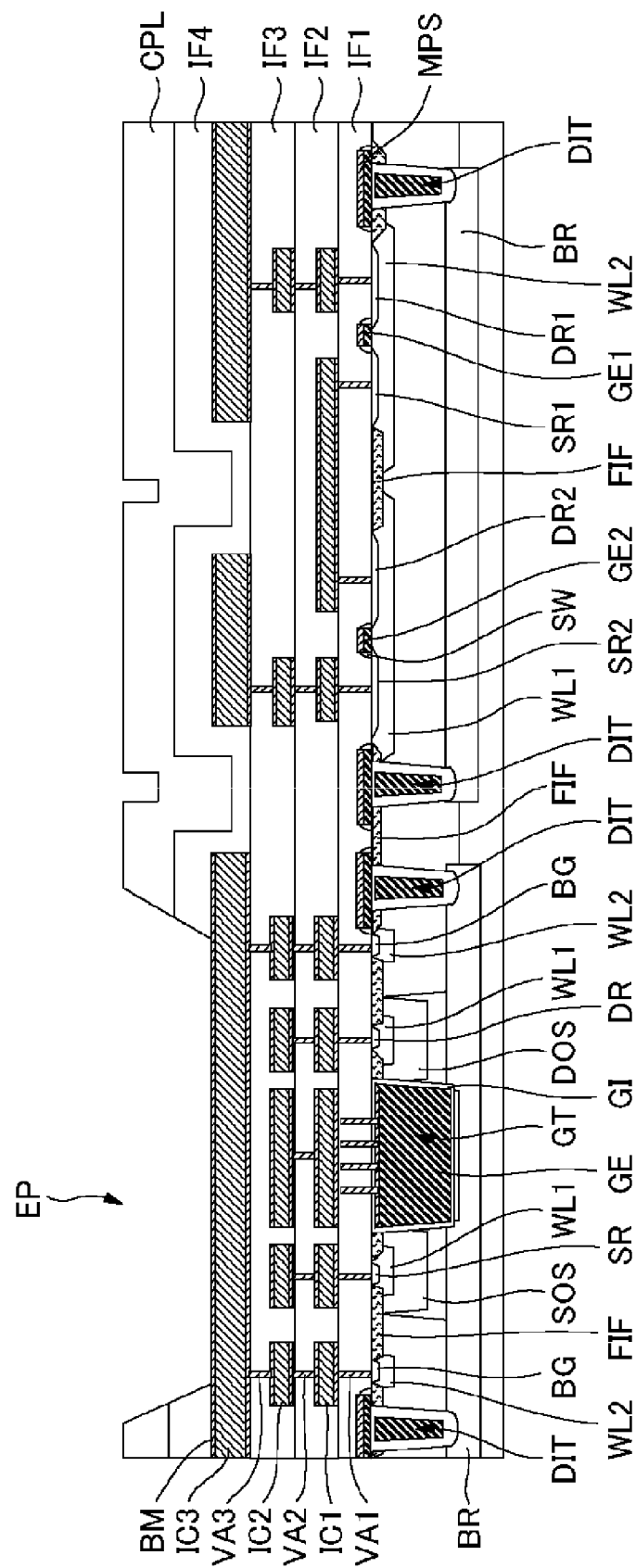
FIG. 42 is a cross-sectional view for explaining the method of manufacturing the semiconductor device according to the third embodiment.

Subsequently, as in FIG. 42, using the photoresist layer PR as a mask, the interlayer insulating film IF4 and the protective layer CPL are removed to expose a part of the interconnection IC3. Consequently, on a part of the interconnection IC3, the electrode pad EP is formed.

As a result of the above, the semiconductor device SD according to the third embodiment is obtained.

Further, for the semiconductor device SD, a TOP may be formed, for example, by a following manner. Over the electrode pad EP, an under bump metal film (not shown) is formed. Next, over the under bump metal film, a bump electrode (not shown) is formed. Next, the semiconductor substrate SUB is diced to be divided into semiconductor chips. Semiconductor chips are mounted over a flexible interconnection substrate (not shown), for example, in a tape-like shape. On this occasion, the bump electrode of the semiconductor chip is connected to an interconnection of the flexible substrate. The semiconductor chip is sealed with a sealing resin.

According to the third embodiment, the same effect as that in the first embodiment can be obtained. Further, according to the third embodiment, the first transistor having the trench part GT and the ordinary second transistor can be provided together within the same substrate. Consequently, the circuit area can be reduced.

Further, according to the manufacturing method according to the third embodiment, by introducing the same impurity, at the time when forming the first source region SR and the first drain region DR, the second source region SR1 and the second drain region DR2 are also formed. Consequently, the manufacturing step can be simplified.

Fourth Embodiment

FIGS. 43A and 43B and FIGS. 44A and 44B are plan views showing the configuration of the contact according to a fourth embodiment. The fourth embodiment is the same as the first embodiment, except that the arrangement or the shape of the contacts GC is different. Hereinafter, details will be explained.

FIGS. 43A to 44B show results of modifying the arrangement or the shape of the contacts GC in the first embodiment.

Figure 43A:
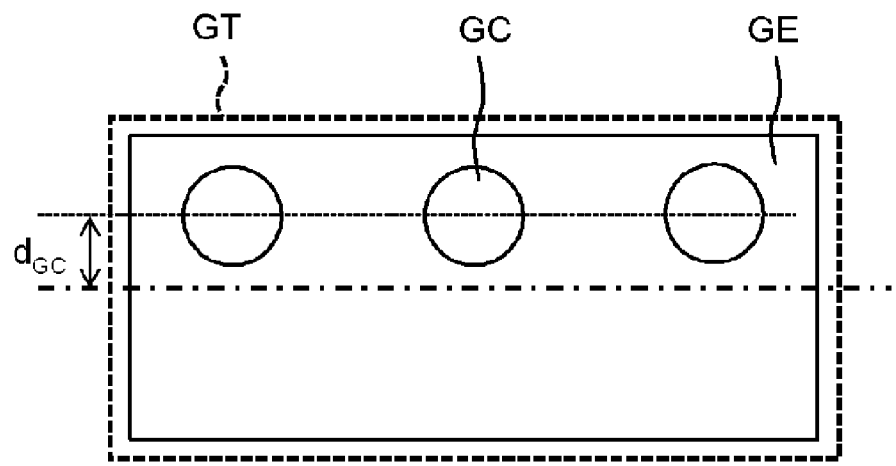
FIGS. 43A and 43B are plan views showing the configuration of the contact according to a fourth embodiment.

As in FIG. 43A, the contact GC may be disposed, shifted in the first direction perpendicular to the source-drain direction relative to the centerline in the trench part GT extending in the source-drain direction in plan view. In this case, the contact GC is disposed, shifted only in the first direction. For example, it is effective in such a case that the misalignment of the contact GC occurs in the second direction opposite to the first direction with a high probability.

Figure 43B:
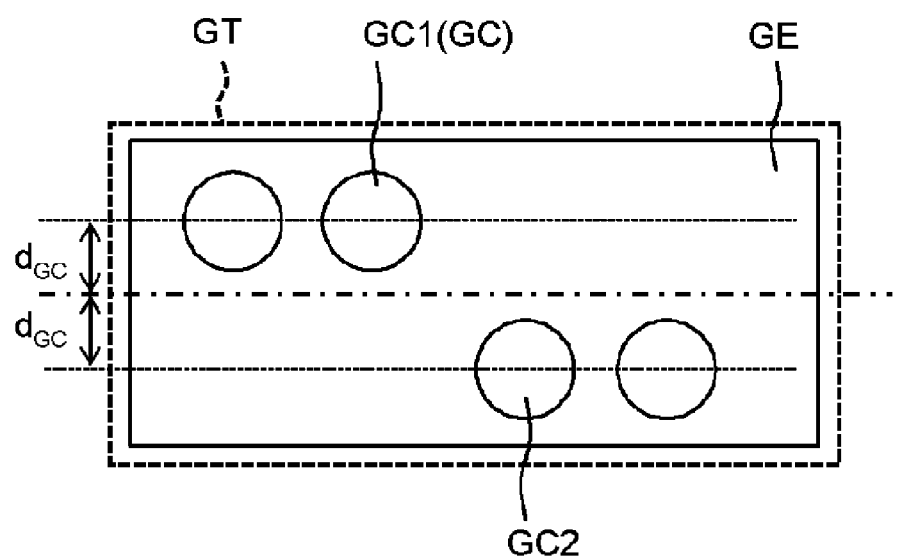

As in FIG. 43B, the contact GC may include a first contact GC1 disposed adjacently, shifted in the first direction, and a second contact GC2 disposed adjacently, shifted in the second direction. The first contact GC1 and the second contact GC2 are disposed, shifted by the same distance $d_{GC}$ relative to the centerline in the trench part GT. A plurality of first contacts GC1 or second contacts GC2 may be adjacent respectively.

Figure 44A:
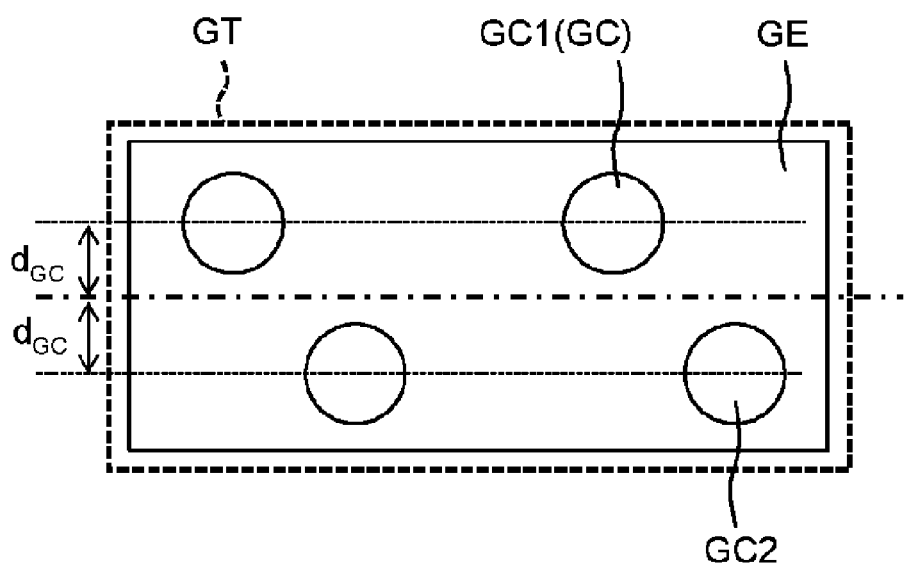
FIGS. 44A and 44B are plan views showing the configuration of the contact according to the fourth embodiment.

The distance at which the first contact GC1 and the second contact GC2 are disposed may not be even, as in FIG. 44A. The distance between the first contact GC1 and one second contact GC2 adjacent to the first contact GC1 is longer than the distance between the other second contact GC2 and the first contact GC1.

Figure 44B:
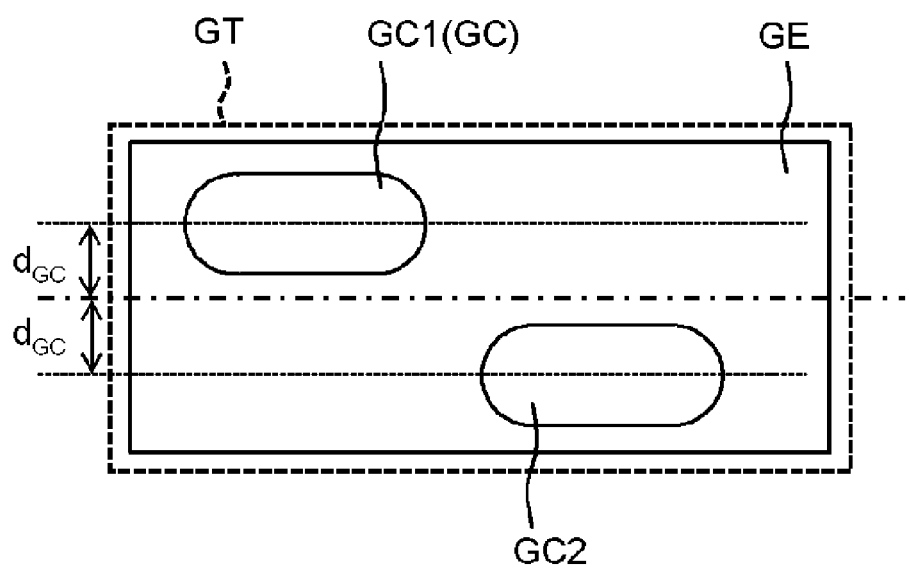

As in FIG. 44B, the shape of the contact GC is not limited to a circle, but may be ellipsoidal or in a line-like shape. In addition, these contacts GC may be disposed, shifted in the first direction and the second direction. Further, shapes of contacts GC may be different in the semiconductor substrate SUB.

According to the fourth embodiment, the same effect as that in the first embodiment can be obtained. According to the fourth embodiment, corresponding to the direction of the misalignment of the contact GC etc., the arrangement of the contacts GC can be changed. Incidentally, corresponding to positions of respective gate electrodes GE, the contacts GC may be formed in different arrangements in the semiconductor substrate SUB.

Fifth Embodiment

Figure 45:
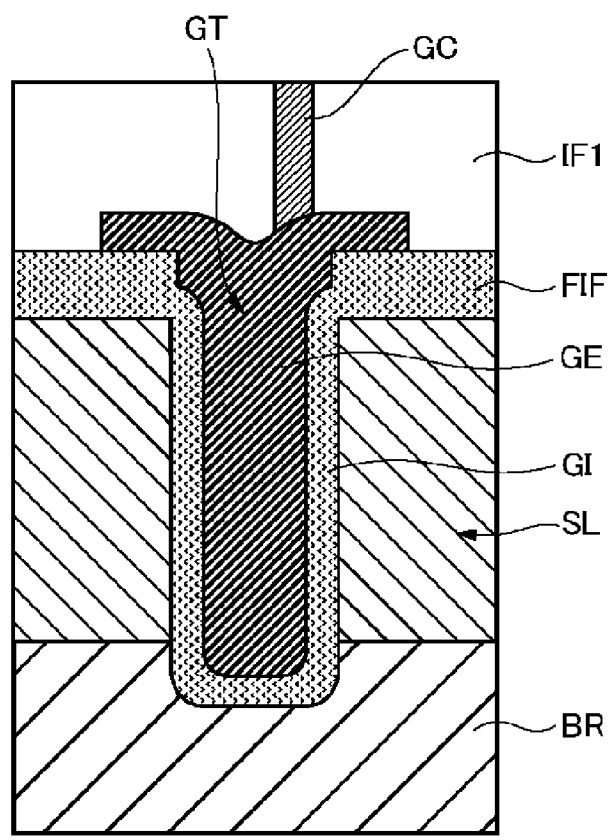
FIG. 45 is a cross-sectional view showing the configuration of the semiconductor device according to a fifth embodiment.

FIG. 45 is a plan view showing the configuration of the contact according to a fifth embodiment. The fifth embodiment is the same as the first embodiment, except that the gate electrode GE protrudes to the outside of the trench part GT. Hereinafter, details will be explained.

As in FIG. 45, the gate electrode GE may protrude to the outside of the trench part GT in plan view. For example, such a structure that at least a part of the gate electrode GE protrudes to the outside of the trench part GT is also acceptable. Even in this case, at least the effect of reducing the contact resistance between the gate electrode GE and the contact GC can be obtained.

In above-mentioned embodiments, the case, where "the first conductivity-type" is the P-type and "the second conductivity-type" is the N-type, is explained. However, respective embodiments are not limited to the case, but may have an inverse conductivity-type arrangement. That is, "the first conductivity-type" may be the N-type and "the second conductivity-type" may be the P-type.

In above-mentioned embodiments, the case where the gate electrode GE is formed of polysilicon is explained. However, the gate electrode GE may be formed of metal or metal silicide. In addition, the case where the gate insulating film GI is formed of thermally oxidized silicon is explained, but it may be another insulating film. Moreover, in the above-mentioned embodiments, the buried region BR may be absent.

Hereinbefore, the invention achieved by the inventor has been explained specifically based on embodiments. But, needless to say, the invention is not limited to the embodiments and may be changed variously within a range that does not deviate from the purport thereof.

Incidentally, above-mentioned embodiments also disclose inventions shown below.

(Remark 1)

A semiconductor device including:

a semiconductor layer;

a source region and a drain region of a first conductivity-type provided, separated from each other in the semiconductor layer;

a first conductivity-type source offset region, which is formed in contact with the source region in the semiconductor layer and in a concentration lower than those in the source region and the drain region;

a first conductivity-type drain offset region, which is disposed in contact with the drain region in the semiconductor layer, separated from the source offset region and is formed in a concentration lower than those in the source region and the drain region;

a trench part provided between the source offset region and the drain offset region at least in plan view in the semiconductor layer, and provided in a source-drain direction from the source offset region toward the drain offset region in plan view;

a gate insulating film that covers a side surface and a bottom surface of the trench part; and a gate electrode that is provided at least in the trench part and is in contact with the gate insulating film, and further including a contact which is in contact with the gate electrode and is disposed, shifted in a first direction perpendicular to the source-drain direction relative to the centerline in the trench part extending in the source-drain direction in plan view, and which is provided in the trench part in plan view.

(Remark 2)

The semiconductor device according to Remark 1, in which:

a concave part is formed on the upper end side of the trench part in cross-sectional view in the gate electrode; and the center of the contact is formed, shifted from the concave part of the gate electrode.

(Remark 3)

The semiconductor device according to Remark 1, including:

a first transistor including a first source region, a first drain region, the source offset region, the drain offset, region, and a first gate insulating film and a first gate electrode provided in the trench part; and a second transistor including a second source region and a second drain region of a first conductivity-type or a second conductivity-type provided, separately from each other in the semiconductor layer, a second gate insulating film provided over a position sandwiched between the second source region and the second drain region, and a second gate electrode provided over the second gate insulating film, in which the second transistor is provided in the same semiconductor layer together with the first transistor, and is provided in a position different from that of the first transistor in plan view.

(Remark 4)

The semiconductor device according to Remark 3, further including:

a trench part for element isolation provided between the first transistor and the second transistor, and is formed in the same depth as the depth of the trench part;

a trench insulating film that covers a side surface and a bottom surface of the trench part for element isolation and is formed of the material same as that of the gate insulating film; and a trench embedding film that is provided only in the trench, part for element isolation in plan view, is in contact with the trench insulating film, and is formed of the conductive material same as that of the gate electrode.

(Remark 5)

A method of manufacturing a semiconductor device, including the steps of:

forming a source offset region and a drain offset region by introducing a first conductivity-type impurity into positions separated from each other in a semiconductor layer;

forming a trench part in a position between the source offset region and the drain offset region at least in plan view in the semiconductor layer in a direction from the source offset region toward the drain offset region in plan view;

forming a gate insulating film on a side surface and a bottom surface of the trench part;

forming a gate electrode in at least the trench part by forming a conductive material over the semiconductor layer so as to be in contact with the gate insulating film in the trench part, and by removing a surface layer of the conductive material;

forming a source region and a drain region, respectively, by introducing a first conductivity-type impurity into a position in contact with the source offset region and a position that is in contact with the drain offset region and is separated from the source offset region in the semiconductor layer in a concentration higher than those in the source offset region and the drain offset region;

forming an interlayer insulating film over the semiconductor layer and the gate electrode; and forming a contact that is in contact with the gate electrode, in a position shifted in a first direction perpendicular to the source-drain direction relative to a centerline in the trench part extending in the source-drain direction in plan view in the interlayer insulating film, and so as to be disposed in the trench part in plan view.

(Remark 6)

The method of manufacturing a semiconductor device according to Remark 5, in which, in the step of forming a contact, the contact is formed in plural number for the identical gate electrode, to form a first contact disposed, shifted in the first direction and a second contact disposed, shifted in a second direction opposite to the first direction.

(Remark 7)

The method of manufacturing a semiconductor device according to Remark 5, in which, in the step of forming a contact, the contact is formed while shifting a center thereof from the concave part of the gate electrode.

(Remark 8)

The method of manufacturing a semiconductor device according to Remark 5, further including the step of, before the step of forming a trench part, forming a field insulating film in a position between the source region and the drain region in plan view in the semiconductor layer, in which:

in the step of forming a field insulating film, an opening is formed in regions in which the source region and the drain region are to be formed in the field insulating film; and in the step of forming a source/drain region, the source region and the drain region are formed in the opening, using the gate insulating film, the gate electrode and the field insulating film as a mask.

(Remark 9)

The method of manufacturing a semiconductor device according to Remark 5, in which, in the step of forming a gate insulating film, the gate insulating film is formed by thermally oxidizing a side surface and a bottom surface of the trench part.

(Remark 10)

The method of manufacturing a semiconductor device according to Remark 5, in which, in the step of forming a gate electrode, the gate electrode is formed by thermally oxidizing only a surface layer of the conductive material and removing the surface layer having been oxidized.

(Remark 11)

The method of manufacturing a semiconductor device according to Remark 5, further including the steps of: after the step of forming a gate electrode, forming a second gate insulating film in a region different from the trench part in plan view in over the semiconductor layer; and forming a second gate electrode over the second gate insulating film, in which, in the step of forming a source/drain region, a second source region and a second drain region are formed by forming a first source region and a first drain region in contact with the source offset region and the drain offset region, and, at the same time, introducing the same kind of impurity using the second gate insulating film and the second gate electrode as a mask.

(Remark 12)

The method of manufacturing a semiconductor device according to Remark 11, in which:

in the step of forming a trench part, a trench part for element isolation having a depth same as that of the trench part between the first gate electrode and the second gate electrode;

in the step of forming a gate insulating film, a trench insulating film is formed of the material same as that of the gate insulating film on a side surface and a bottom surface of the trench part for element isolation; and in the step of forming a gate electrode, a trench embedding film is formed of the conductive material same as that of the gate electrode, also in the trench part for element isolation in plan view so as to be in contact with the trench insulating film.

What is claimed is:

1. A semiconductor device, comprising:
    a semiconductor layer;
    a source region and a drain region of a first conductivity-type provided separated from each other in the semiconductor layer;
    a first conductivity-type source offset region formed in contact with the source region in the semiconductor layer and in a concentration lower than those in the source region and the drain region;
    a first conductivity-type drain offset region, which is disposed in contact with the drain region in the semiconductor layer and being separated from the source offset region, and is formed in a concentration lower than those in the source region and the drain region;

a trench part provided between the source offset region and the drain offset region, in plan view in the semiconductor layer, and extending in a source-drain direction from the source offset region toward the drain offset region in plan view in the semiconductor layer;

a gate insulating film that covers a side surface and a bottom surface of the trench part;

a gate electrode that is provided at least in the trench part and is in contact with the gate insulating film;

a contact which is connected to a portion of the upper surface of the gate electrode, the portion being offset from a centerline of the gate electrode in a first direction perpendicular to the source-drain direction;

a back gate region of a second conductivity-type opposite to a first conductivity-type, provided so as to surround the trench part, the source offset region, the drain offset region, the source region and the drain region in plan view; and a back gate contact in contact with the back gate region, wherein, when defining the first direction as positive, and denoting a shift amount of a centerline of a region in which the trench part is disposed from a centerline of a region surrounded by the back gate region in the first direction in plan view by a trench part shift amount $\Delta d_T$, denoting a shift amount of a center of the back gate contact from a centerline in the back gate region extending in the source-drain direction in the first direction in plan view by a back gate shift amount $\Delta d_{VA}$, and denoting a shift amount of a center of the contact from the centerline in the trench part in the first direction in plan view by a first offset amount $D_{OF1}$, the first offset amount $D_{OF1}$ satisfies Formula (1) below $$D_{OF1} > \Delta d_{VA} - \Delta d_T \qquad (1).$$

2. The semiconductor device according to claim 1, wherein the gate electrode is provided only in the trench part.

3. The semiconductor device according to claim 1, wherein, in the gate electrode, an upper end width in the first direction is wider than a lower end width.

4. The semiconductor device according to claim 3, wherein the upper end width of the gate electrode is wider than the lower end width in a range of not less than 1.3 times to not more than 2.5 times.

5. The semiconductor device according to claim 1, wherein the gate electrode widens in the first direction and in an opposite second direction above an upper surface of the semiconductor layer.

6. The semiconductor device according to claim 1, wherein:
the contact is provided in plural number for the same gate electrode; and
the semiconductor device comprises a first contact offset from the centerline of the gate electrode in the first direction, and a second contact offset from the centerline of the gate electrode in a second direction opposite to the first direction.

7. The semiconductor device according to claim 6, wherein the first contact and the second contact are arranged in a zigzag manner.

8. The semiconductor device according to claim 1, further comprising:
a field insulating film provided between the source region and the drain region in plan view in the semiconductor layer,
wherein the trench part is provided inside the field insulating film in plan view.

9. The semiconductor device according to claim 8, wherein the field insulating film is formed by a LOCOS (Local Oxidation Of Silicon) method.

10. The semiconductor device according to claim 1, wherein a concave part is formed in the gate electrode on an upper end side of the trench part in cross-sectional view.

11. The semiconductor device according to claim 1, wherein end parts in the first direction and a second direction opposite to the first direction in the gate electrode are separated from an upper surface of the semiconductor layer by a thickness of the gate insulating film or more.

12. The semiconductor device according to claim 1, further comprising:
a first transistor including a first source region, a first drain region, the source offset region, the drain offset region, and a first gate insulating film and a first gate electrode provided in the trench part, and a second transistor including a second source region and a second drain region of the first conductivity-type or the second conductivity-type provided in the semiconductor layer, being separated from each other, a second gate insulating film provided over a position sandwiched between the second source region and the second drain region and a second gate electrode provided over the second gate insulating film,
wherein the second transistor is provided in the same semiconductor layer as the first transistor, and provided in a position different from that for the first transistor in plan view.

13. The semiconductor device according to claim 12, wherein, in the second source region and the second drain region of the second transistor, the same impurity as that in the first source region and the second drain region of the first transistor is introduced.

14. A semiconductor device, comprising:
a semiconductor layer;
a source region and a drain region of a first conductivity-type provided separated from each other in the semiconductor layer;
a first conductivity-type source offset region formed in contact with the source region in the semiconductor layer and in a concentration lower than those in the source region and the drain region;
a first conductivity-type drain offset region, which is disposed in contact with the drain region in the semiconductor layer and being separated from the source offset region, and is formed in a concentration lower than those in the source region and the drain region;
a trench part provided between the source offset region and the drain offset region, in plan view in the semiconductor layer, and extending in a source-drain direction from the source offset region toward the drain offset region in plan view in the semiconductor layer;
a gate insulating film that covers a side surface and a bottom surface of the trench part;
a gate electrode that is provided at least in the trench part and is in contact with the gate insulating film;
a contact which is connected to a portion of the upper surface of the gate electrode, the portion being offset from a centerline of the gate electrode in a first direction perpendicular to the source-drain direction;
a field insulating film that is provided in the semiconductor layer and has an opening part;

a back gate region, of a second conductivity-type opposite to a first conductivity-type, that is provided in the opening part of the field insulating film; and a back gate contact in contact with the back gate region, wherein a centerline in the back gate region is a centerline of the opening part of the field insulating film, and wherein a back gate shift amount of a center of the back gate contact is obtained based on the centerline of the opening part of the field insulating film.

15. A semiconductor device, comprising:

a semiconductor layer;

a source region and a drain region of a first conductivity-type provided separated from each other in the semiconductor layer;

a first conductivity-type source offset region formed in contact with the source region in the semiconductor layer and in a concentration lower than those in the source region and the drain region;

a first conductivity-type drain offset region, which is disposed in contact with the drain region in the semiconductor layer and being separated from the source offset region, and is formed in a concentration lower than those in the source region and the drain region;

a trench part provided between the source offset region and the drain offset region, in plan view in the semiconductor layer, and extending in a source-drain direction from the source offset region toward the drain offset region in plan view in the semiconductor layer;

a gate insulating film that covers a side surface and a bottom surface of the trench part;

a gate electrode that is provided at least in the trench part and is in contact with the gate insulating film;

a contact which is connected to a portion of the upper surface of the gate electrode, the portion being offset from a centerline of the gate electrode in a first direction perpendicular to the source-drain direction;

a back gate region, of a second conductivity-type opposite to a first conductivity-type, provided so as to surround the trench part, the source offset region, the drain offset region, the source region and the drain region in plan view; and a back gate contact in contact with the back gate region, wherein the contact is provided in plural number for the same gate electrode, a first contact offset is defined from the centerline of the gate electrode in the first direction, and a second contact offset is defined from the centerline of the gate electrode in a second direction opposite to the first direction, wherein, when defining the first direction as positive, denoting a shift amount of a centerline in a region in which the trench part is offset from a centerline of a region surrounded by the back gate region in the first direction in plan view by a trench part shift amount $\Delta d_T$, denoting a shift amount of a center of the back gate contact shifted from a centerline in the back gate region extending in the source-drain direction in the first direction in plan view by a back gate shift amount $\Delta d_{VA}$, denoting a shift amount of a center of the contact shifted from the centerline in the trench part in the first direction in plan view by a first offset amount $D_{OF1}$ and denoting an interval between a center of the first contact and a center of the second contact by $l_{CS}$, the first offset amount $D_{OF1}$ of the first contact satisfies Formula (2) below $$D_{OF1} > l_{CS}/2 + \Delta d_{VA} - \Delta d_T \qquad (2).$$

16. A method of manufacturing a semiconductor device, comprising:

forming a source offset region and a drain offset region by introducing a first conductivity-type impurity into positions separated from each other in a semiconductor layer;

forming a field insulating film in a position between a source region and a drain region in plan view in the semiconductor layer;

forming a trench part, inside the field insulating film, in a position between the source offset region and the drain offset region at least in plan view in the semiconductor layer in a direction from the source offset region toward the drain offset region in plan view;

removing a part of the field insulating film to widen an opening width of the field insulating film in the trench part wider than an upper end width of the semiconductor layer in the trench part;

forming a gate insulating film on a side surface and a bottom surface of the trench part;

forming a gate electrode in at least the trench part by forming a conductive material over the semiconductor layer so as to be in contact with the gate insulating film in the trench part, and by removing a surface layer of the conductive material;

forming the source region and the drain region by introducing a first conductivity-type impurity into a position in contact with the source offset region and a position that is in contact with the drain offset region and is separated from the source offset region in the semiconductor layer in a concentration higher than those in the source offset region and the drain offset region, respectively;

forming an interlayer insulating film over the semiconductor layer and the gate electrode; and forming a contact that is in contact with the gate electrode, in a position shifted in a first direction perpendicular to the source-drain direction relative to a centerline in the trench part extending in the source-drain direction in plan view in the interlayer insulating film, and so as to be disposed in the trench part in plan view.

17. The method of manufacturing a semiconductor device according to claim 16, wherein the gate electrode is formed only in the trench part.

18. The method of manufacturing a semiconductor device according to claim 16, wherein the surface layer of the conductive material is removed by dry etching.

19. The method of manufacturing a semiconductor device according to claim 16, further comprising:

after forming the gate electrode, forming a second gate insulating film in a region different from the trench part in plan view over the semiconductor layer; and forming a second gate electrode over the second gate insulating film, wherein, a first source region and a first drain region in contact with the source offset region and the drain offset region are formed, and, at the same time, a second source region and a second drain region are formed by introducing the same impurity with the second gate insulating film and the second gate electrode as a mask.

* * * * *